US 11,004,884 B2

(12) United States Patent
Machida et al.

(10) Patent No.: US 11,004,884 B2
(45) Date of Patent: May 11, 2021

(54) SOLID-STATE IMAGING APPARATUS

(71) Applicant: SONY SEMICONDUCTOR SOLUTIONS CORPORATION, Kanagawa (JP)

(72) Inventors: Takashi Machida, Tokyo (JP); Kentaro Akiyama, Kanagawa (JP); Tomohiro Yamazaki, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/499,911

(22) PCT Filed: Mar. 9, 2018

(86) PCT No.: PCT/JP2018/009261
§ 371 (c)(1),
(2) Date: Oct. 1, 2019

(87) PCT Pub. No.: WO2018/190049
PCT Pub. Date: Oct. 18, 2018

(65) Prior Publication Data
US 2020/0119073 A1    Apr. 16, 2020

(30) Foreign Application Priority Data
Apr. 11, 2017 (JP) .............................. JP2017-078237

(51) Int. Cl.
*H01L 27/146* (2006.01)
*G02B 5/30* (2006.01)

(52) U.S. Cl.
CPC ...... *H01L 27/14625* (2013.01); *G02B 5/3058* (2013.01); *H01L 27/14612* (2013.01);
(Continued)

(58) Field of Classification Search
CPC ......... H01L 27/14625; H01L 27/14612; H01L 27/14621; H01L 27/14623;
(Continued)

(56) References Cited

U.S. PATENT DOCUMENTS 6,157,017 A * 12/2000 Kim .................. H01L 27/14621
250/208.1
10,436,963 B2 * 10/2019 Choi ........................ H01Q 7/00
(Continued)

FOREIGN PATENT DOCUMENTS

JP    2010-130398    6/2010
JP    2011-210826    10/2011
(Continued)

OTHER PUBLICATIONS

International Search Report and Written Opinion prepared by the European Patent Office dated May 17, 2018, for International Application No. PCT/JP2018/009261.
(Continued)

Primary Examiner — Victor A Mandala
(74) Attorney, Agent, or Firm — Sheridan Ross P.C.

(57) ABSTRACT

An imaging device includes one or more insulating layers on a substrate; an effective region including: a polarization layer in the one or more insulating layers and including one or more polarizers that polarize light; and at least one first photoelectric conversion region in the substrate and that converts incident light polarized by the one or more polarizers into electric charge; and a peripheral region outside the effective region and including: one or more wiring layers that include a pad portion in a same layer of the one or more insulating layers as the polarization layer.

16 Claims, 54 Drawing Sheets

(52) U.S. Cl.
CPC .. *H01L 27/14621* (2013.01); *H01L 27/14623* (2013.01); *H01L 27/14627* (2013.01); *H01L 27/14636* (2013.01); *H01L 27/14643* (2013.01)

(58) Field of Classification Search
CPC ......... H01L 27/14627; H01L 27/14636; H01L 27/14643; H01L 27/14629; H01L 27/14632; G02B 5/3058
See application file for complete search history.

(56) References Cited

U.S. PATENT DOCUMENTS

| | | |
|---|---|---|
| 2006/0187327 A1 | 8/2006 | Mabuchi et al. |
| 2009/0190012 A1 | 7/2009 | Mabuchi et al. |
| 2010/0330729 A1* | 12/2010 | Sugawara ....... H01L 31/022408 438/70 |
| 2012/0287297 A1* | 11/2012 | Fukuda ............... H01L 27/1464 348/222.1 |
| 2013/0044245 A1 | 2/2013 | Mabuchi et al. |
| 2015/0155319 A1* | 6/2015 | Girard Desprolet ........................ H01L 27/14687 257/432 |
| 2016/0064436 A1* | 3/2016 | Uchida ............. H01L 27/14685 257/432 |
| 2016/0211388 A1* | 7/2016 | Natsuaki ........... H01L 27/14629 |
| 2018/0213170 A1* | 7/2018 | Segawa ................ H04N 13/239 |
| 2018/0277584 A1* | 9/2018 | Maruyama ........ H01L 27/14623 |
| 2018/0286908 A1* | 10/2018 | Yamazaki ......... H01L 27/14645 |
| 2018/0302597 A1* | 10/2018 | Honda .............. H01L 27/14645 |
| 2019/0006407 A1* | 1/2019 | Uesaka ............. H01L 27/14627 |

FOREIGN PATENT DOCUMENTS

| | | |
|---|---|---|
| JP | 2012-238632 | 12/2012 |
| JP | 2016-164956 | 9/2016 |
| WO | WO 2014/174894 | 10/2014 |
| WO | WO 2017/018258 | 2/2017 |

OTHER PUBLICATIONS

Official Action (with English translation) for Japanese Patent Application No. 2017-078237, dated Nov. 4, 2020, 10 pages.

* cited by examiner

FIG.32

FIG.35

SOLID-STATE IMAGING APPARATUS

CROSS REFERENCE TO RELATED APPLICATIONS

This application is a national stage application under 35 U.S.C. 371 and claims the benefit of PCT Application No. PCT/JP2018/009261 having an international filing date of 9 Mar. 2018, which designated the United States, which PCT application claimed the benefit of Japanese Priority Patent Application No. 2017-078237 filed on 11 Apr. 2017, the disclosures of each of which are incorporated herein by reference.

TECHNICAL FIELD

The present disclosure relates to a solid-state imaging apparatus, and more particularly, to a solid-state imaging apparatus of a surface irradiation type including wire grid polarizers.

BACKGROUND ART

There have been well-known solid-state imaging apparatuses as disclosed, for example, in PTL 1, which include a plurality of photoelectric conversion devices provided with the wire grid polarizers (WGPs). The photoelectric conversion devices (imaging devices) arrayed in a valid pixel region and configured to generate currents in response to entry of light beams form, for example, a CCD (Charge Coupled Device) image sensor and a CMOS (Complementary Metal Oxide Semiconductor) image sensor. The wire grid polarizers are arranged on a light incidence side of the photoelectric conversion devices, and each have a line-and-space structure. For the sake of convenience of description, a direction in which the line-and-space structure extends is referred to as a "first direction," and a direction in which line portions are alternately formed (direction orthogonal to the first direction) is referred to as a "second direction."

As illustrated in the conceptual view of FIG. 54, when a formation pitch $P_0$ of a wire grid is significantly smaller than a wavelength $\lambda_0$ of an incident electromagnetic wave, the electromagnetic wave, which oscillates in a plane parallel to the direction in which the wire grid extends (first direction), is selectively reflected and absorbed by the wire grid. Note that, the formation pitch $P_0$ of the wire grid is defined as a clearance between one of the line portions and another one of the line portions (clearance, that is, width of a space portion along the second direction). As illustrated in FIG. 54, although a vertically polarized component and a horizontally polarized component are contained in the electromagnetic wave (light) that reaches the wire grid polarizer, the electromagnetic wave that has transmitted through the wire grid polarizer becomes a linearly polarized light beam in which the vertically polarized component is predominant. With focus on a visible-light wavelength band, when the formation pitch $P_0$ of the wire grid is significantly smaller an effective wavelength $\lambda_{eff}$ of the electromagnetic wave that enters the wire grid polarizer, polarized components biased in the plane parallel to the first direction are reflected by or absorbed into a front surface of the wire grid. Meanwhile, when an electromagnetic wave having polarized components biased in a plane parallel to the second direction enters the wire grid, an electric field that propagates through a front surface of the wire grid exits from a rear surface of the wire grid with its wavelength and polarization orientation remaining the same as those at the time of entry. In this case, when an average refractive index calculated based on substances that are present in the space portions is represented by $n_{ave}$, the effective wavelength is represented by $\lambda_{eff}(\lambda_0/n_{ave})$. The average refractive index $n_{ave}$ refers to a value obtained by dividing a sum of products of refractive indices and volumes of the substances that are present in the space portions by volumes of the space portions. When a value of the wavelength $\lambda_0$ is kept constant, a value of the effective wavelength $\lambda_{eff}$ becomes larger as a value of the average refractive index $n_{ave}$ becomes smaller. Thus, a value of the formation pitch $P_0$ can be increased. Meanwhile, a transmittance and an extinction ratio of the wire grid polarizer become lower as the value of the average refractive index $n_{ave}$ becomes larger.

CITATION LIST

Patent Literature

PTL 1: Japanese Patent Application Laid-open No. 2016-164956

SUMMARY

Incidentally, at the time of forming the wire grid polarizers, the wire grid polarizers are charged, and a kind of discharge occurs. As a result, there may occur problems such as damage to the wire grid polarizers and the photoelectric conversion devices. However, in Japanese Patent Application Laid-open No. 2016-164956, it is difficult to find description of such problems at the time of forming the wire grid polarizers.

Technical Problem

Under such circumstances, there is a need to provide a solid-state imaging apparatus having a configuration and a structure that prevent (or alternatively, reduce) damage to wire grid polarizers and photoelectric conversion devices (imaging devices) at the time of forming the wire grid polarizers.

Solution to Problem

According to a first embodiment of the present disclosure, an imaging device comprises one or more insulating layers on a substrate; an effective region including: a polarization layer in the one or more insulating layers and including one or more polarizers that polarize light; and at least one first photoelectric conversion region in the substrate and that converts incident light polarized by the one or more polarizers into electric charge. The imaging device includes a peripheral region outside the effective region. The peripheral region includes one or more wiring layers that include a pad portion in a same layer of the one or more insulating layers as the polarization layer.

According to a second embodiment of the present disclosure, an imaging device comprises one or more insulating layers on a substrate; an effective region including: a polarization layer on a first surface of the one or more insulating layers and including one or more polarizers that polarize light; and at least one first photoelectric conversion region in the substrate and that converts incident light polarized by the one or more polarizers into electric charge. The imaging device includes a peripheral region outside the effective region and including: a wiring layer that includes a pad portion on a second surface of the one or more insulating layers. The second surface is on a different plane than the first surface.

According to a third embodiment of the present disclosure, an electronic apparatus comprises an imaging device including: one or more insulating layers on a substrate; an effective region including: a polarization layer in the one or more insulating layers and including one or more polarizers that polarize light; and at least one first photoelectric conversion region in the substrate and that converts incident light polarized by the one or more polarizers into electric charge. The imaging device includes a peripheral region outside the effective region and including one or more wiring layers that include a pad portion in a same layer of the one or more insulating layers as the polarization layer.

According to a fourth embodiment of the present disclosure, an electronic apparatus comprises an imaging device including: one or more insulating layers on a substrate; an effective region including: a polarization layer on a first surface of the one or more insulating layers and including one or more polarizers that polarize light; and at least one first photoelectric conversion region in the substrate and that converts incident light polarized by the one or more polarizers into electric charge. The imaging device includes a peripheral region outside the effective region. The peripheral region includes a wiring layer that includes a pad portion on a second surface of the one or more insulating layers, wherein the second surface is on a different plane than the first surface.

According to embodiments of the present disclosure, the problems such as damage to the wire grid polarizers and the photoelectric conversion devices (imaging devices), which may be caused at the time forming the wire grid polarizers as a result of the charging of the wire grid polarizers and the occurrence of a kind of discharge, can be reliably avoided. Further, the wire grid polarizers and the pad portion are electrically connected to each other. With this, the problems such as damage to the wire grid polarizers and the photoelectric conversion devices (imaging devices), which may be caused at the time forming the wire grid polarizers as a result of the charging of the wire grid polarizers and the occurrence of a kind of discharge, can be reliably avoided. Note that, the advantages disclosed herein are merely examples, and hence are not limited thereto. In addition, other advantages may be obtained.

BRIEF DESCRIPTION OF DRAWINGS

Figure 32:
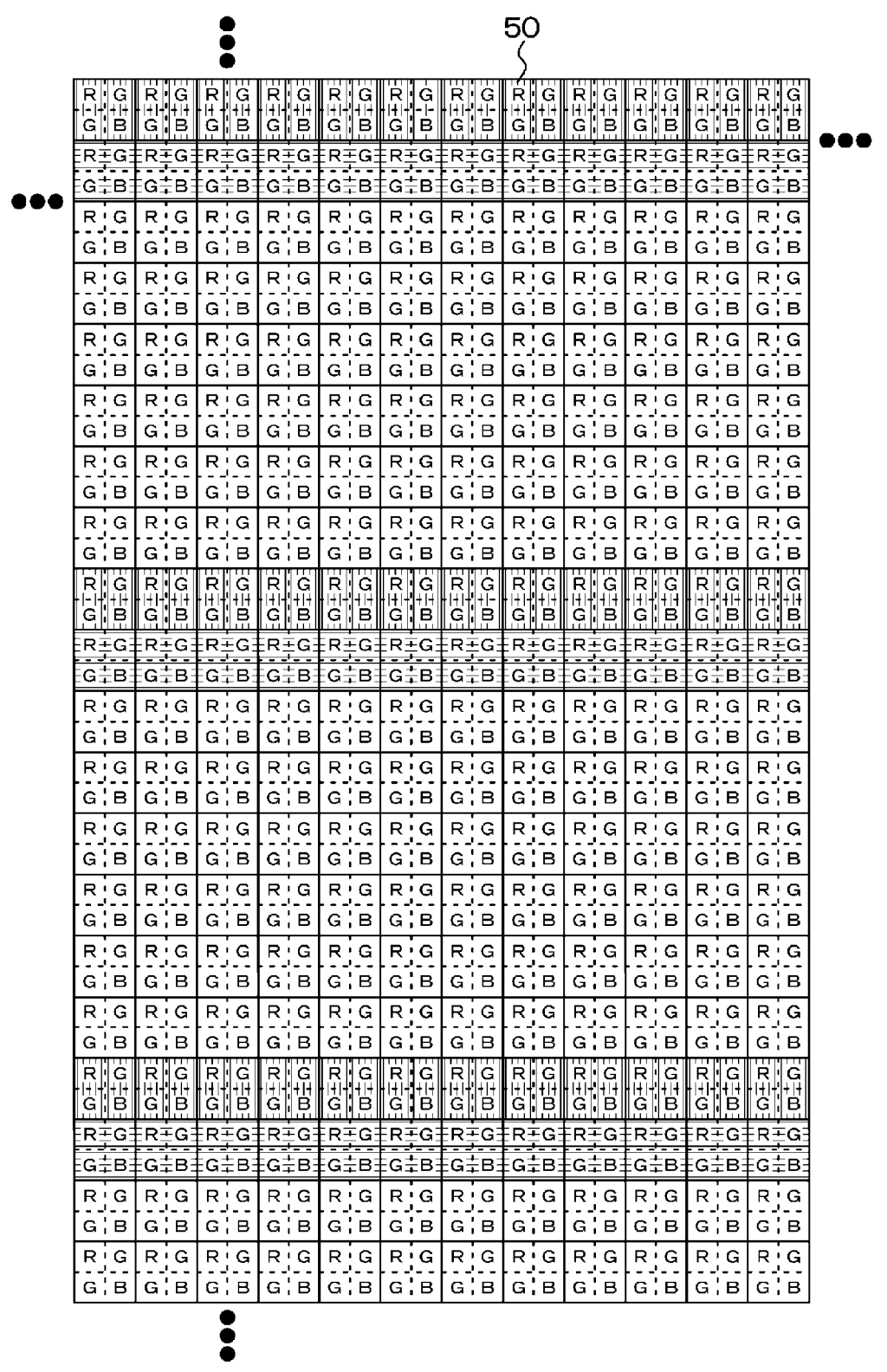

FIG. 32 is a plan layout view of yet another modification of the photoelectric conversion devices in the Bayer array.

Figure 35:
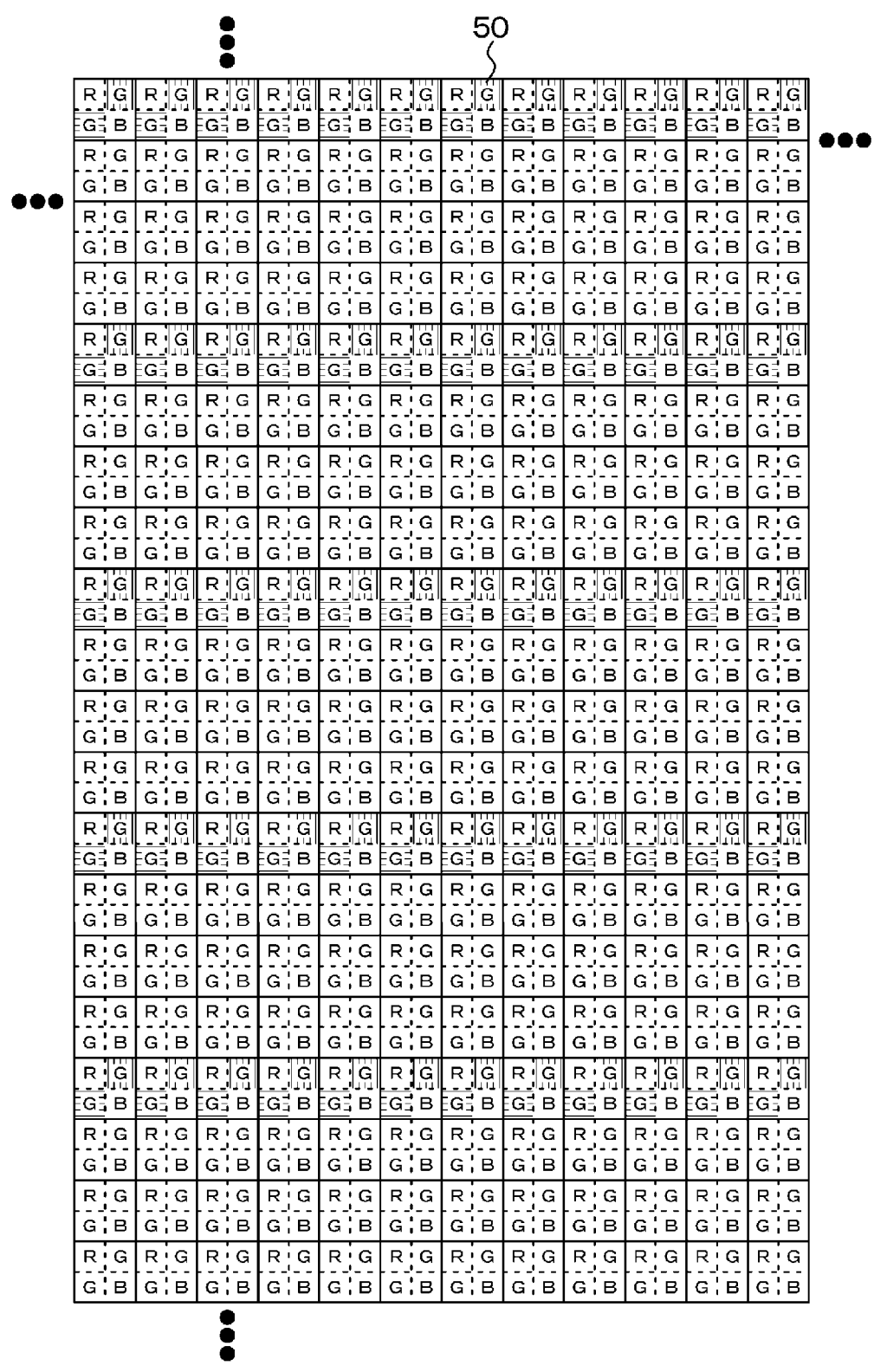

FIG. 35 is a plan layout view of yet another modification of the photoelectric conversion devices in the Bayer array.

DESCRIPTION OF EMBODIMENTS

Figure 1:
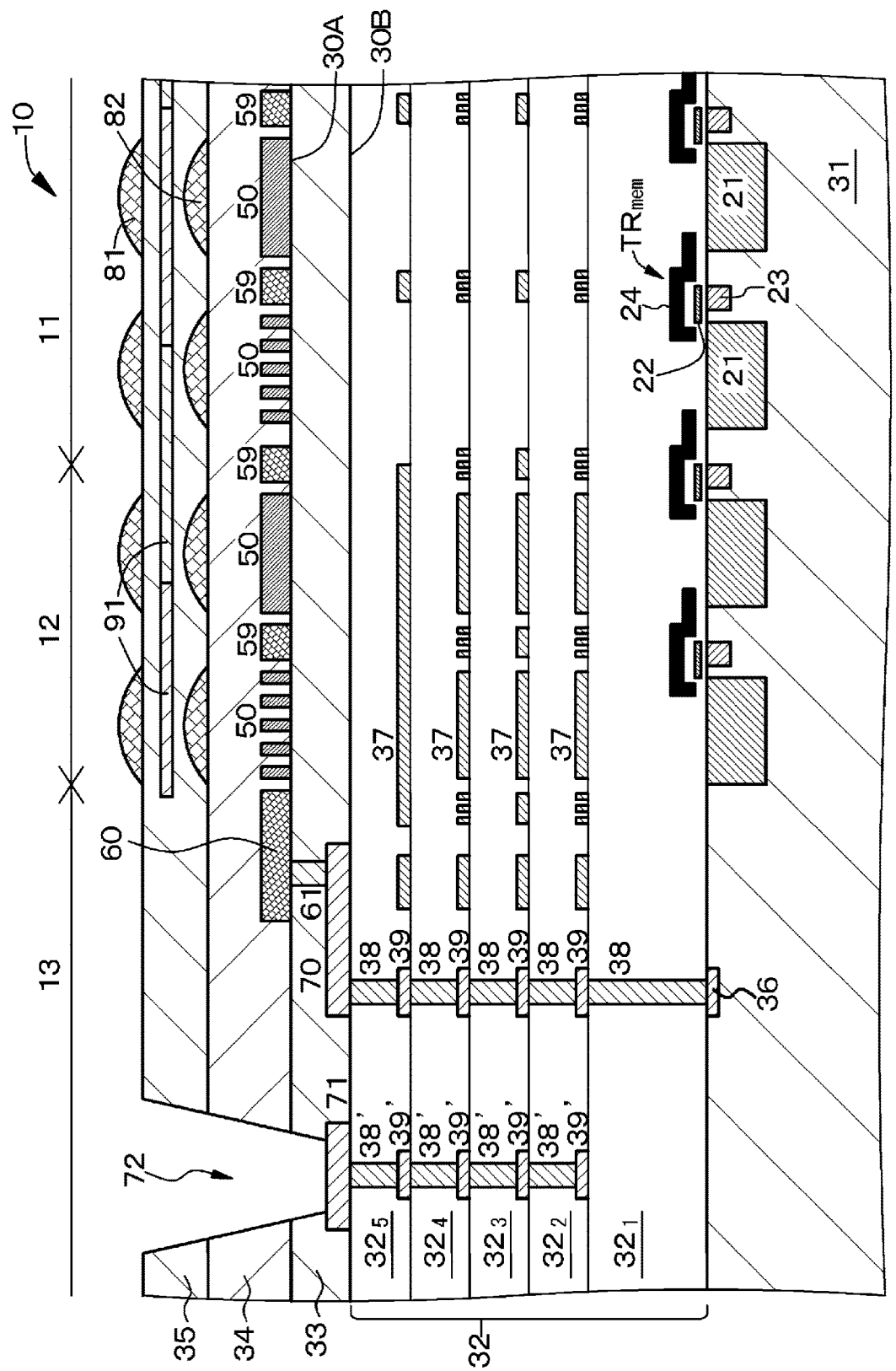
FIG. 1 is a schematic partial cross-sectional view of a solid-state imaging apparatus according to Embodiment 1.

In the following, embodiments of the present disclosure are described with reference to the drawings. The present disclosure is not limited to the embodiments, that is, various numerical values and materials are merely examples. Note that, the description is made in the following order.
1. Solid-State Imaging Apparatuses According to First Embodiment and Second Embodiment of Present Disclosure, and General Description Thereof
2. Embodiment 1 (Solid-State Imaging Apparatus According to First Embodiment of Present Disclosure)
3. Embodiment 2 (Modification of Embodiment 1)
4. Embodiment 3 (Another Modification of Embodiment 1)
5. Embodiment 4 (Still Another Modification of Embodiment 1)
6. Embodiment 5 (Yet Another Modification of Embodiment 1)
7. Embodiment 6 (Yet Another Modification of Embodiment 1)
8. Embodiment 7 (Yet Another Modification of Embodiment 1)
9. Embodiment 8 (Solid-State Imaging Apparatus According to Second Embodiment of Present Disclosure)
10. Others <Solid-State Imaging Apparatuses According to First Embodiment and Second Embodiment of Present Disclosure, and General Description Thereof>

With regard to the plurality of photoelectric conversion devices arrayed in two-dimensional matrix, for the sake of convenience of description, one array direction of the photoelectric conversion devices is referred to as an "$x_0$ direction," and another array direction is referred to as a "$y_0$ direction." It is preferred that the $x_0$ direction and the $y_0$ direction be orthogonal to each other. The $x_0$ direction corresponds to one of what is called a row direction and what is called a column direction, and the $y_0$ direction corresponds to another one of the column direction and the row direction.

In the solid-state imaging apparatus (or imaging device) according to the first embodiment of the present disclosure, a predetermined potential may be applied to the conductor topmost layer. Further, the wire-grid-polarizer extended portion may have a structure that blocks light transmission therethrough.

The solid-state imaging apparatus according to the first embodiment of the present disclosure, which has this preferred form, may further include light blocking portions formed above regions between ones of the photoelectric conversion devices and other ones of the photoelectric conversion devices in the photoelectric conversion device group.

The light blocking portions may be located on the second surface (in a second plane). When the light blocking portions are formed, optical crosstalk can be reduced. The light blocking portions may each have the same configuration as that of the conductor topmost layer.

The solid-state imaging apparatus according to the first embodiment of the present disclosure, which has these preferred forms, may further include an optical black (OPB) region arranged between the valid pixel region and the peripheral region.

The wire-grid-polarizer extended portion may be formed across a boundary between the optical black region and the peripheral region.

The optical black region may be shielded from light by the wire-grid-polarizer extended portion. With this, dark current characteristics in the optical black region can be improved.

In the valid pixel region, normally, signal charges generated by photoelectric conversion of actually received light beams are amplified, and read out to a drive circuit. Further, optical black being a reference of a black level is output from the optical black (OPB) region.

Alternatively, in the solid-state imaging apparatus according to the first embodiment of the present disclosure, which has the above-mentioned preferred forms, the optical black (OPB) region is between the valid pixel region and the peripheral region, and the wire grid polarizers may be formed in both the valid pixel region and the optical black region. In this case, the optical black (OPB) region may be shielded from light by the conductor topmost layer.

The solid-state imaging apparatus according to the second embodiment of the present disclosure may further include light blocking portions formed above regions between ones of the photoelectric conversion devices and other ones of the photoelectric conversion devices in the photoelectric conversion device group.

The light blocking portions may be formed of frame portions that connect ones of the wire grid polarizers and other ones of the wire grid polarizers to each other, the frame portions blocking light transmission therethrough. When the light blocking portions are formed, optical crosstalk can be reduced. Further, in the solid-state imaging apparatus according to the second embodiment of the present disclosure, which has these preferred forms, the optical black (OPB) region is arranged between the valid pixel region and the peripheral region, the wire grid polarizers may be formed in both the valid pixel region and the optical black region, and the optical black region may be shielded from light by the wire grid polarizers. With this, the dark current characteristics in the optical black region can be improved. Note that, although need not necessarily, it is preferred that the frame portions be arranged in a manner of forming a kind of casing trims that surround the wire grid polarizers arranged correspondingly to the photoelectric conversion devices. Further, when the optical black region is shielded from the light by the wire grid polarizers, parts of the wire grid polarizers, which shields the optical black region (hereinafter, this part may sometimes be referred to as "light-transmission blocking parts of the wire grid polarizers"), may have the same structure as that, for example, of the frame portions.

The solid-state imaging apparatuses according to the first embodiment and the second embodiment of the present disclosure, which have the above-mentioned preferred forms and configurations, may each further include on-chip microlenses that are formed on both a top side of the valid pixel region and a top side of the peripheral region.

Further, the solid-state imaging apparatuses according to the first embodiment and the second embodiment of the present disclosure, which have the above-mentioned preferred forms and configurations, may each further include memory units formed on the semiconductor substrate, connected to the photoelectric conversion devices, and configured to temporarily store charges that are generated in the photoelectric conversion devices. With this, what is called a global shutter function can be easily exerted.

In each of the solid-state imaging apparatuses according to the first embodiment and the second embodiment of the present disclosure, which have the above-mentioned preferred forms and configurations (hereinafter, sometimes collectively and simply referred to as "solid-state imaging apparatuses according to the present disclosure and other similar apparatuses"), the wire grid polarizers for the plurality of photoelectric conversion devices are common to each other. Specifically, the wire grid polarizers for all of the photoelectric conversion devices forming the solid-state imaging apparatuses may be common to each other. Alternatively, when the photoelectric conversion devices forming the solid-state imaging apparatuses are allocated to a plurality of blocks, the wire grid polarizers may be common to each other in each of the blocks. In addition, in the solid-state imaging apparatus according to the first embodiment of the present disclosure, which has the above-mentioned preferred forms and configurations, in accordance with the configuration of the wire grid polarizers, the conductor topmost layer that is arranged in the peripheral region located on the outside of the valid pixel region may be arranged at one position, or may include a plurality of conductor topmost layers that are arranged at a plurality of positions. The wire-grid-polarizer extended portion is arranged over the region that connects the wire grid polarizer in the valid pixel region and the conductor topmost layer in the peripheral region. However, the wire grid polarizer is not arranged in the peripheral region. When the wire grid polarizer is not arranged in the peripheral region, circuit capacity can be reduced. In the solid-state imaging apparatuses according to the present disclosure and in other similar apparatuses, the wire grid polarizers are formed above the semiconductor substrate at the positions corresponding to the photoelectric conversion devices on the light incidence side of the photoelectric conversion devices. Specifically, interlayer insulating layers are formed on the semiconductor substrate, and the wire grid polarizers are formed on a top surface of the interlayer insulating layers or on a base insulating layer formed on the interlayer insulating layers. In the solid-state imaging apparatus according to the first embodiment of the present disclosure, the first surface on which the wire grid polarizers are formed corresponds to a top surface of the base insulating layer, and the second surface on which the conductor topmost layer is formed corresponds to the top surface of the interlayer insulating layers. Further, in the solid-state imaging apparatus according to the second embodiment of the present disclosure, the first surface on which the wire grid polarizers are formed corresponds to the top surface of the interlayer insulating layers, and the second surface on which the pad portion is formed also corresponds to the top surface of the interlayer insulating layers.

In the solid-state imaging apparatuses according to the present disclosure and in other similar apparatuses, the wire grid polarizers may each include a plurality of laminated bodies which are juxtaposed away from each other and each of which includes at least a light reflecting layer and a light absorbing layer each having a belt-like shape (light absorbing layer being located on the light incidence side) (that is, may each have a line-and-space structure). Alternatively, the wire grid polarizers may each include a plurality of laminated bodies which are juxtaposed away from each other and each of which includes the light reflecting layer, an insulating film, and the light absorbing layer each having a belt-like shape (light absorbing layer being located on the light incidence side). Note that, in this case, the light reflecting layer and the light absorbing layer of each of the laminated bodies may be spaced away from each other by the insulating film (that is, insulating film may be formed all over a top surface of the light reflecting layer, and light absorbing layer may be formed all over a top surface of the insulating film). Alternatively, the insulating film may be partially cut out, and the light reflecting layer and the light absorbing layer may be in contact with each other through intermediation of this cutout portion of the insulating film. Further, in these cases, the light reflecting layer may be made of a first conductive material, and the light absorbing layer may be made of a second conductive material. With such a configuration, entire regions of the light absorbing layer and the light reflecting layer are electrically connected to the conductor topmost layer or the pad portion. As a result, the discharge can be more reliably prevented (or alternatively, reduced). Still alternatively, the wire grid polarizers may each have a configuration in which the light absorbing layer and the light reflecting layer are laminated from the light incidence side with the insulating film therebetween being omitted.

These wire grid polarizers each including a plurality of line portions (described below) which are juxtaposed away from each other and each of which includes the light reflecting layer, the insulating film, and the light absorbing layer each having the belt-like shape can be manufactured, for example, by the steps of (A) forming the photoelectric conversion devices, then forming, above the photoelectric conversion devices, a light-reflecting-layer forming layer (described below) made of the first conductive material and electrically connected to the substrate or the photoelectric conversion devices, (B) forming an insulating-film forming layer (described below) over the light-reflecting-layer forming layer, then forming, over the insulating-film forming layer, a light-absorbing-layer forming layer (described below) made of the second conductive material and including at least a part in contact with the light-reflecting-layer forming layer, and after that, (C) patterning the light-absorbing-layer forming layer, the insulating-film forming layer, and the light-reflecting-layer forming layer. Note that, in Step (B), at the time of forming the light-absorbing-layer forming layer with the second conductive material, the light-reflecting-layer forming layer may be charged with a predetermined potential through intermediation of the substrate or the photoelectric conversion devices, and in Step (C), at the time of patterning the light-absorbing-layer forming layer, the insulating-film forming layer, and the light-reflecting-layer forming layer, the light-reflecting-layer forming layer may be charged with a predetermined potential through intermediation of the substrate or the photoelectric conversion devices.

Further, a base film may be formed under the light reflecting layer such that roughness of the light-reflecting-layer forming layer and the light reflecting layer can be improved. As an example of materials for the base film (barrier metal layer), there may be mentioned a laminated body of Ti, TiN, or Ti/TiN.

In the following, for the sake of convenience of description, the laminated bodies forming the wire grid polarizers may sometimes be referred to as "first laminated bodies," and laminated bodies forming the wire-grid-polarizer extended portions, or the light-transmission blocking parts of the wire grid polarizers may sometimes be referred to as "second laminated bodies."

The laminated bodies forming the wire-grid-polarizer extended portions that block light transmission therethrough, or the light-transmission blocking parts of the wire grid polarizers may each have the same configuration as that of the laminated bodies forming the wire grid polarizers (in other words, second laminated bodies may each include at least the light reflecting layer and the light absorbing layer, for example, include the light reflecting layer, the insulating film, and the light absorbing layer, that is, may be formed to have what is called a flat-film structure instead of the line-and-space structure). Depending on functions required of the wire-grid-polarizer extended portion (specifically, when the light blocking function is unnecessary), the second laminated bodies may each have the line-and-space structure similar to the wire grid polarizers. In other words, the formation pitch $P_0$ of the wire grid may be set sufficiently larger than an effective wavelength of an incident electromagnetic wave.

It is appropriate that the frame portions also be formed of the second laminated bodies. When necessary, the frame portions may be formed of the first laminated bodies. It is preferred that the frame portions be coupled to the line portions of each of the wire grid polarizers. The frame portions may function as the light blocking portions.

In each of the wire grid polarizers in the solid-state imaging apparatuses according to the present disclosure and in other similar apparatuses, a direction in which the light reflecting layers each having the belt-like shape extend may be the same as a polarization orientation in which light is extinct, and a direction in which the light reflecting layers are alternately formed may be the same as a polarization orientation in which the light is transmitted. In other words, the light reflecting layers have a function of a polarizer, specifically, filter light that has entered the wire grid polarizers such that a polarized wave (any one of TE wave/S wave and TM wave/P wave) having an electric field component in a direction parallel to the direction in which the light reflecting layers extend is attenuated, and that a polarized wave (another one of TE wave/S wave and TM wave/P wave) having an electric field component in another direction orthogonal to the direction in which the light reflecting layers extend (direction in which the light reflecting layers each having the belt-like shape are alternately formed) is transmitted therethrough. In still other words, the direction in which the light reflecting layers extend corresponds to a light absorption axis of the wire grid polarizers, and the direction orthogonal to the direction in which the light reflecting layers extend corresponds to a light transmission axis of the wire grid polarizers. Further, the second direction may be parallel to the $x_0$ direction or the $y_0$ direction. For the sake of convenience of description, the direction in which the light reflecting layers each having the belt-like shape (that is, each forming the line portion of the line-and-space structure) extend may sometimes be referred to as a "first direction," and the direction in which the light reflecting layers (line portions) each having the belt-like shape are alternately formed (direction orthogonal to the direction in which the light reflecting layers each having the belt-like shape extend) may sometimes be referred to as a "second direction."

In other words, in the solid-state imaging apparatuses according to the present disclosure and in other similar apparatuses, when light enters through the light absorbing layers, the wire grid polarizers utilize four actions, that is, transmission of the light, reflection of the light, interference with the light, and optically-anisotropic selective light absorption from the polarized waves. With this, the wire grid polarizers attenuate the polarized wave (any one of TE wave/S wave and TM wave/P wave) having the electric field component parallel to the first direction, and allow the polarized wave (another one of TE wave/S wave and TM wave/P wave) having the electric field parallel to the second direction to be transmitted therethrough. In other words, one of the polarized waves (for example, TE wave) is attenuated by the selective light absorption from the polarized waves by the optical anisotropy of the light reflecting layers. The light reflecting layers each having the belt-like shape function as the polarizer, and reflect the one of the polarized waves (for example, TE wave), which has transmitted through the light absorbing layers and the insulating films. When the insulating films are formed such that a phase of the one of the polarized waves (for example, TE wave), which has transmitted through the light absorbing layers and been reflected by the light reflecting layers, is shifted by a half wavelength at this time, the one of the polarized waves (for example, TE wave), which has been reflected by the light reflecting layers, is attenuated by interfering with and being cancelled out by the one of the polarized waves (for example, TE wave), which has been reflected by the light absorbing layers. In this way, the one of the polarized waves (for example, TE wave) can be selectively attenuated. Note that, even when a thickness of the insulating films is not optimized, contrast can be increased. Thus, it is appropriate that a practical thickness of the insulating films be determined based on a balance between desired polarization characteristics and actual preparation steps.

The light reflecting layers (light-reflecting-layer forming layers) may be made of a metal material, an alloy material, or a semiconductor material. The light absorbing layers may be made of a metal material, an alloy material, or a semiconductor material. As specific examples of inorganic materials for the light reflecting layers (light-reflecting-layer forming layers), there may be mentioned metal materials such as aluminum (Al), silver (Ag), gold (Au), copper (Cu), platinum (Pt), molybdenum (Mo), chromium (Cr), titanium (Ti), nickel (Ni), tungsten (W), iron (Fe), silicon (Si), germanium (Ge), and tellurium (Te), and alloy materials and semiconductor materials containing these metals.

As examples of the material for the light absorbing layers (or light-absorbing-layer forming layers), there may be mentioned metal materials, alloy materials, and semi-conductor materials each having an extinction coefficient k other than zero, that is, exerts a light absorption effect. Specifically, there may be mentioned metal materials such as aluminum (Al), silver (Ag), gold (Au), copper (Cu), molybdenum (Mo), chromium (Cr), titanium (Ti), nickel (Ni), tungsten (W), iron (Fe), silicon (Si), germanium (Ge), tellurium (Te), and tin (Sn), and alloy materials and semiconductor materials containing these metals. Further, there may also be mentioned silicide-based materials such as $FeSi_2$ (specifically, $\beta$-$FeSi_2$), $MgSi_2$, $NiSi_2$, $BaSi_2$, $CrSi_2$, and $CoSi_2$. In particular, when the semiconductor material containing aluminum (Al) or alloys thereof, or $\beta$-$FeSi_2$, germanium, or tellurium is used as the material for the light absorbing layer (light-absorbing-layer forming layer), high contrast (high extinction ratio) can be exhibited in a visible light band. Note that, in order to secure the polarization characteristics in wavelength bands out of the visible light band, such as an infrared band, it is preferred that silver (Ag), copper (Cu), gold (Au), or the like be used as the material for the light absorbing layer (light-absorbing-layer forming layer). This is because resonance wavelengths of these metals are close to the infrared band.

The light-reflecting-layer forming layer and the light-absorbing-layer forming layer can be formed by various chemical vapor deposition methods (CVD methods), by various physical vapor deposition methods (PVD methods) such as a coating method, a sputtering method, and a vacuum evaporation method, or by other well-known methods such as a sol-gel method, a plating method, a MOCVD method, and an MBE method. Further, as examples of patterning methods for the light-reflecting-layer forming layer and the light-absorbing-layer forming layer, there may be mentioned combinations of lithography techniques and etching techniques (such as anisotropic dry-etching techniques that use, for example, a carbon tetrafluoride gas, a sulfur hexafluoride gas, a trifluoromethane gas, and a xenon difluoride gas, and physical etching techniques), what is called a lift-off technique, and what is called a self-aligned double patterning technique that uses sidewalls as a mask. As examples of the lithography techniques, there may be mentioned photolithography techniques (lithography techniques that use light sources such as a g-line and an i-line of a high-pressure mercury lamp, a KrF excimer laser, an ArF excimer laser, an EUV light source, immersion lithography techniques that use these light sources, an electron beam lithography technique, and an X-ray lithography technique). Still further, the light reflecting layer and the light absorbing layer can be formed by micromachining techniques that use ultrashort pulsed laser beams such as a femtosecond laser beam, or by a nanoimprint method.

As examples of materials for the insulating films (or insulating-film forming layers), the interlayer insulating layers, the base insulating layer, and planarizing films, there may be mentioned insulating materials that are transparent and do not have light absorption characteristics with respect to incident light. Specifically, there may be mentioned $SiO_X$ materials (materials for silicon oxide films) such as silicon dioxide ($SiO_2$), a non-doped silicate glass (NSG), a borophosphosilicate glass (BPSG), PSG, BSG, PbSG, AsSG, SbSG, and a spin-on glass (SOG), SiN, silicon oxynitride (SiON), SiOC, SiOF, SiCN, low-permittivity insulating materials (such as fluorocarbon, cyclo perfluorocarbon polymer, benzocyclobutene, a cyclic fluorine resin, polytetrafluoroethylene, amorphous tetrafluoroethylene, polyarylether, fluorinated aryl ether, fluorinated polyimide, an organic SOG, parylene, fluorinated fullerene, and amorphous carbon), a polyimide-based resin, a fluorine resin, "SiLK" (trademark of The Dow Chemical Co., a material for coating-type low-permittivity interlayer insulating films), and "Flare" (trademark of Honeywell Electronic Materials Co., a polyarylether-based (PAE-based) material). These materials may be used alone or in combination with each other as appropriate. Further, there may also be mentioned organic insulating materials (organic polymers) such as polymethyl methacrylate (PMMA); polyvinyl phenol (PVP); polyvinyl alcohol (PVA); polyimide; polycarbonate (PC); polyethylene terephthalate (PET); polystyrene; silanol derivatives (silane coupling agents) such as N-2(aminoethyl)3-aminopropyltrimethoxysilane (AEAPTMS), 3-mercaptopropyltrimethoxysilane (MPTMS), and octadecyltrichlorosilane (OTS); a novolac phenolic resin; a fluorine resin; and straight chain hydrocarbons each having, at its one end, a functional group capable of bonding to a control electrode, such as octadecanethiol and dodecyl isocyanate. These organic insulating materials also may be used in combination with each other. The insulating-film forming layers may be formed by the various CVD methods, the various PVD methods such as the coating method, the sputtering method, and the vacuum evaporation method, various printing methods such as a screen printing method, or by other well-known methods such as the sol-gel method. The insulating films are formed so as to function as base layers for the light reflecting layers, and to adjust phases of polarized light beams reflected by the light absorbing layers and the phases of the polarized light beams that has transmitted through the light absorbing layers and been reflected by the light reflecting layers such that the interference effect is exerted to increase the extinction ratio and the transmittance and to reduce reflectance. Thus, it is desired that the thickness of the insulating films be set to shift a phase of one wave and a phase of another wave from each other by the half wavelength. Note that, the light absorbing layers exert the light absorption effect, and hence absorb the light beams reflected thereby. Thus, even when the thickness of the insulating films is not optimized, the extinction ratio can be increased. Therefore, it is appropriate that the thickness of the insulating films be determined based on the balance between the desired polarization characteristics and the actual preparation steps. As specific examples of the thickness, there may be mentioned a thickness of from $1\times10^{-9}$ m to $1\times10^{-7}$ m, and more preferably, a thickness of from $1\times10^{-8}$ m to $8\times10^{-8}$ m. Further, it is preferred that a refractive index of the insulating films be more than 1.0, and, although need not necessarily, 2.5 or less.

A floating diffusion layer, an amplification transistor, a reset transistor, and a selection transistor of a control unit configured to control drive of each of the wire grid polarizers may have the same configurations and the same structures as those of floating diffusion layers, amplification transistors, reset transistors, and selection transistors of related-art control units. The drive circuit also may have a well-known configuration and a well-known structure.

In the solid-state imaging apparatuses according to the present disclosure and in other similar apparatuses, space portions of each of the wire grid polarizers may be empty (in other words, space portions may at least be filled with air). When the space portions of each of the wire grid polarizers are empty in this way, the value of the average refractive index $n_{ave}$ can be reduced. As a result, the transmittance and the extinction ratio of the wire grid polarizers can be increased. Further, the value of the formation pitch $P_0$ can be increased, and hence a manufacturing yield of the wire grid polarizers can be increased. A protective film may be formed over each of the wire grid polarizers. With this, highly reliable photoelectric conversion devices and highly reliable solid-state imaging apparatuses can be provided. When the protective film is formed, the wire grid polarizers can be increased, for example, in humidity resistance, resulting in its higher reliability. A thickness of the protective film is not particularly limited as long as the polarization characteristics are not influenced thereby. A reflectance of the protective film with respect to the incident light varies depending on its optical thickness (refractive index x thickness of the protective film). Thus, it is appropriate that a material for the protective film and its thickness be determined in consideration of these factors. For example, the thickness may be set to 15 nm or less, or to ¼ or less of a clearance between one of the laminated bodies and another one of the laminated bodies. It is desired that materials having a refractive index of 2 or less and an extinction coefficient close to zero be used as the material for the protective film. As example of the desired materials, there may be mentioned insulating materials such as $SiO_2$ (including TEOS-$SiO_2$), SiON, SiN, SiC, SiOC, and SiCN, and metal oxides such as aluminum oxide ($AlO_x$), hafnium oxide ($HfO_x$), zirconium oxide ($ZrO_x$), and tantalum oxide ($TaO_x$). Further, there may also be mentioned perfluorodecyl-trichlorosilane and octadecyltrichlorosilane. The protective film may be formed by the various CVD methods, the various PVD methods such as the coating method, the sputtering method, and the vacuum evaporation method, or by other well-known processes such as the sol-gel method. However, it is more preferred that what is called an atomic layer deposition method (ALD method)) or a high density plasma-chemical vapor deposition method (HDP-CVD method) be employed. When the ALD method or the HDP-CVD method is employed, the protective film that is formed conformally over each of the wire grid polarizers can be thinned. The protective film may be formed all over each of the wire grid polarizers, or may be formed only over side surfaces in each of the wire grid polarizers without forming over parts of the base insulating layer, which are located between ones of the wire grid polarizers and other ones of the wire grid polarizers. Further, when the protective film is formed to cover the side surfaces, that is, exposed parts of the metal materials or the alloy materials of the wire grid polarizers (hereinafter, sometimes may be referred to as "metal materials and other materials") in this way, moisture and organic matter in the atmosphere can be blocked. With this, problems such as corrosion of and abnormal deposition of the metal materials and other materials of the wire grid polarizers can be reliably prevented (or alternatively, reduced). As a result, long-term reliability of the photoelectric conversion devices can be increased, and hence photoelectric conversion devices provided with on-chip wire grid polarizers having higher reliability can be provided.

In addition, in the case where the protective film is formed over each of the wire grid polarizers, when a second protective film is formed between each of the wire grid polarizers and the protective film, a relationship $$n_1 > n_2$$

may be satisfied, where $n_1$ is a refractive index of the material of the protective film, and $n_2$ is a refractive index of a material of the second protective film. When the relationship $n_1 > n_2$ is satisfied, the value of the average refractive index $n_{ave}$ can be reliably reduced. Note that, it is preferred that the protective film be made of SiN, and that the second protective film be made of $SiO_2$ or SiON.

Further, a third protective film may be formed at least over the side surfaces of the line portions of each of the wire grid polarizers, which face the space portions of each of the wire grid polarizers. In other words, the space portions may be filled with air, and the third protective film may be exposed in the space portions. It is desired that the materials having the refractive index of 2 or less and the extinction coefficient close to zero be used as the material for the protective film. As examples of the desired materials for the third protective film, the insulating materials such as $SiO_2$ (including TEOS- $SiO_2$), SiON, SiN, SiC, SiOC, and SiCN, and the metal oxides such as aluminum oxide ($AlO_x$), hafnium oxide ($HfO_x$), zirconium oxide ($ZrO_x$), and tantalum oxide ($TaO_x$) may be mentioned. Further, there may also be mentioned perfluorodecyl-trichlorosilane and octadecyltrichlorosilane. The third protective film may be formed by the various CVD methods, the various PVD methods such as the coating method, the sputtering method, and the vacuum evaporation method, or by other well-known processes such as the sol-gel method. However, it is more preferred that what is called the atomic layer deposition method (ALD method) or the high density plasma-chemical vapor deposition method (HDP-CVD method) be employed. When the ALD method is employed, the third protective film that is formed conformally over each of the wire grid polarizers can be thinned. However, from a viewpoint of further thinning the third protective film that is formed over the side surfaces of the line portions, it is much more preferred that the HDP-CVD method be employed. Further, when the space portions are filled with the material for the third protective film, and in addition, when the third protective film has, for example, clearances, pores, or voids, a refractive index of an entirety of the third protective film can be reduced.

When the metal materials and other materials of the wire grid polarizers are exposed to the outside air, corrosion resistance of the metal materials and other materials may be degraded by the moisture and the organic matter in the outside air. As a result, there is a risk that the long-term reliability of the photoelectric conversion devices is degraded. In particular, when the moisture forms on the line portions each formed of the metal materials and other materials, the insulating material, and the metal materials and other materials (laminated body), the moisture contains dissolved $CO_2$ and $O_2$, and hence acts as an electrolyte solution. As a result, there is a risk that the metal of two types behaves as a local cell. Then, when such a phenomenon occurs, a reductive reaction such as generation of hydrogen progresses on a cathode (positive electrode) side, and an oxidative reaction progresses on an anode (negative electrode) side. Thus, the abnormal deposition of the metal materials and other materials, and deformation of the wire grid polarizers occur. As a result, there is a risk that initially expected performances of the wire grid polarizers and the photoelectric conversion devices are degraded. For example, when the light reflecting layers are made of aluminum (Al), there is a risk that abnormal deposition of aluminum occurs as expressed by the following reaction formulae. However, when the protective film is formed, or when the third protective film is formed, such problems can be reliably avoided.

$$Al \rightarrow Al^{3+} + 3e$$

$$Al^{3+} + 3OH^- \rightarrow Al(OH)_3$$

In the solid-state imaging apparatuses according to the present disclosure and in other similar apparatuses, a length of each of the light reflecting layers along the first direction may be set equal to a length along the first direction of a photoelectric conversion region of each of the photoelectric conversion devices, in which photoelectric conversion is actually performed, set equal to a length of each of the photoelectric conversion devices themselves along the first direction, or set to an integral multiple of the length of each of the photoelectric conversion devices themselves along the first direction. However, the length of each of the light reflecting layers is not limited to these lengths.

In the solid-state imaging apparatuses according to the present disclosure and in other similar apparatuses, for example, a plurality of photoelectric conversion devices that are arrayed in a direction of forming an angle of 0 degrees with respect to the first direction, and a plurality of photoelectric conversion devices that are arrayed in a direction of forming an angle of 90 degrees may be used in combination with each other. Alternatively, the plurality of photoelectric conversion devices that are arrayed in the direction of forming the angle of 0 degrees with respect to the first direction, a plurality of photoelectric conversion devices that are arrayed in a direction of forming an angle of 45 degrees with respect to the first direction, the plurality of photoelectric conversion devices that are arrayed in the direction of forming the angle of 90 degrees with respect to the first direction, and a plurality of photoelectric conversion devices that are arrayed in a direction of forming an angle of 135 degrees with respect to the first direction may be used in combination with each other.

In the solid-state imaging apparatuses according to the present disclosure and in other similar apparatuses, on-chip microlenses (OCL) may include main on-chip microlenses arranged above the wire grid polarizers, or may include a combination of sub-on-chip microlenses (inner lenses, OPA) arranged above the wire grid polarizers and the main on-chip microlenses arranged above these sub-on-chip microlenses (OPA).

Further, in such a configuration, wavelength selecting sections (specifically, well-known color filter layers) may be arranged between the wire grid polarizers and the on-chip microlenses. When such a configuration is employed, the wire grid polarizers can be optimized independently in wavelength bands of light beams that transmit through the wire grid polarizers, and reflectance can be further reduced in all of the visible light bands. The planarizing film may be formed between the wire grid polarizers and the wavelength selecting sections. The base insulating layer that is made of the inorganic material such as the silicon oxide film and functions as a base for processes of the steps of manufacturing the wire grid polarizers may be formed under the wire grid polarizers. In the case where the main on-chip microlenses are arranged above the sub-on-chip microlenses (OPA), the wavelength selecting sections (well-known color filter layers) may be arranged between the sub-on-chip microlenses and the main on-chip microlenses.

As examples of the color filter layers, there may be mentioned filter layers configured to allow light beams with specific wavelengths of, for example, red, green, blue, cyan, magenta, and yellow to transmit therethrough. These color filters may be formed not only of organic-material-based color filter layers using organic compounds such as pigments and dyes, but also of thin films made of inorganic materials such as a photonic crystal, a wavelength selecting device that employs plasmon (color filter layer having a conductor grid structure obtained by forming grid holes through a conductor thin film, refer, for example, to Japanese Patent Application Laid-open No. 2008-177191), and amorphous silicon.

Below the conductor topmost layer (or below wire grid polarizers in some cases), for example, various wires made, for example, of aluminum (Al) or copper (Cu) are formed, for example, in a plurality of layers (wiring layers) so as to drive the photoelectric conversion devices. Further, the conductor topmost layer or the wire grid polarizers are connected to the semiconductor substrate through intermediation of the various wires (wiring layers) and through contact hole portions. With this, a predetermined potential can be applied not only to the conductor topmost layer but also to the wire grid polarizers. Specifically, the conductor topmost layer or the wire grid polarizers are grounded. The conductor topmost layer may be made, for example, of copper (Cu), aluminum (Al), tungsten (W), or chromium (Cr). Further as examples of the semiconductor substrate, there may be mentioned a silicon semiconductor substrate, and compound semiconductor substrates such as an InGaAs substrate.

Waveguide structures may be arranged between ones of the photoelectric conversion devices in the photoelectric conversion device group and corresponding ones of the wire grid polarizers, or light-collecting tube structures may be arranged between ones of the photoelectric conversion devices and other ones of the photoelectric conversion devices. With this, optical crosstalk can be reduced. The waveguide structures are each formed of a thin film formed through the interlayer insulating layers covering the photoelectric conversion devices in a region (for example, cylindrical region) located between one of the photoelectric conversion devices and corresponding one of the wire grid polarizers, the thin film having a refractive index value larger than a refractive index value of the material for the interlayer insulating layers. A light beam that enters from above the one of the photoelectric conversion devices is totally reflected by the thin film, and reaches the one of the photoelectric conversion devices. In other words, an orthogonal projection image from the one of the photoelectric conversion devices with respect to the substrate is located within an orthogonal projection image from the thin film of corresponding one of the waveguide structures with respect to the substrate. In still other words, the orthogonal projection image from the one of the photoelectric conversion devices with respect to the substrate is surrounded by the orthogonal projection image from the thin film of the corresponding one of the waveguide structures with respect to the substrate. Further, the light-collecting tube structures are each formed of light-blocking thin films that are made of a metal material or an alloy material and are formed through the interlayer insulating layers covering the photoelectric conversion devices in a region (for example, cylindrical region) located between one of the photoelectric conversion devices and another one of the photoelectric conversion devices. The light beam that enters from above the one of the photoelectric conversion devices is reflected by the thin films, and reaches the one of the photoelectric conversion devices. In other words, the orthogonal projection image from the one of the photoelectric conversion devices with respect to the substrate is located within an orthogonal projection image from the thin films of corresponding ones of the light-collecting tube structures with respect to the substrate. In still other words, the orthogonal projection image from the one of the photoelectric conversion devices with respect to the substrate is surrounded by the orthogonal projection image from the thin films of the corresponding ones of the light-collecting tube structures with respect to the substrate.

In the solid-state imaging apparatuses according to the present disclosure and in other similar apparatuses, one photoelectric conversion device unit (one pixel) may include the plurality of photoelectric conversion devices (sub-pixels). Further, for example, the sub-pixels each include one photoelectric conversion device. A relationship between the pixel and the sub-pixels is described below. The photoelectric conversion device itself may have the same configuration and the same structure as well-known configurations and structures.

In the solid-state imaging apparatuses according to the present disclosure and in other similar apparatuses, all of the photoelectric conversion devices may be provided with the wire grid polarizers, or some of the photoelectric conversion devices may be provided with the wire grid polarizers. The plurality of photoelectric conversion devices of the photoelectric conversion device unit may be arranged in a Bayer array, and the one photoelectric conversion device unit (one pixel) may include four photoelectric conversion devices (four sub-pixels). Note that, the array in the photoelectric conversion device unit is not limited to the Bayer array, and there may be employed other arrays such as an interline array, a G-stripe RB-checkered array, a G-stripe RB-completely-checkered array, a checkered complementary color array, a stripe array, a diagonal stripe array, a primary-color chrominance array, a field chrominance sequential array, a frame chrominance sequential array, a MOS-type array, a modified MOS-type array, a frame interleaved array, and a field interleaved array. The one photoelectric conversion device (imaging device) forms one pixel (or one sub-pixel). For example, in the Bayer array, the red, the green, and the blue color filter layers may be arranged respectively in three sub-pixel regions of two-by-two sub-pixel regions, and a wire grid polarizer may be arranged without a color filter layer in the rest one sub-pixel region in which another green color filter layer is supposed to be arranged. Alternatively, in the Bayer array, the red, the green, and the blue color filter layers may be arranged respectively in the three sub-pixel regions of the two-by-two sub-pixel regions, and the other green color filter and the wire grid polarizer may be arranged in the rest one sub-pixel region. When color separation and spectrum need not be performed, or when the photoelectric conversion devices themselves have sensitivities to particular wavelengths, the filters may be omitted. Further, in the sub-pixel region without the color filter layer, in order to secure flatness with the sub-pixel regions with the color filter layers arranged therein, a transparent resin layer may be arranged instead of the color filter layer. In other words, the photoelectric conversion devices may be a combination of a red-light photoelectric conversion device having a sensitivity to red light, a green-light photoelectric conversion device having a sensitivity to green light, and a blue-light photoelectric conversion device having a sensitivity to blue light. Alternatively, the photoelectric conversion devices may be a combination of infrared photoelectric conversion devices having sensitivities to infrared light. With this, a solid-state imaging apparatus configured to generate monochromatic images can be provided, and a solid-state imaging apparatus configured to generate both the monochromatic images and infrared images can be provided.

As examples of the photoelectric conversion devices of the solid-state imaging apparatuses according to the present disclosure and in other similar apparatuses, there may be mentioned those for CCD image sensors, CMOS image sensors, contact image sensors (CISs), and signal-amplifying image sensors of a charge modulation device (CMD) type. The photoelectric conversion devices are of a surface irradiation type. The solid-state imaging apparatuses may be used, for example, in a digital still camera, a video camera, a camcorder, a surveillance camera, a vehicle-mounted camera (in-vehicle camera), a smartphone camera, a user interface camera for video games, and a biometric authentication camera. The solid-state imaging apparatuses may be capable of acquiring polarization information at once with normal imaging. In addition, the solid-state imaging apparatuses may also be capable of capturing three-dimensional images.

The solid-state imaging apparatus according to the first embodiment and the second embodiment of the present disclosure are applicable to single-plate-type solid-state color imaging apparatuses.

Embodiment 1

Figure 10:
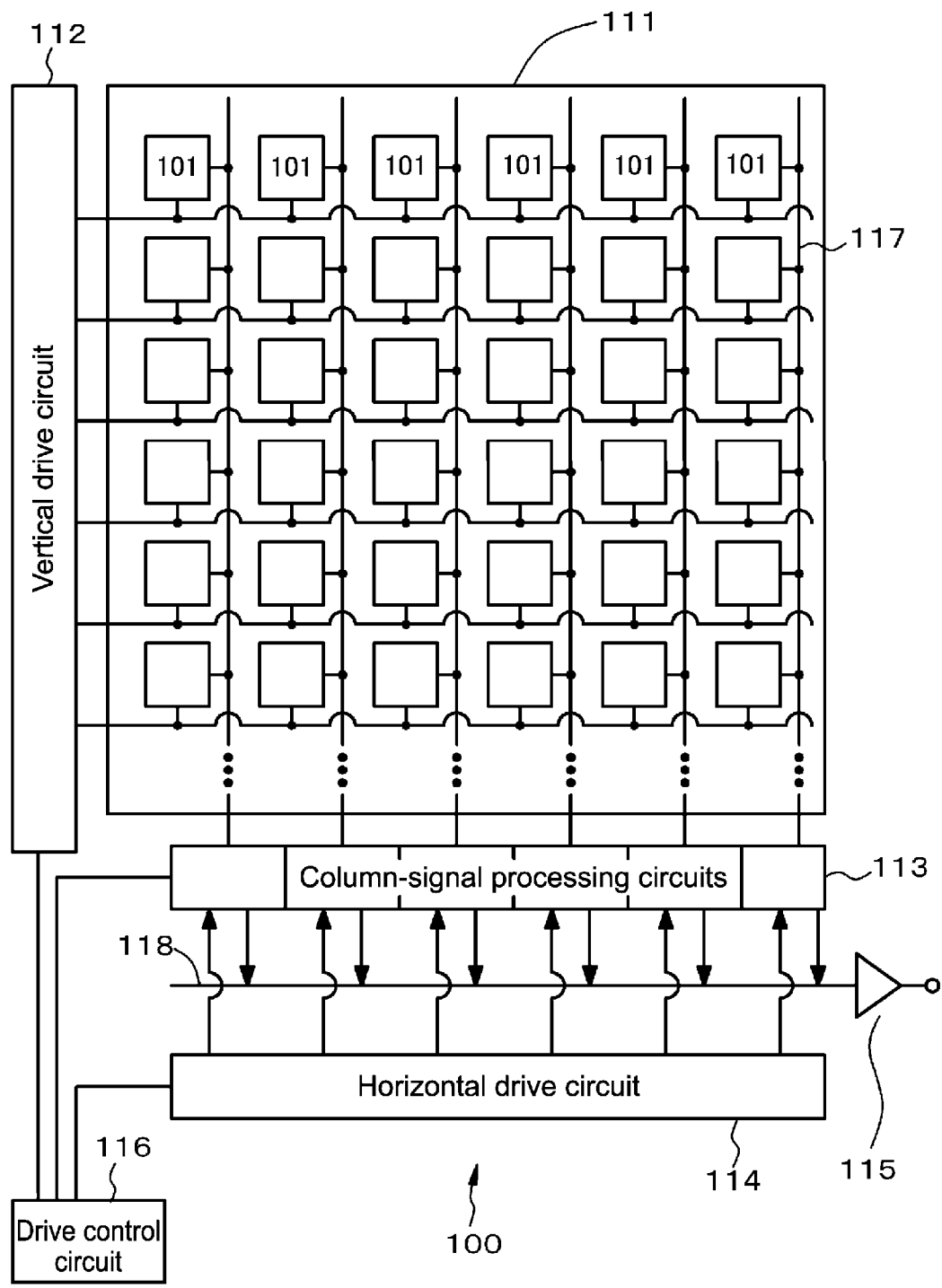
FIG. 10 is a conceptual diagram of the solid-state imaging apparatus according to Embodiment 1.
Figure 11:
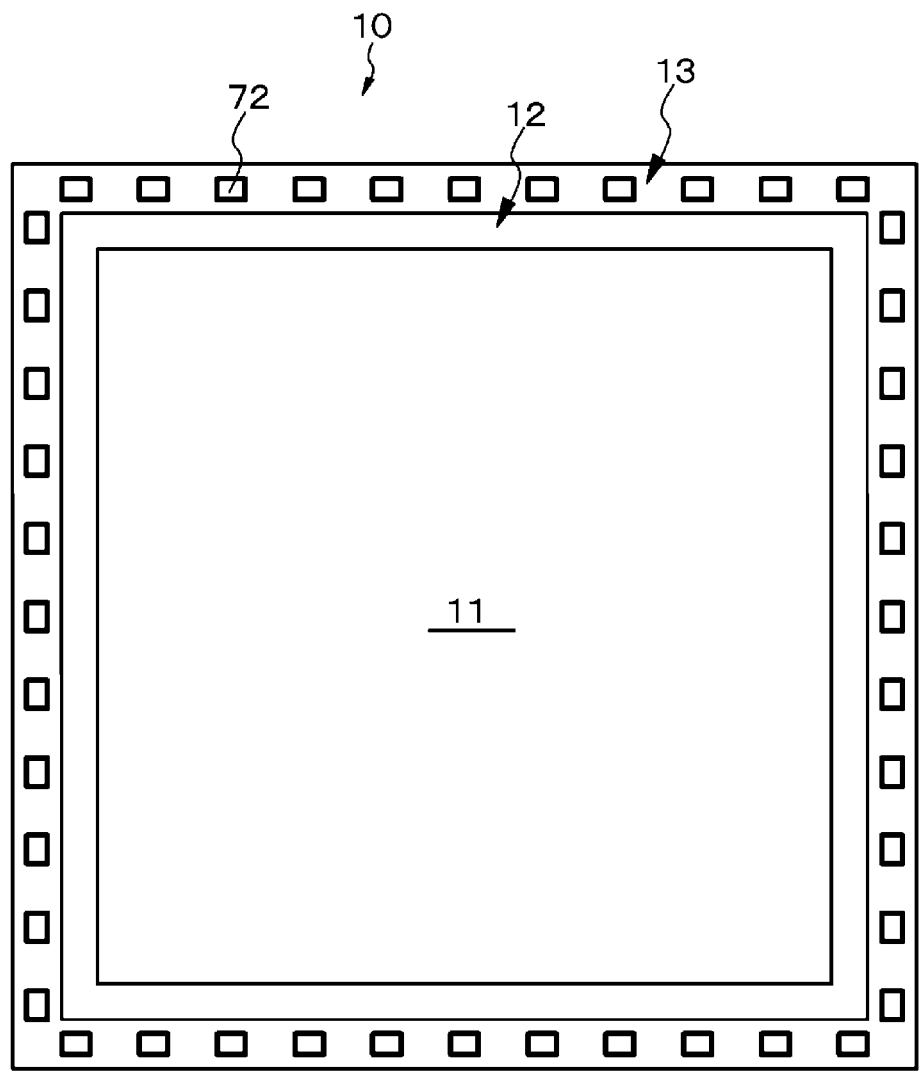
FIG. 11 is a schematic view of an arrangement of a valid pixel region, an optical black region, and a peripheral region in the solid-state imaging apparatus according to Embodiment 1.
Figure 12:
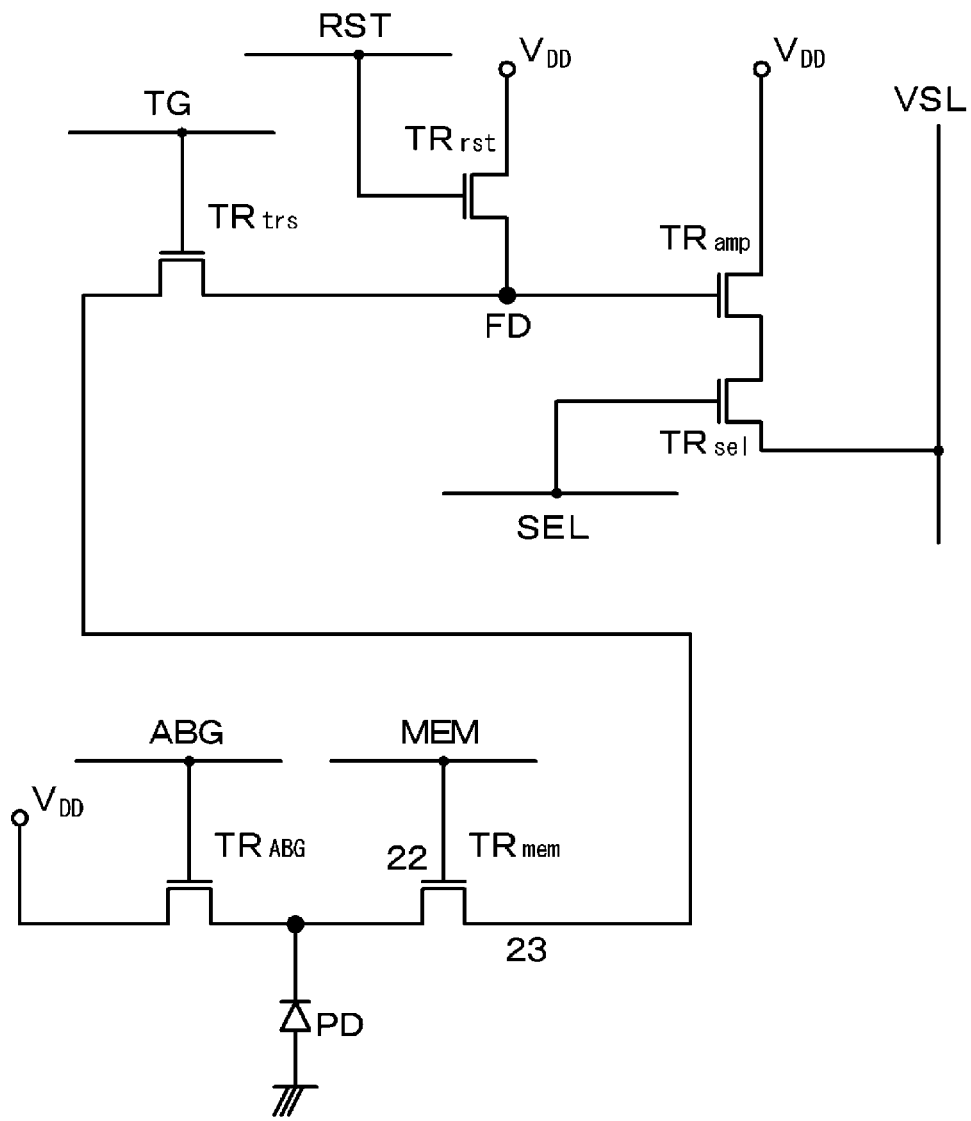
FIG. 12 is an equivalent circuit diagram of a photoelectric conversion device in the solid-state imaging apparatus according to Embodiment 1.
Figure 13:
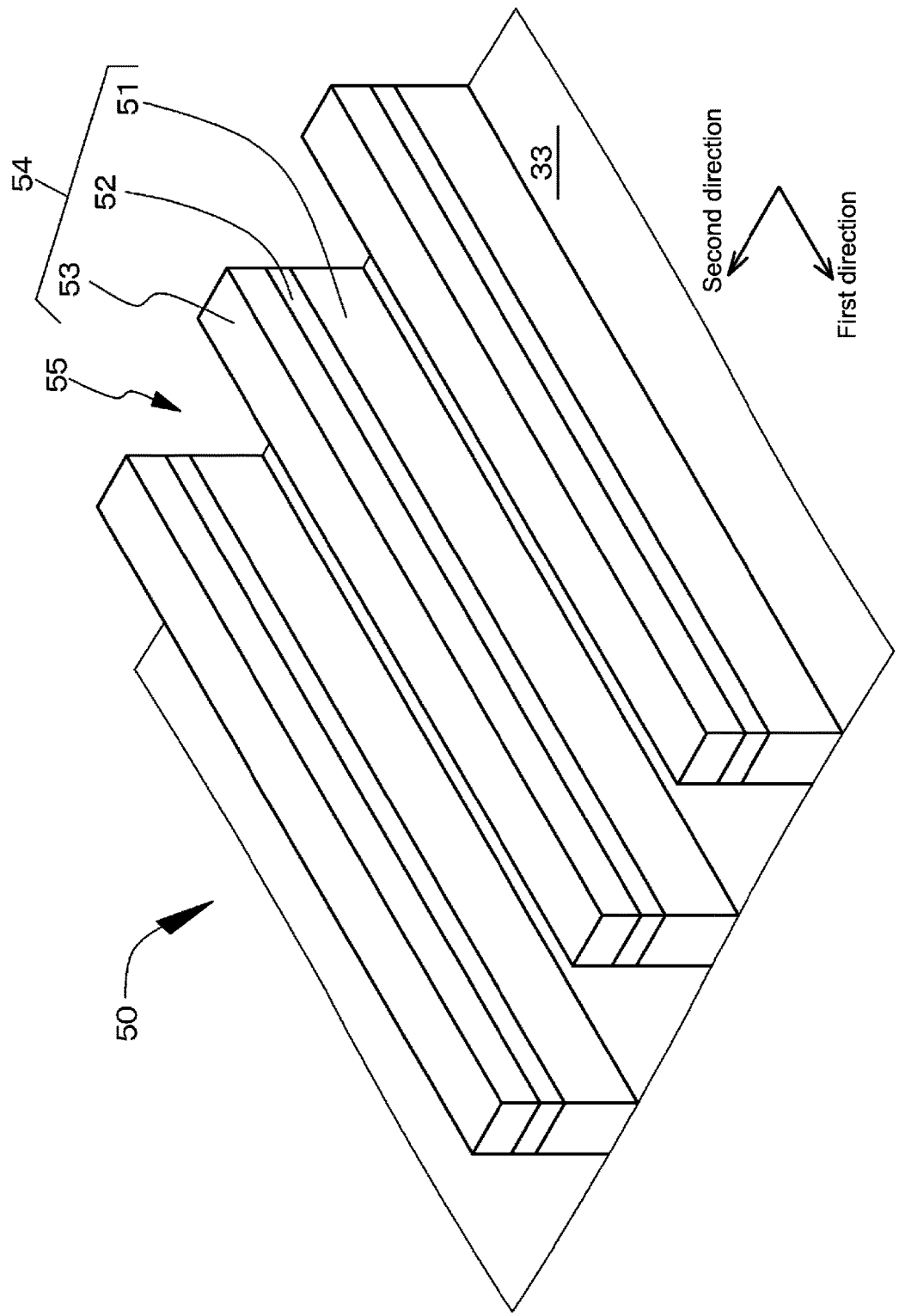
FIG. 13 is a schematic perspective view of a wire grid polarizer for the photoelectric conversion device in the solid-state imaging apparatus according to Embodiment 1.
Figure 14A:
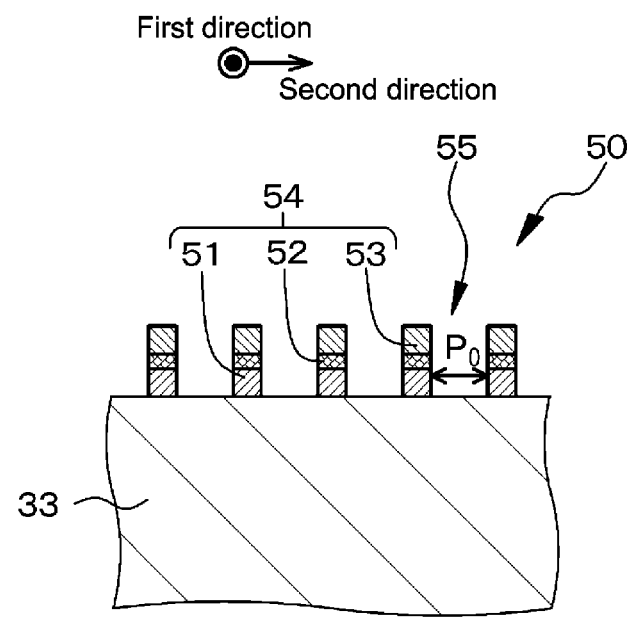
FIG. 14A is a schematic partial end view of the wire grid polarizer in the solid-state imaging apparatus according to Embodiment 1.
Figure 16:
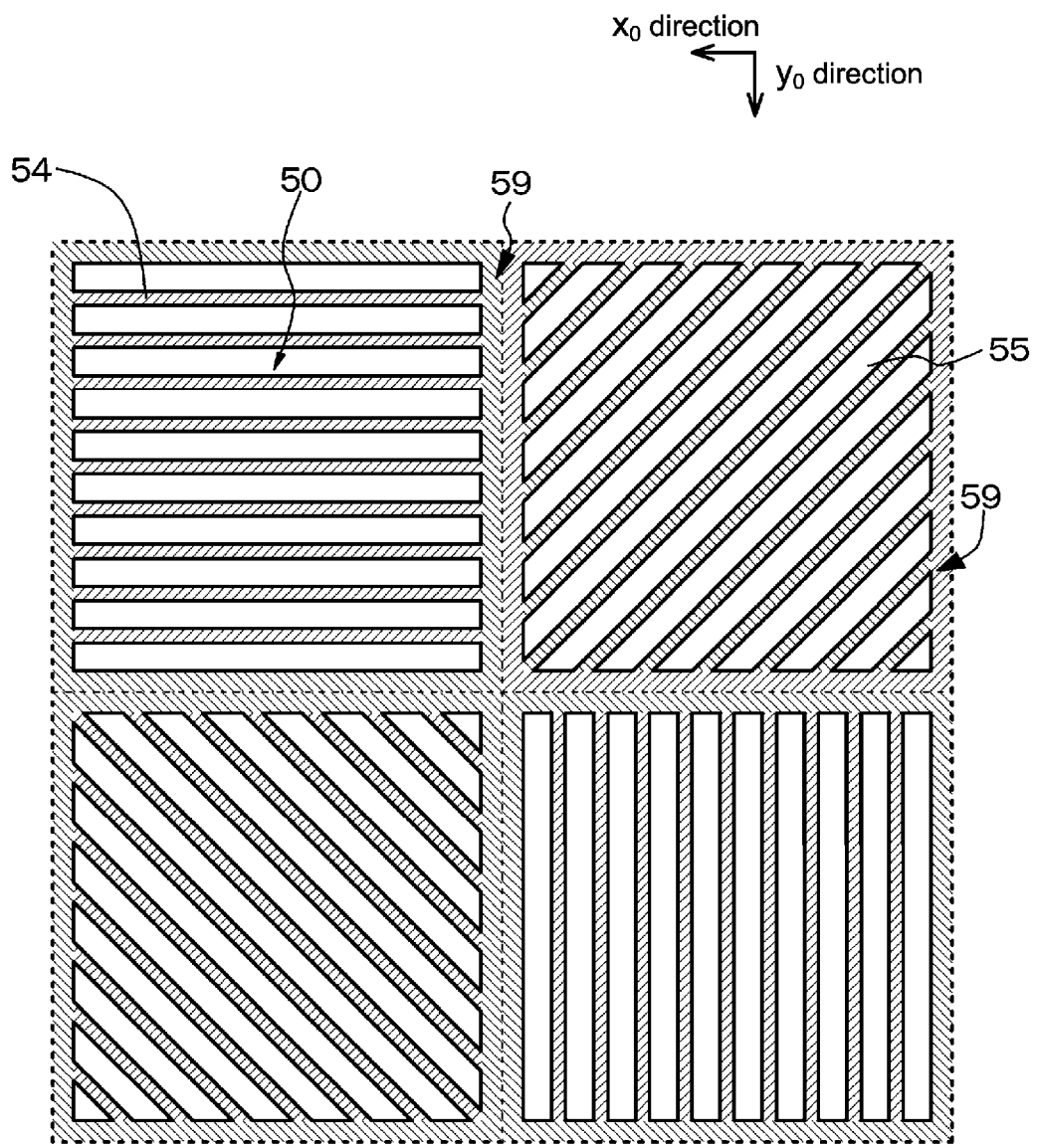
FIG. 16 is a schematic partial plan view of the wire grid polarizers in the solid-state imaging apparatus according to Embodiment 1.
Figure 17A:
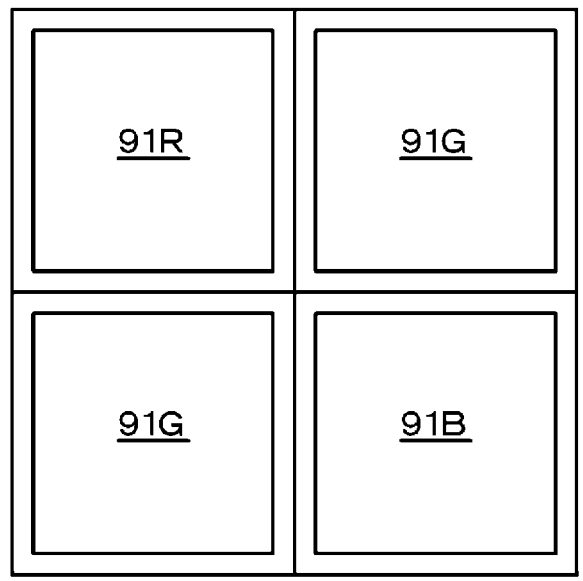
FIG. 17A is a schematic partial plan view of wavelength selecting sections (color filter layers) in the solid-state imaging apparatus according to Embodiment 1.
Figure 17B:
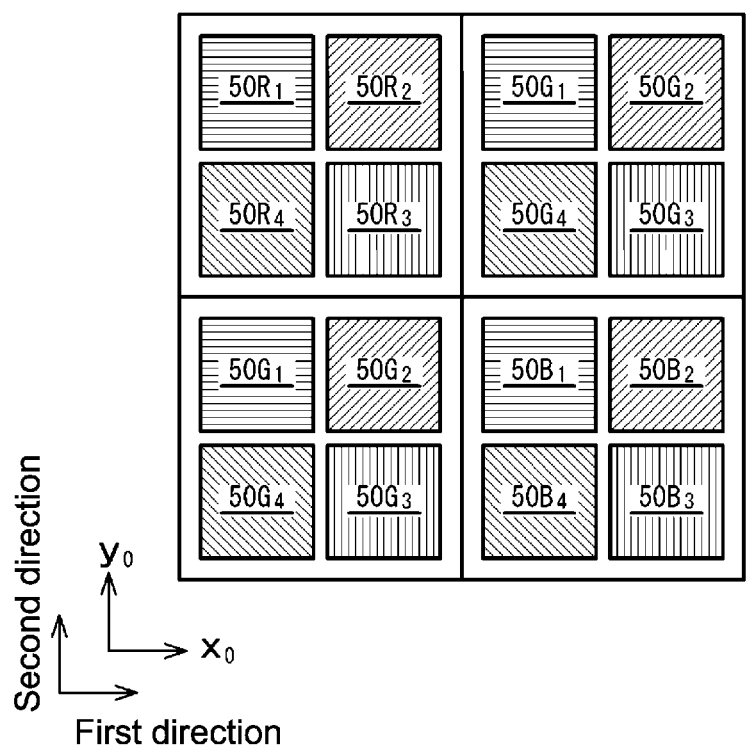
FIG. 17B is a schematic partial plan view of the wire grid polarizers in the solid-state imaging apparatus according to Embodiment 1.
Figure 18:
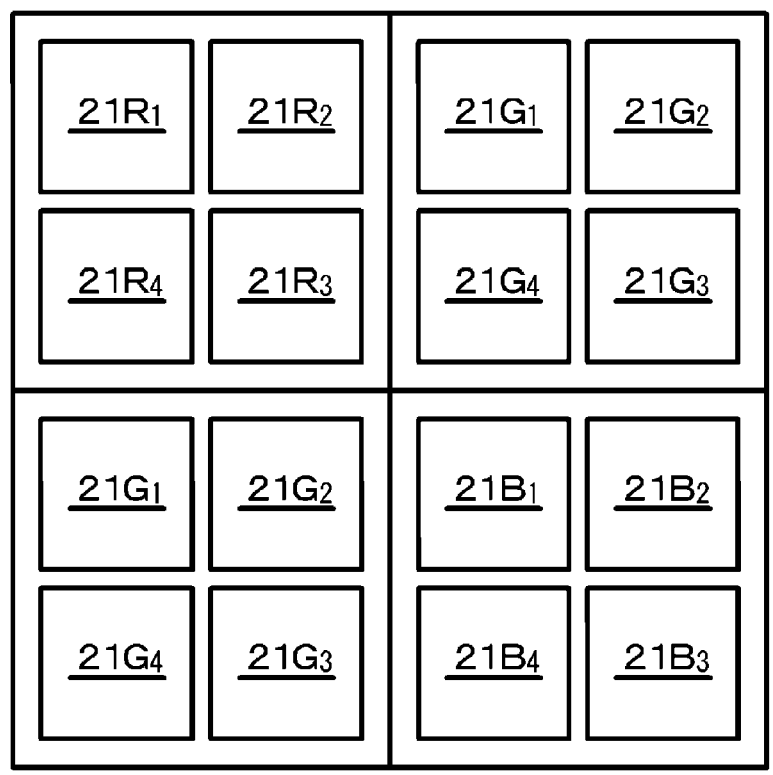
FIG. 18 is a schematic partial plan view of the photoelectric conversion devices in the solid-state imaging apparatus according to Embodiment 1.

Embodiment 1 relates to a solid-state imaging apparatus according to the first embodiment of the present disclosure. FIG. 1 is a partial cross-sectional view of a solid-state imaging apparatus according to Embodiment 1, and FIG. 10 is a conceptual diagram of the solid-state imaging apparatus according to Embodiment 1. Further, FIG. 11 is a schematic view of an arrangement of a valid pixel region, an optical black region, and a peripheral region in the solid-state imaging apparatus according to Embodiment 1. FIG. 12 is an equivalent circuit diagram of a photoelectric conversion device in the solid-state imaging apparatus according to Embodiment 1. Still further, FIG. 13 is a schematic perspective view of a wire grid polarizer for the photoelectric conversion device in the solid-state imaging apparatus according to Embodiment 1. FIG. 14A is a schematic partial end view of the wire grid polarizer in the solid-state imaging apparatus according to Embodiment 1. FIG. 16 is a schematic partial plan view of the wire grid polarizers in the solid-state imaging apparatus according to Embodiment 1. FIG. 17A is a schematic partial plan view of wavelength selecting sections (color filter layers) in the solid-state imaging apparatus according to Embodiment 1, and FIG. 17B is a schematic partial plan view of the wire grid polarizers in the solid-state imaging apparatus according to Embodiment 1. FIG. 18 is a schematic partial plan view of the photoelectric conversion devices in the solid-state imaging apparatus according to Embodiment 1.

A solid-state imaging apparatus 10 according to Embodiment 1 includes a photo-electric conversion device group formed in a semiconductor substrate 31 and including photoelectric conversion devices (photoelectric conversion regions) 21 and 21' arrayed in two-dimensional matrix in a valid pixel region (or effective region) 11, and wire grid polarizers 50 and 50' formed (e.g., in a polarization layer) above the semi-conductor substrate 31 at positions corresponding to the photoelectric conversion devices 21 and 21' on a light incidence side of the photoelectric conversion devices 21 and 21'. Further, a conductor topmost layer 70 is arranged in a peripheral region 13 located on an outer side of the valid pixel region 11. As shown, the peripheral region 13 is outside the valid pixel region 11.

When a surface on which the wire grid polarizers 50 and 51' are formed is referred to as a first surface 30A, and when a surface on which the conductor topmost layer 70 is formed is referred to as a second surface 30B, the first surface 30A is located above the second surface 30B, and the wire grid polarizers 50 and 50' are connected to the conductor topmost layer 70 through intermediation of a wire-grid-polarizer extended portion 60.

Further, an optical black (OPB) region 12 is arranged between the valid pixel region 11 and the peripheral region 13. The wire grid polarizers 50 and 50' are formed in both the valid pixel region 11 and the optical black region 12. Still further, as illustrated in the schematic partial plan view of FIG. 16, frame portions 59 configured to surround the wire grid polarizers 50 and 50' are arranged, and the frame portions 59 and line portions 54 (described below) of the wire grid polarizers 50 and 50' are coupled to each other. The frame portions 59 each have the same structure as that of the line portions 54 of the wire grid polarizers 50 and 50', that is, are each formed of a second laminated body, and function as a light blocking portion. As shown, the pixel region 11 does not include the OPB region 12 or the peripheral region 13.

In this configuration, a predetermined potential is applied to the conductor topmost layer 70. Further, as described below, the wire-grid-polarizer extended portion 60 has a structure that does not allow light to be transmitted therethrough.

In addition, on the semiconductor substrate 31, there are formed memory units $TR_{mem}$ connected to the photoelectric conversion devices 21 and 21' and configured to temporarily store charges that are generated in the photoelectric conversion devices 21 and 21'.

In the solid-state imaging apparatus according to Embodiment 1, the photoelectric conversion devices 21 and 21', which have well-known configurations and structures, are formed by well-known methods in the semiconductor substrate 31 made of silicon.

The memory units $TR_{mem}$ each include the photoelectric conversion devices 21 and 21', a gate portion 22, a channel-formation region, and a high-concentration impurity region 23. The gate portion 22 is connected to a memory selection line MEM. Further, the high-concentration impurity region 23 is formed in the semiconductor substrate 31 by well-known methods so as to be spaced away from the photoelectric conversion devices 21 and 21'. A light blocking film 24 is formed over the high-concentration impurity region 23. In other words, the high-concentration impurity region 23 is covered with the light blocking film 24. With this, light is blocked from entering the high-concentration impurity region 23. When the memory units $TR_{mem}$ configured to temporarily store the charges are arranged, what is called a global shutter function can be easily exerted. As examples of materials for the light blocking film 24, there may be mentioned chromium (Cr), copper (Cu), aluminum (Al), tungsten (W), and light blocking resins (such as a polyimide resin).

A transfer transistor $TR_{trs}$ which is shown only in FIG. 12, includes a gate portion connected to a transfer gate line TG, a channel-formation region, and source/drain regions, one of which is connected to the high-concentration impurity region 23 (or sharing a region with the high-concentration impurity region 23), and another one of which serves as a floating diffusion layer FD.

A reset transistor $TR_{rst}$, which is shown only in FIG. 12, includes a gate portion, a channel-formation region, and source/drain regions. The gate portion of the reset transistor $TR_{rst}$ is connected to a reset line RST. One of the source/drain regions of the reset transistor $TR_{rst}$ is connected to a power supply $V_{DD}$, and another one of the source/drain regions thereof doubles as the floating diffusion layer FD.

An amplification transistor $TR_{amp}$, which is shown only in FIG. 12, includes a gate portion, a channel-formation region, and source/drain regions. The gate portion is connected to the other one of the source/drain regions of the reset transistor $TR_{rst}$ (floating diffusion layer FD) through intermediation of a wiring layer. Further, one of the source/drain regions of the amplification transistor $TR_{amp}$ is connected to the power supply $V_{DD}$.

A selection transistor $TR_{sel}$, which is shown only in FIG. 12, includes a gate portion, a channel-formation region, and source/drain regions. The gate portion is connected to a selection line SEL. Further, one of the source/drain regions of the selection transistor $TR_{sel}$, shares a region with another one of the source/drain regions of the amplification transistor $TR_{amp}$, and another one of the source/drain regions of the selection transistor $TR_{sel}$ is connected to a signal line (data output line) VSL (117).

The photoelectric conversion device 21 and 21' is connected also to one of source/drain regions of an accumulated-charge discharge control transistor $TR_{ABG}$. A gate portion of the accumulated-charge discharge control transistor $TR_{ABG}$ is connected to an accumulated-charge discharge control transistor line ABG, and another one of source/drain regions of the accumulated-charge discharge control transistor $TR_{ABG}$ is connected to the power supply $V_{DD}$.

A series of operations of the photoelectric conversion device 21 and 21', such as charge accumulation, a reset operation, and charge transfer, is the same as a series of operations of related-art photoelectric conversion devices, such as charge accumulation, a reset operation, and charge transfer, and hence are not described in detail.

The photoelectric conversion devices 21 and 21', the memory units $TR_{mem}$, the transfer transistors $TR_{trs}$, the reset transistors $TR_{rst}$, the amplification transistors $TR_{amp}$, the selection transistors $TR_{sel}$, and the accumulated-charge discharge control transistors $TR_{ABG}$ are covered with a first interlayer-insulating layer $32_1$. A first one of wiring layers 37 and a first one of contact pad portions 39 are formed on the first interlayer-insulating layer $32_1$. The first one of the contact pad portions 39 is connected through a zeroth one of contact holes 38 to a wiring portion 36 formed in the semiconductor substrate 31.

In the peripheral region 13, on the second surface 30B on which the conductor topmost layer 70 is formed, a pad portion 71 is formed away from the conductor topmost layer 70. The conductor topmost layer 70 and the pad portion 71 have the same structure, and can be formed at once with each other. In addition, fourth ones of the contact pad portions 39 and 39' can be formed at once with each other in a fifth interlayer-insulating layer $32_5$. Thus, the number of steps can be reduced.

The first interlayer-insulating layer $32_1$, the first one of the wiring layers 37, the first one of the contact pad portions 39, and a first one of the contact pad portions 39' are covered with a second interlayer-insulating layer $32_2$. A second one of the wiring layers 37 and second ones of the contact pad portions 39 and 39' are formed on the second interlayer-insulating layer $32_2$. The second ones of the contact pad portions 39 and 39' are connected through first ones of the contact holes 38 and 38' to the first ones of the contact pad portions 39 and 39' formed on the first interlayer-insulating layer $32_1$. Here, it should be understood that contact holes 38 and 38' are electrically connected to one another. For example, in a plan view, the material that includes contact holes 38 and 38' in layer $32_5$ may appear as a closed loop, U-shaped structure, or the like.

The second interlayer-insulating layer $32_2$, the second one of the wiring layers 37, and the second ones of the contact pad portions 39 and 39' are covered with a third interlayer-insulating layer $32_3$. A third one of the wiring layers 37, and third ones of the contact pad portions 39 and 39' are formed on the third interlayer-insulating layer $32_3$. The third ones of the contact pad portions 39 and 39' are connected through second ones of the contact holes 38 and 38' to the second ones of the contact pad portions 39 and 39' formed on the second interlayer-insulating layer $32_2$.

The third interlayer-insulating layer $32_3$, the third one of the wiring layers 37, and the third ones of the contact pad portions 39 and 39' are covered with a fourth interlayer-insulating layer $32_4$. A fourth one of the wiring layers 37, and the fourth ones of the contact pad portions 39 and 39' are formed on the fourth interlayer-insulating layer $32_4$. The fourth ones of the contact pad portions 39 and 39' are connected through third ones of the contact holes 38 and 38' to the third ones of the contact pad portions 39 and 39' formed on the third interlayer-insulating layer $32_3$.

The fourth interlayer-insulating layer $32_4$, the fourth one of the wiring layers 37, and the fourth ones of the contact pad portions 39 and 39' are covered with the fifth interlayer-insulating layer $32_5$. In the figures, the first interlayer-insulating layer $32_1$, the second interlayer-insulating layer $32_2$, the third interlayer-insulating layer $32_3$, the fourth interlayer-insulating layer $32_4$, and the fifth interlayer-insulating layer $32_5$ are collectively denoted by the reference numeral "32," and these interlayer insulating layers are not indicated by hatching. The number of the wiring layers is not limited to "four" in the illustration, and may be arbitrarily changed.

A top surface of the fifth interlayer-insulating layer $32_5$ corresponds to the second surface 30B. The conductor topmost layer 70 and the pad portion 71 are formed on the top surface (second surface 30B) of the fifth interlayer-insulating layer $32_5$.

The fifth interlayer-insulating layer $32_5$, the conductor topmost layer 70, and the pad portion 71 are covered with a base insulating layer 33. A top surface of the base insulating layer 33 corresponds to the first surface 30A. The wire grid polarizers 50 and 50' and the wire-grid-polarizer extended portion 60 are formed on the base insulating layer 33. The wire grid polarizers 50 and 50' are connected to the conductor topmost layer 70 through intermediation of the wire-grid-polarizer extended portion 60 and a contact hole portion 61 that is formed through the base insulating layer 33. The conductor topmost layer 70 is connected to the wiring portion 36 through inter-mediation of the contact pad portions 39, and, for example, grounded. The pad portion 71 is similarly connected to a wiring portion (not shown) formed above the silicon semiconductor substrate 31 through the contact holes 38' and through intermediation of the contact pad portions 39'. The insulating layers may be collectively referred to as one or more wiring layers 32.

The wire grid polarizers 50 and 50' and the wire-grid-polarizer extended portion 60 are covered with a first planarizing film (or polarization layer) 34. Sub-on-chip microlenses (OPA) 82 are arranged on the first planarizing film 34 in a region located above the photoelectric conversion devices 21 and 21'. The first planarizing film 34 and the sub-on-chip microlenses (OPA) 82 are covered with a second planarizing film. Wavelength selecting sections (specifically, well-known color filter layers) 91 are formed on the second planarizing film in the region located above the photoelectric conversion devices 21. The second planarizing film and the wavelength selecting sections 91 are covered with a third planarizing film. Main on-chip microlenses 81 are arranged on the third planarizing film in the region located above the photoelectric conversion devices 21 and 21'. In the figures, the second planarizing film and the third planarizing film are collectively denoted by the reference numeral "35."

An opening portion 72 is formed on the pad portion 71 through the first planarizing film 34 and the second planarizing film and third planarizing film 35. The pad portion 71 is connected to an external circuit or an external line through the opening portion 72 by, for example, a wire bonding method.

The wire grid polarizers 50 and 50' each have a line-and-space structure. The line portions 54 of each of the wire grid polarizers 50 and 50' are each formed of a laminated body (first laminated body) including, from an opposite side with respect to the light incidence side (in Embodiment 1, from side on which photoelectric conversion devices are arrayed), a light reflecting layer 51 made of a first conductive material (specifically, aluminum (Al)), an insulating film 52 made of $SiO_2$, and a light absorbing layer 53 made of a second conductive material (specifically, tungsten (W)). The insulating film 52 is formed all over a top surface of the light reflecting layer 51, and the light absorbing layer 53 is formed all over a top surface of the insulating film 52. Specifically, the aluminum (Al) forming the light reflecting layer 51 has a thickness of 150 nm, the $SiO_2$ forming the insulating film 52 has a thickness of 25 nm or 50 nm, and the tungsten (W) forming the light absorbing layer 53 has a thickness of 25 nm. The light reflecting layer 51 has a function of a polarizer, specifically, filters light that has entered the wire grid polarizer 50 and 50' such that a polarized wave having an electric field component in a direction (first direction) parallel to a direction in which the light reflecting layer 51 extends is attenuated, and that a polarized wave having an electric field component in another direction (second direction) orthogonal to the direction in which the light reflecting layer 51 extends is transmitted therethrough. The first direction corresponds to a light absorption axis of the wire grid polarizer 50 and 50', and the second direction corresponds to a light transmission axis of the wire grid polarizer 50 and 50'. Although not shown, a base film formed of a laminated body of Ti, TiN, or Ti/TiN is formed between the base insulating layer 33 and the light reflecting layer 51.

In the solid-state imaging apparatus according to Embodiment 1, the light reflecting layers 51, the insulating films 52, and the light absorbing layers 53 for the photoelectric conversion devices 21 and 21' are common to each other. The wire-grid-polarizer extended portion 60 and the frame portions 59 are each formed of a laminated body (second laminated body) including the light reflecting layer 51, the insulating film 52, and the light absorbing layer 53 and not including space portions 55.

Figure 52A:
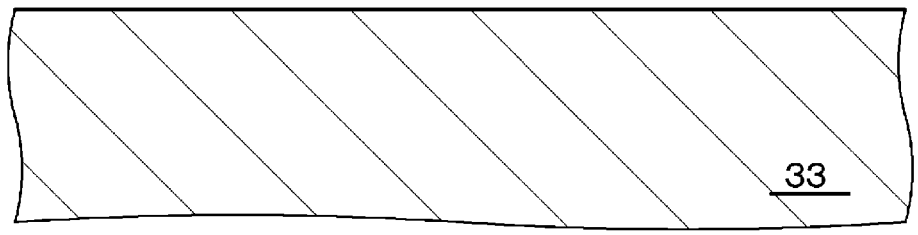
FIG. 52A, FIG. 52B, FIG. 52C, and FIG. 52D are schematic partial cross-sectional views of a base insulating layer and other layers, for illustrating a manufacturing method for the wire grid polarizer for the photoelectric conversion device in the solid-state imaging apparatus according to Embodiment 1.
Figure 52B:
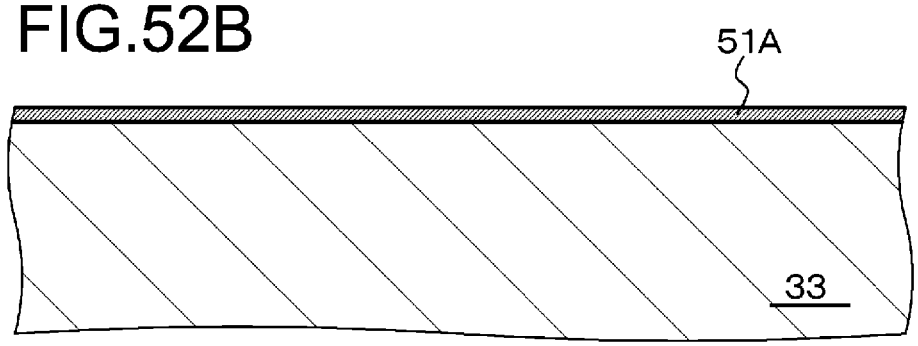
Figure 52C:
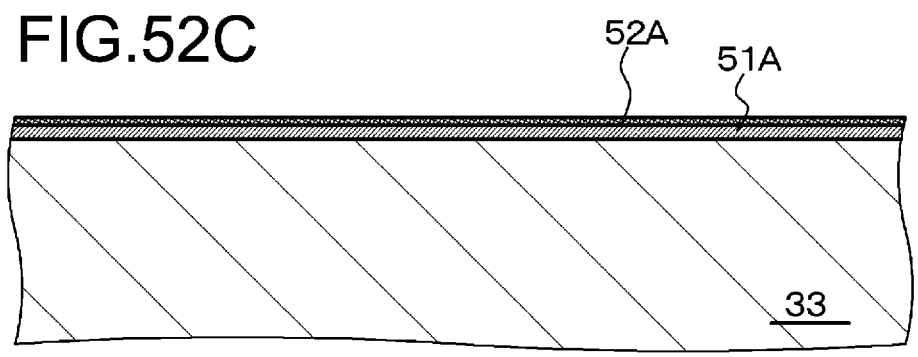
Figure 52D:
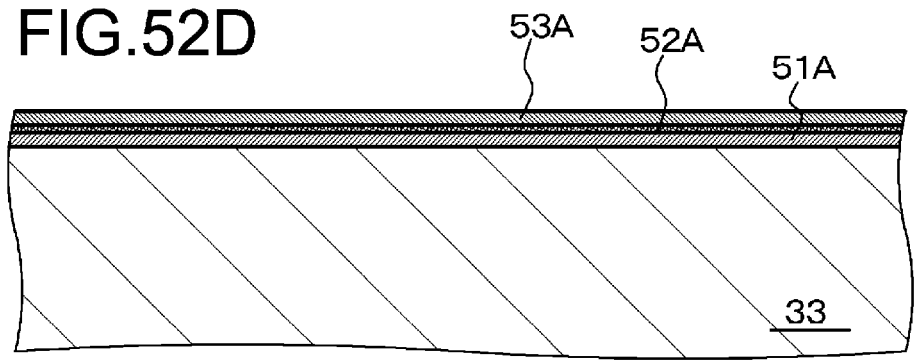

The wire grid polarizers 50 and 50' can be prepared by the following method. Specifically, first, the contact hole portion 61 is formed through the base insulating layer 33 in advance. Then, on the base insulating layer 33, the base film formed of the laminated body of Ti, TiN, or Ti/TiN (not shown), and a light-reflecting-layer forming layer 51A made of the first conductive material (specifically, aluminum) are formed by a vacuum deposition method (refer to FIG. 52A and FIG. 52B). Next, an insulating-film forming layer 52A is formed over the light-reflecting-layer forming layer 51A, and a light-absorbing-layer forming layer 53A made of the second conductive material is formed over the insulating-film forming layer 52A. Specifically, the insulating-film forming layer 52A made of $SiO_2$ is formed over the light-reflecting-layer forming layer 51A by a CVD method (refer to FIG. 52C). Then, the light-absorbing-layer forming layer 53A made of tungsten (W) is formed over the insulating-film forming layer 52A by sputtering. In this way, the structure illustrated in FIG. 52D can be obtained.

After that, by a lithography technique and a dry etching technique, the light-absorbing-layer forming layer 53A, the insulating-film forming layer 52A, the light-reflecting-layer forming layer 51A, and the base film are patterned. With this, the wire grid polarizers 50 and 50' each having the line-and-space structure in which the plurality of line portions 54 (laminated bodies) each including the light reflecting layer 51, the insulating film 52, and the light absorbing layer 53 each having a belt-like shape are juxtaposed away from each other can be obtained. After that, it is only necessary to form the first planarizing film 34 by the CVD method so as to cover the wire grid polarizers 50 and 50'. The wire grid polarizers 50 and 50' are surrounded by the frame portions 59 each including the light reflecting layer 51, the insulating film 52, and the light absorbing layer 53 (refer to FIG. 16). The wire-grid-polarizer extended portion 60 is formed in the optical black (OPB) region 12.

The photoelectric conversion device group includes a plurality of photoelectric conversion device units. The plurality of photoelectric conversion device units each including the plurality of photoelectric conversion devices in a Bayer array. FIG. 17A is a schematic partial plan view of the wavelength selecting sections (color filter layers) in the solid-state imaging apparatus according to Embodiment 1, and FIG. 17B is a schematic partial plan view of the wire grid polarizers in the solid-state imaging apparatus according to Embodiment 1. FIG. 18 is a schematic partial plan view of the photoelectric conversion devices. As illustrated in these figures, there are four photoelectric conversion device units. A first photoelectric-conversion-device unit includes four red-light photoelectric conversion devices 21R (21R$_1$, 21R$_2$, 21R$_3$, and 21R$_4$) configured to absorb red light (light having a wavelength of from 620 nm to 750 nm), a wavelength selecting section (color filter layer) 91R for these photoelectric conversion devices, and wire grid polarizers 50R (50R$_1$, 50R$_2$, 50R$_3$, and 50R$_4$). These wire grid polarizers 50R$_1$, 50R$_2$, 50R$_3$, and 50R$_4$ respectively have polarization orientations at angles of $\alpha$ degrees, ($\alpha$+45) degrees, ($\alpha$+90) degrees, and ($\alpha$+135) degrees, in each of which light is transmitted. A second photoelectric-conversion-device unit and a fourth photoelectric-conversion-device unit each include four green-light photoelectric conversion devices 21G (21G$_1$, 21G$_2$, 21G$_3$, and 21G$_4$) configured to absorb green light (light having a wavelength of from 495 nm to 570 nm), a wavelength selecting section (color filter layer) 91G for these photoelectric conversion devices, and wire grid polarizers 50G (50G$_1$, 50G$_2$, 50G$_3$, and 50G$_4$). These wire grid polarizers 50G$_1$, 50G$_2$, 50G$_3$, and 50G$_4$ respectively have the polarization orientations at the angles of $\alpha$ degrees, ($\alpha$+45) degrees, ($\alpha$+90) degrees, and ($\alpha$+135) degrees, in each of which light is transmitted. A third photoelectric-conversion-device unit includes four blue-light photoelectric conversion devices 21B (21B$_1$, 21B$_2$, 21B$_3$, and 21B$_4$) configured to absorb blue light (light having a wavelength of from 425 nm to 495 nm), a wavelength selecting section (color filter layer) 91B for these photoelectric conversion devices, and wire grid polarizers SOB (50B$_1$, 50B$_2$, 50B$_3$, and 50B$_4$). These wire grid polarizers 50B$_1$, 50B$_2$, 50B$_3$, and 50B$_4$ respectively have the polarization orientations at the angles of $\alpha$ degrees, ($\alpha$+45) degrees, ($\alpha$+90) degrees, and ($\alpha$+135) degrees, in each of which light is transmitted. As an example of a value of "$\alpha$," the angle of "0 degrees" that is formed between the $x_0$ direction and the $y_0$ direction may be mentioned. The wire grid polarizers 50 are indicated by hatching, and directions orthogonal to directions in which the hatching extends correspond to the orientations in which the wire grid polarizers 50 allow the light to be transmitted therethrough.

The solid-state imaging apparatus according to Embodiment 1 is used, for example, in a digital still camera, a video camera, a camcorder, a surveillance camera, a vehicle-mounted camera (in-vehicle camera), a smartphone camera, a user interface camera for video games, and a biometric authentication camera.

FIG. 10 is a conceptual diagram of the solid-state imaging apparatus according to Embodiment 1. A solid-state imaging apparatus 100 according to Embodiment 1 includes an imaging region (valid pixel region) 111 including photoelectric conversion devices 101 arrayed in two-dimensional matrix, a vertical drive circuit 112 that is arranged in the peripheral region 13 and serves as a drive circuit therefor (peripheral circuit), column-signal processing circuits 113, a horizontal drive circuit 114, an output circuit 115, and a drive control circuit 116. As a matter of course, as these circuits, there may be used well-known circuits, or other circuit configurations (such as various circuits used in CCD imaging apparatuses and CMOS imaging apparatuses in related-art). In FIG. 10, the reference numerals "101" for the photoelectric conversion devices 101 are given only in one row.

The drive control circuit 116 is configured to generate clock signals and control signals as references for operations of the vertical drive circuit 112, the column-signal processing circuits 113, and the horizontal drive circuit 114 in response to vertical synchronizing signals, horizontal synchronizing signals, and master clocks. Then, the generated clock signals and the generated control signals are input to the vertical drive circuit 112, the column-signal processing circuits 113, and the horizontal drive circuit 114.

The vertical drive circuit 112 is formed, for example, of a shift register, and is configured to vertically and sequentially select and scan the photoelectric conversion devices 101 in the imaging region 111 on a row-by-row basis. In accordance with intensities of light beams that are received in the photoelectric conversion devices 101, currents (signals) are generated. Pixel signals (image signals) are generated in response to these currents (signals), and transmitted to the column-signal processing circuits 113 via the signal lines (data output lines) 117 or VSLs.

The column-signal processing circuits 113 are arranged, for example, correspondingly to columns of the photoelectric conversion devices 101, and are configured to execute, in response to signals from black reference pixels (although not shown, formed around the valid pixel region), signal processes such as noise removal and signal amplification on the image signals output from the photoelectric conversion devices 101 in one row. Horizontal selection switches (not shown) are connected between output stages of the column-signal processing circuits 113 and a horizontal signal line 118.

The horizontal drive circuit 114 is formed, for example, of a shift register, and is configured to sequentially output horizontal scanning pulses so as to sequentially select the column-signal processing circuits 113. With this, signals are output from the column-signal processing circuits 113 to the horizontal signal line 118.

The output circuit 115 is configured to execute signal processes on the signals that are sequentially supplied from the column-signal processing circuits 113 via the horizontal signal line 118, and to output these signals.

In the solid-state imaging apparatus according to Embodiment 1, the wire grid polarizers are connected to the conductor topmost layer through intermediation of the wire-grid-polarizer extended portion, and the conductor topmost layer is connected to the wiring portion formed in the semiconductor substrate. With this, the wire grid polarizers can be reliably prevented (or alternatively, reduced) from being charged at the time forming the wire grid polarizers, and hence problems such as damage to the wire grid polarizers and the photoelectric conversion devices (imaging devices) can be reliably avoided.

In addition, in the solid-state imaging apparatus according to Embodiment 1 or in a solid-state imaging apparatus according to Embodiment 8 described below, the wire grid polarizers are integrally formed in an on-chip fashion. Thus, a thickness of the part located above the photoelectric conversion devices can be reduced. As a result, entry of polarized light into adjacent ones of the photoelectric conversion devices (polarization crosstalk) can be minimized (or alternatively, reduced). Further, the wire grid polarizers are light-absorbing-type wire grid polarizers each including the light absorbing layer, and hence are low in reflectance. Thus, influence on videos, such as stray light and flare, can be alleviated. Further, increase in load on wiring of the peripheral circuit in the peripheral region can be suppressed.

In addition, due to the wire grid polarizers, the solid-state imaging apparatus according to Embodiment 1 or the solid-state imaging apparatus according to Embodiment 8 described below is capable of not only performing normal imaging but also acquiring polarization information at once therewith. In other words, a polarization separating function to spatially separate the polarization information of incident light can be provided to the solid-state imaging apparatus. Specifically, from each of the photoelectric conversion devices (imaging devices), a light intensity, a polarized component intensity, and a polarization direction can be obtained. Thus, for example, after imaging, image data can be processed based on these polarization information items. Specifically, desired processes can be executed on parts of a captured image, which correspond, for example, to the sky, window glass, and a water surface. With this, the polarized components can be emphasized or attenuated, or the polarized components and unpolarized components can be separated from each other. In this way, contrast of the image can be improved, or unnecessary information items can be deleted. More specifically, such processes can be executed, for example, by customizing an imaging mode at the time of imaging with the solid-state imaging apparatus. Further, reflection in window glass can be eliminated only with the solid-state imaging apparatus itself, and boundaries (contours) of a plurality of objects can be clarified by adding the polarization information items to image information. Still further, conditions of road surfaces, and obstacles on the road surfaces can be detected. In addition, the solid-state imaging apparatus according to Embodiment 1 or the solid-state imaging apparatus according to Embodiment 8 described below is applicable to various other fields such as imaging of a pattern that incorporates birefringence of an object, measurement of retardation distribution, acquisition of an image under a polarized-light microscope, detection of a surface shape of an object, measurement of a surface texture of an object, detection of a moving body (such as a vehicle), and meteorological observation such as measurement of cloud distribution. Further, the solid-state imaging apparatus according to Embodiment 1 or the solid-state imaging apparatus according to Embodiment 8 described below may be capable of capturing three-dimensional images.

Figure 14B:
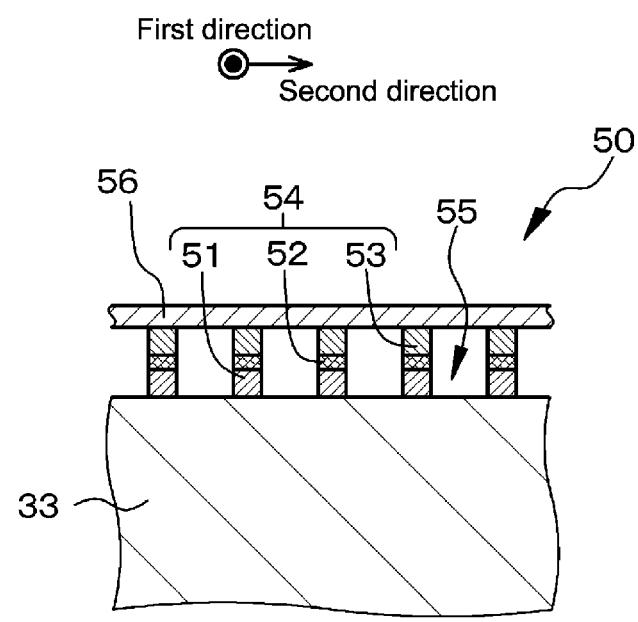
FIG. 14B is a schematic partial end view of a modification of the wire grid polarizer in the solid-state imaging apparatus according to Embodiment 1.

As a modification of the wire grid polarizer 50 and 50', there may be mentioned a configuration in which, as illustrated in the schematic partial end view of FIG. 14B, a protective film 56 is formed over the wire grid polarizer 50 and 50', and the space portions 55 of the wire grid polarizer 50 and 50' are empty. In other words, some or all of the space portions 55 are filled with air. Specifically, in Embodiment 1, all of the space portions 55 are filled with air.

Figure 15A:
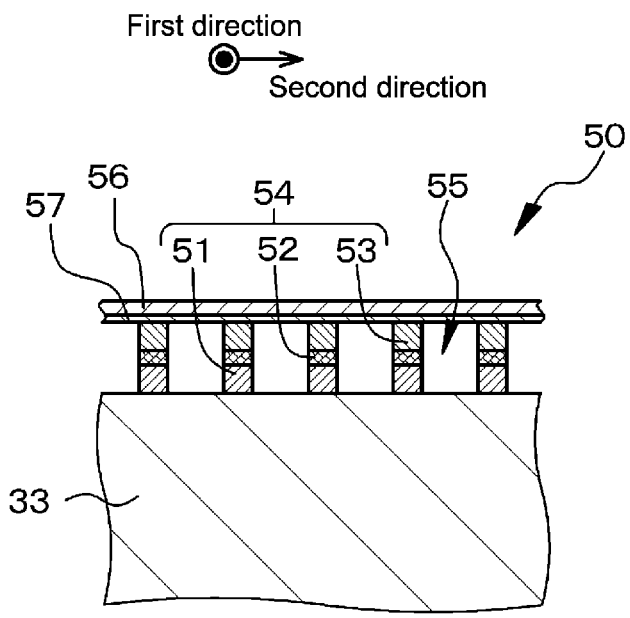
FIG. 15A and FIG. 15B are schematic partial end views of other modifications of the wire grid polarizer in the solid-state imaging apparatus according to Embodiment 1.

Alternatively, there may be employed a configuration in which, as illustrated in the schematic partial end view of FIG. 15A, a second protective film 57 is formed between the wire grid polarizer 50 and 50' and the protective film 56. In this configuration, a relationship $$n_1 > n_2$$

is satisfied, where $n_1$ is a refractive index of a material of the protective film 56, and $n_2$ is a refractive index of a material of the second protective film 57. In this case, for example, the protective film 56 is made of SiN ($n_1$=2.0), and the second protective film 57 is made of SiO$_2$ ($n_2$=1.46). In the illustration, a bottom surface of the second protective film 57 (surface facing the base insulating layer 33) is flat. However, the bottom surface of the second protective film 57 may be protruded toward the space portions 55. Alternatively, the bottom surface of the second protective film 57 may be recessed, specifically, recessed into a wedge shape toward the protective film 56. Such structures are formed as follows. First, the wire grid polarizer 50 and 50' having the line-and-space structure is formed, and then the second protective film 57 made of SiO$_2$ is formed by the CVD method to have an average thickness of from 0.01 μm to 10 μm all over the wire grid polarizer 50 and 50'. Tops of the space portions 55, which are located between ones of the line portions 54 and other ones of the line portions 54, are closed by the second protective film 57. Next, the protective film 56 made of SiN is formed by the CVD method to have an average thickness of from 0.1 μm to 10 μm over the second protective film 57. When the protective film 56 is made of SiN, highly reliable photoelectric conversion devices can be obtained. Note that, SiN has a relatively high relative dielectric constant, and hence, the second protective film 57 made of SiO$_2$ is formed to reduce the average refractive index $n_{ave}$.

When the space portions of the wire grid polarizer are empty (specifically, filled with air) in this way, the value of the average refractive index $n_{ave}$ can be reduced. As a result, the transmittance and the extinction ratio of the wire grid polarizer can be increased. Further, the value of the formation pitch $P_0$ can be increased, and hence a manufacturing yield of the wire grid polarizer can be increased. In addition, when the protective films are formed over the wire grid polarizer, highly reliable photoelectric conversion devices and highly reliable solid-state imaging apparatuses can be provided. Further, when the frame portions and the line portions of the wire grid polarizer are coupled to each other, and when the frame portions are formed to have the same structure as that of the line portions, homogeneous and uniform wire grid polarizers can be stably formed. Therefore, it is possible to solve problems such as occurrence of peeling at parts of outer peripheral portions of the wire grid polarizer, which correspond to four corners of the photo-electric conversion device, degradation in performance of the wire grid polarizer itself owing to a difference between a structure of the outer peripheral portions of the wire grid polarizer and a structure of a central portion of the wire grid polarizer, and liability that light beams that enter the outer peripheral portions of the wire grid polarizer leak into adjacent ones of the photo-electric conversion devices having different polarization directions. As a result, highly reliable photoelectric conversion devices and highly reliable solid-state imaging apparatuses can be provided.

The wire grid polarizer may have a structure from which the insulating films are omitted, that is, only the light reflecting layer (made, for example, of aluminum) and the light absorbing layer (made, for example, of tungsten) may be laminated from the opposite side with respect to the light incidence side. Alternatively, the wire grid polarizer may be formed of a single conductive light-blocking material layer. As examples of materials for the conductive light-blocking material layer, there may be mentioned conductive materials having low complex refractive indices in a wavelength band to which the photoelectric conversion devices are sensitive, such as aluminum (Al), copper (Cu), gold (Au), silver (Ag), platinum (Pt), tungsten (W), and alloys containing these metals.

Figure 15B:
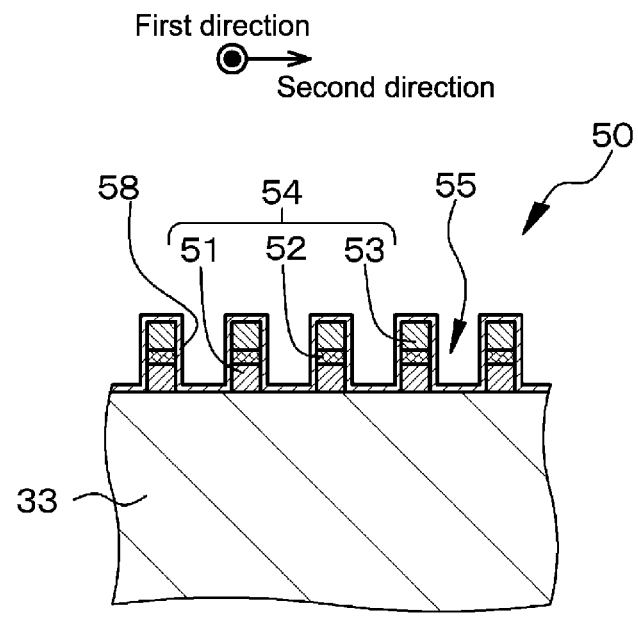

When necessary, as illustrated in the schematic partial end view of the wire grid polarizer of FIG. 15B, a third protective film 58 made, for example, of SiO$_2$ may be formed over side surfaces of the line portions 54, which face the space portions 55. In other words, the space portions 55 are filled with air, and the third protective film 58 is exposed in the space portions 55. The third protective film 58 is formed, for example, by the HDP-CVD method. With this, the third protective film 58 that is formed conformally over the side surfaces of the line portions 54 can be further thinned.

Embodiment 2

Figure 2:
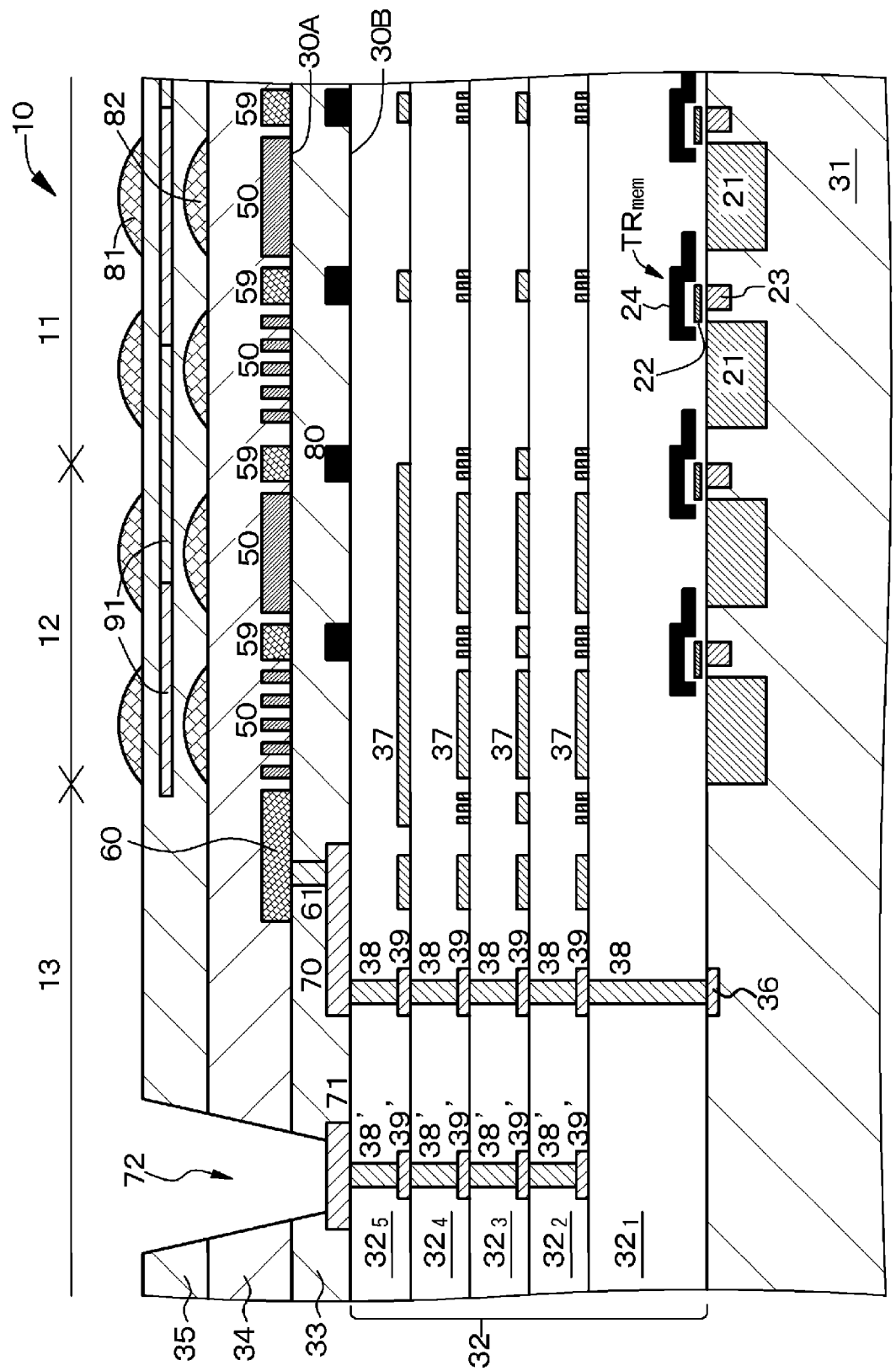
FIG. 2 is a schematic partial cross-sectional view of a solid-state imaging apparatus according to Embodiment 2.

Embodiment 2 is a modification of Embodiment 1. In a solid-state imaging apparatus according to Embodiment 2, as illustrated in the schematic partial cross-sectional view of FIG. 2, light blocking portions 80 are formed above regions between ones of the photoelectric conversion devices 21 and 21' and other ones of the photoelectric conversion devices 21 and 21' in the photoelectric conversion device group, and the light blocking portions 80 are located on the second surface 30B (in second surface 30B). It is appropriate that the light blocking portions 80 be formed, for example, at once with the formation of the conductor topmost layer 70 and the pad portion 71 on the top surface of the fifth interlayer-insulating layer 32$_5$ (second surface 30B). It is appropriate that the light blocking portions 80, each having the same structure and the configuration as those of the conductor topmost layer 70, be formed in a manner of surrounding orthogonal projection images from the photoelectric conversion devices 21 and 21' with respect to the semiconductor substrate 31.

Except these features, the configuration and the structure of the solid-state imaging apparatus according to Embodiment 2 may be the same as the configuration and the structure of the solid-state imaging apparatus according to Embodiment 1, and hence are not described in detail.

Embodiment 3

Figure 3:
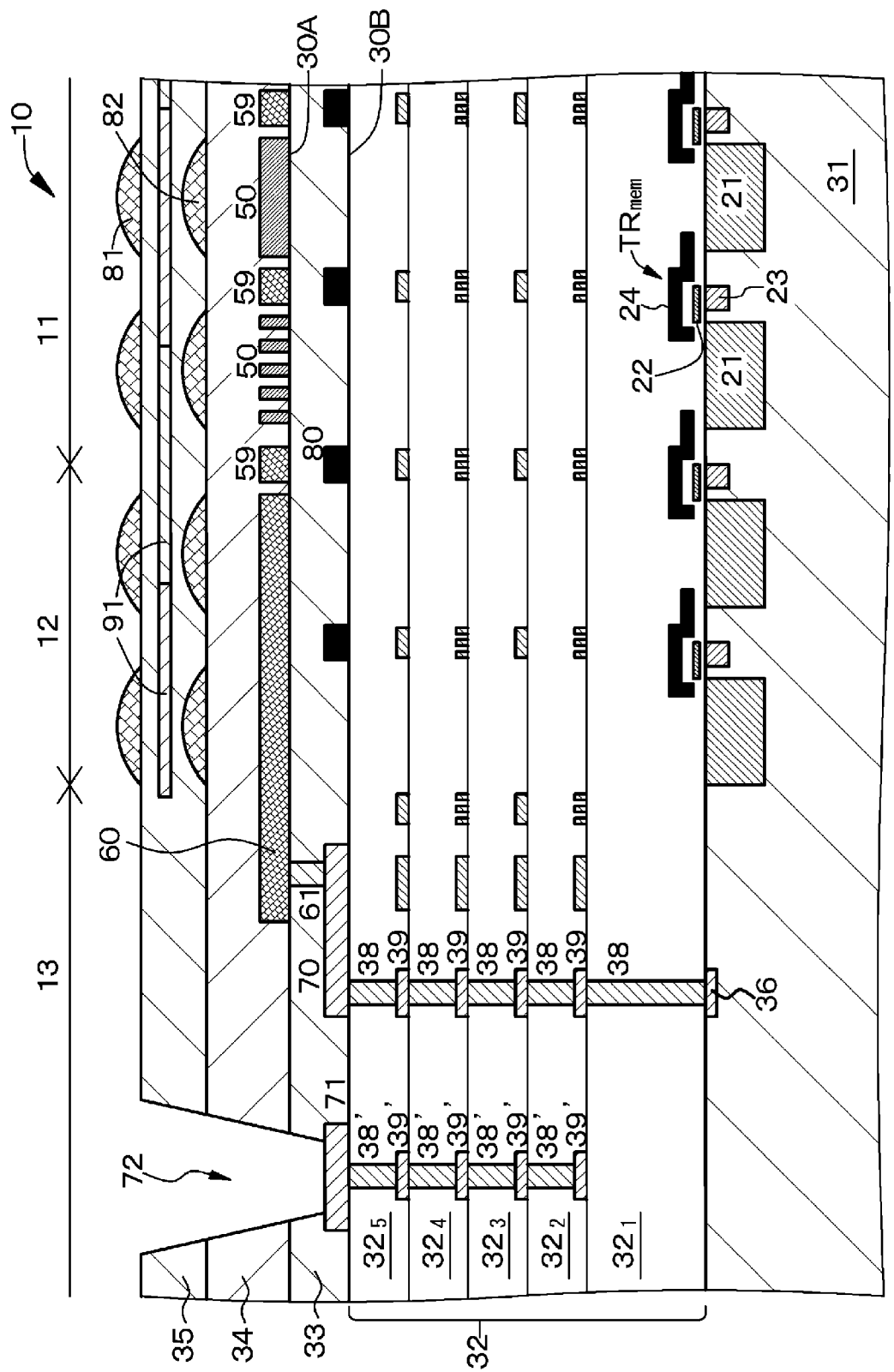
FIG. 3 is a schematic partial cross-sectional view of a solid-state imaging apparatus according to Embodiment 3.

Embodiment 3 is a modification of Embodiment 1 and Embodiment 2. In a solid-state imaging apparatus according to Embodiment 3, as illustrated in the schematic partial cross-sectional view of FIG. 3, the optical black (OPB) region 12 is arranged between the valid pixel region 11 and the peripheral region 13. The wire-grid-polarizer extended portion 60 is formed across a boundary between the optical black region 12 and the peripheral region 13. The optical black region 12 is shielded from light by the wire-grid-polarizer extended portion 60.

Except these features, the configuration and the structure of the solid-state imaging apparatus according to Embodiment 3 may be the same as the configuration and the structure of the solid-state imaging apparatuses according to Embodiment 1 and Embodiment 2, and hence are not described in detail.

Embodiment 4

Figure 4:
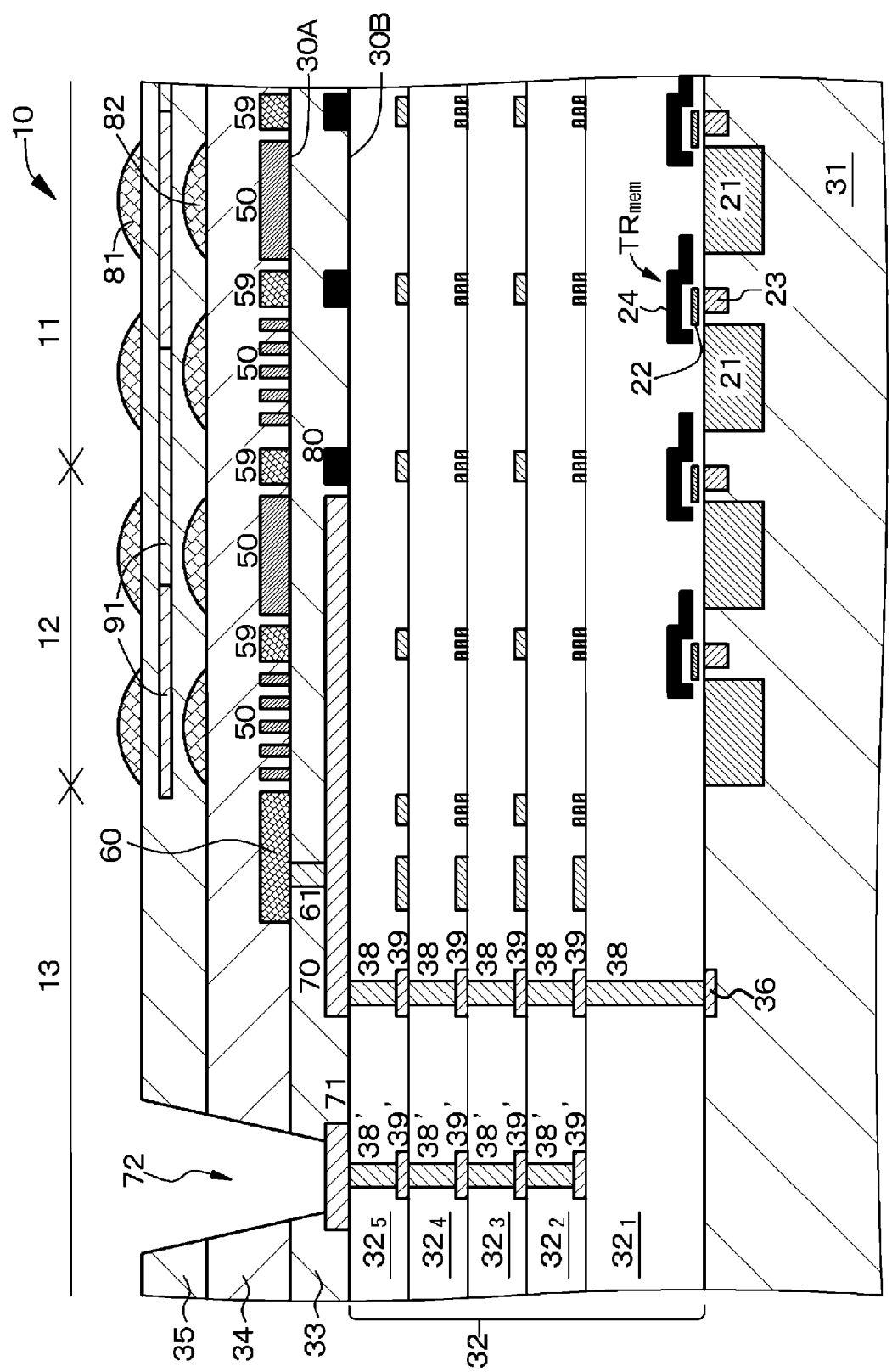
FIG. 4 is a schematic partial cross-sectional view of a solid-state imaging apparatus according to Embodiment 4.

Embodiment 4 is another modification of Embodiment 1 and Embodiment 2. In a solid-state imaging apparatus according to Embodiment 4, as illustrated in the schematic partial cross-sectional view of FIG. 4, the optical black (OPB) region 12 is arranged between the valid pixel region 11 and the peripheral region 13, and the conductor topmost layer 70 is extended into the optical black region 12 so as to shield the optical black region 12 from light.

Except these features, the configuration and the structure of the solid-state imaging apparatus according to Embodiment 4 may be the same as the configuration and the structure of the solid-state imaging apparatuses according to Embodiment 1 and Embodiment 2, and hence are not described in detail.

Embodiment 5

Figure 5:
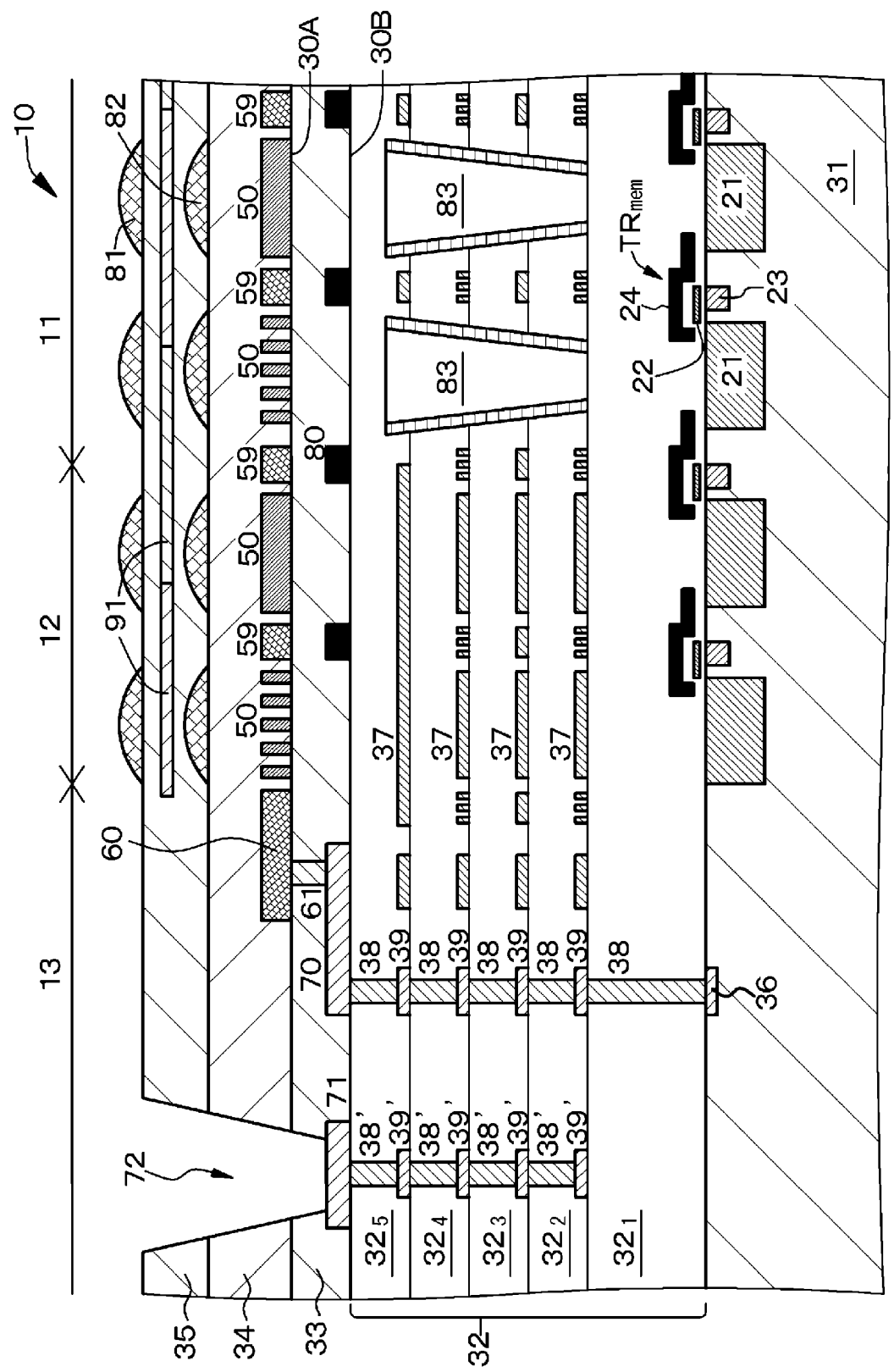
FIG. 5 is a schematic partial cross-sectional view of a solid-state imaging apparatus according to Embodiment 5.

Embodiment 5 is a modification of Embodiment 1 to Embodiment 4. In a solid-state imaging apparatus according to Embodiment 5, as illustrated in the schematic partial cross-sectional view of FIG. 5, waveguide structures 83 are formed between ones of the photoelectric conversion devices 21 in the photoelectric conversion device group and corresponding ones of the wire grid polarizers 50 and 50'. The waveguide structures 83 are each formed of a thin film 84 formed through the interlayer insulating layers 32 covering the photoelectric conversion devices 21 (specifically, through some of the interlayer insulating layers 32) in a region (for example, cylindrical region) located between one of the photoelectric conversion devices 21 and corresponding one of the wire grid polarizers 50, the thin film 84 having a refractive index value larger than a refractive index value of a material for the interlayer insulating layers 32. A light beam that enters from above the one of the photoelectric conversion devices 21 is totally reflected by the thin film 84, and reaches the one of the photoelectric conversion devices 21. The orthogonal projection image from the one of the photoelectric conversion devices 21 with respect to the semiconductor substrate 31 is located within an orthogonal projection image from the thin film 84 of corresponding one of the waveguide structures 83 with respect to the semiconductor substrate 31. In other words, the orthogonal projection image from the one of the photoelectric conversion devices 21 with respect to the semiconductor substrate 31 is surrounded by the orthogonal projection image from the thin film 84 of the corresponding one of the waveguide structures 83 with respect to the substrate.

Except these features, the configuration and the structure of the solid-state imaging apparatus according to Embodiment 5 may be the same as the configuration and the structure of the solid-state imaging apparatuses according to Embodiment 1 to Embodiment 4, and hence are not described in detail.

Embodiment 6

Figure 6:
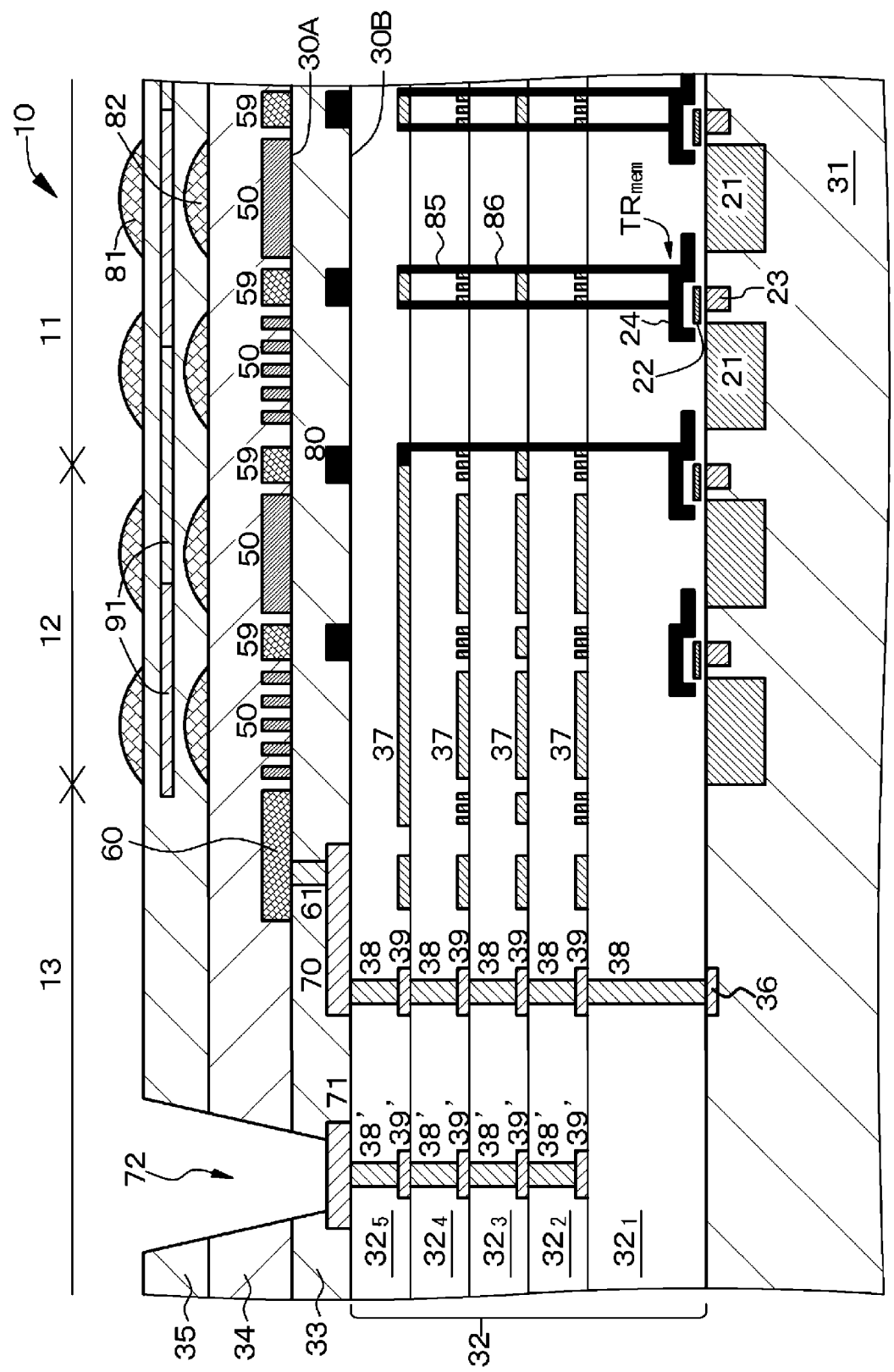
FIG. 6 is a schematic partial cross-sectional view of a solid-state imaging apparatus according to Embodiment 6.

Embodiment 6 is still another modification of Embodiment 1 to Embodiment 4. In a solid-state imaging apparatus according to Embodiment 6, as illustrated in the schematic partial cross-sectional view of FIG. 6, light-collecting tube structures 85 are formed between ones of the photoelectric conversion devices 21 and other ones of the photoelectric conversion devices 21 in the photoelectric conversion device group. The light-collecting tube structures 85 are each formed of light-blocking thin films 86 that are made of a metal material or an alloy material and are formed through the interlayer insulating layers 32 covering the photoelectric conversion devices 21 in a region (for example, cylindrical region) located between one of the photoelectric conversion devices 21 and another one of the photoelectric conversion devices 21. The light beam that enters from above the one of the photoelectric conversion devices 21 is reflected by the thin films 86, and reaches the one of the photoelectric conversion devices 21. In other words, the orthogonal projection image from the one of the photoelectric conversion devices 21 with respect to the semiconductor substrate 31 is located within an orthogonal projection image from the thin films 86 of corresponding ones of the light-collecting tube structures 85 with respect to the semiconductor substrate 31. In still other words, the orthogonal projection image from the one of the photoelectric conversion devices 21 with respect to the semiconductor substrate 31 is surrounded by the orthogonal projection image from the thin films 86 of the corresponding ones of the light-collecting tube structures 85 with respect to the semiconductor substrate 31. The thin films 86 can be formed, for example, by filling annular groove portions, which are formed through the fourth interlayer-insulating layer $32_4$ to the first interlayer-insulating layer $32_1$, with the metal material or the alloy material after forming the fourth interlayer-insulating layer $32_4$.

Except these features, the configuration and the structure of the solid-state imaging apparatus according to Embodiment 6 may be the same as the configuration and the structure of the solid-state imaging apparatuses according to Embodiment 1 to Embodiment 4, and hence are not described in detail.

Embodiment 7

Figure 7:
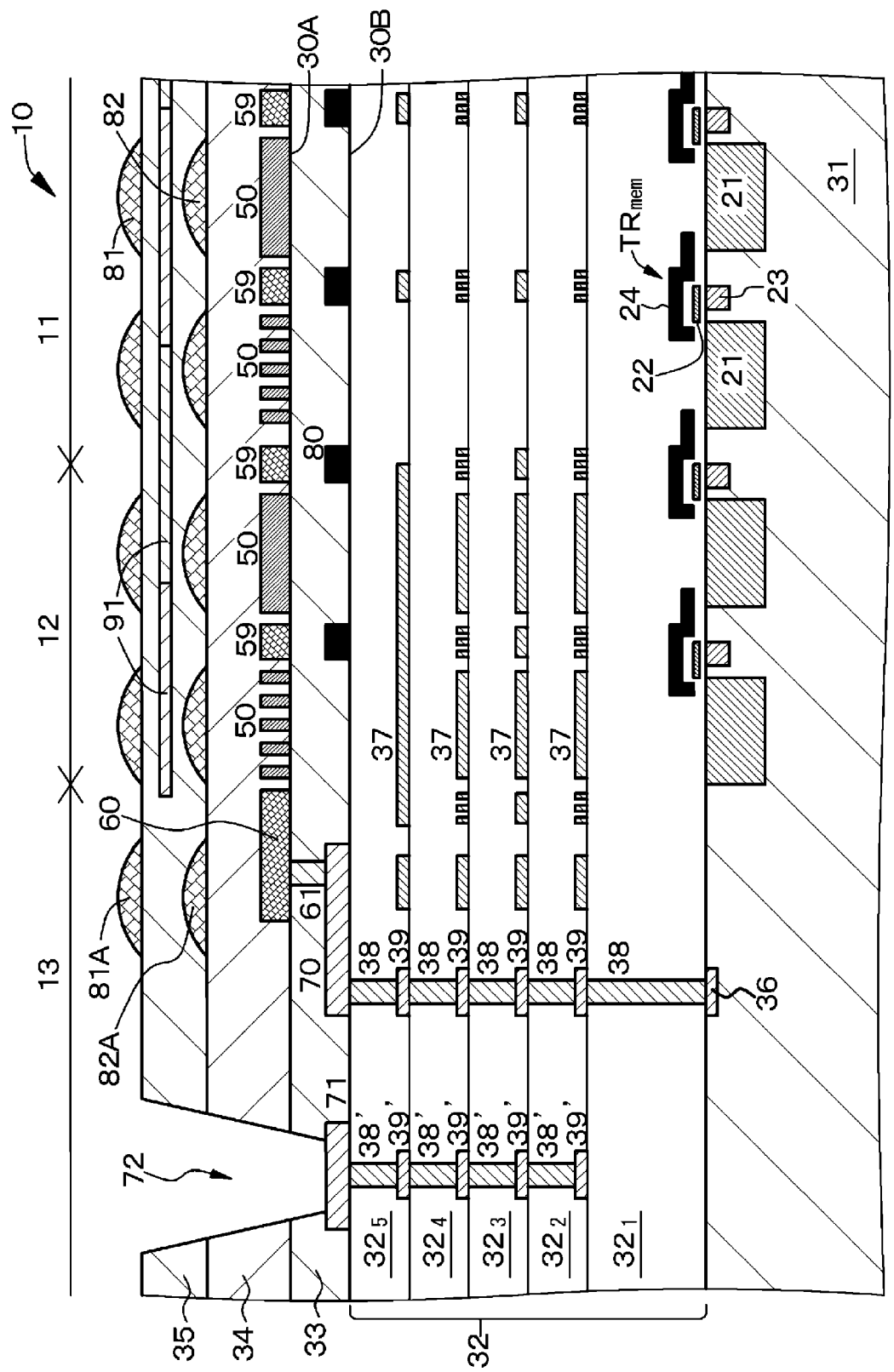
FIG. 7 is a schematic partial cross-sectional view of a solid-state imaging apparatus according to Embodiment 7.

Embodiment 7 is a modification of Embodiment 1 to Embodiment 6. In a solid-state imaging apparatus according to Embodiment 7, as illustrated in the schematic partial cross-sectional view of FIG. 7, on-chip microlenses 81 and 82 are formed on both a top side of the valid pixel region 11 and a top side of the peripheral region 13. Note that, ones of the on-chip microlenses (a kind of dummy on-chip microlenses), which are formed on the top side of the peripheral region 13, are denoted by the reference symbols 81A and 82A.

When the on-chip microlenses 81 and 82 are formed on both the top side of the valid pixel region 11 and a top side of the optical black (OPB) region 12, there is a risk that other ones of the on-chip microlenses 81 and 82, which are formed in the valid pixel region 11 adjacent to the optical black (OPB) region 12, do not satisfy desired specifications. However, when the on-chip microlenses 81, 82, 81A, and 82A are formed on both the top side of the valid pixel region 11 and the top side of the peripheral region 13, such problems can be reliably avoided.

Except these features, the configuration and the structure of the solid-state imaging apparatus according to Embodiment 7 may be the same as the configuration and the structure of the solid-state imaging apparatuses according to Embodiment 1 to Embodiment 6, and hence are not described in detail.

Embodiment 8

Figure 8:
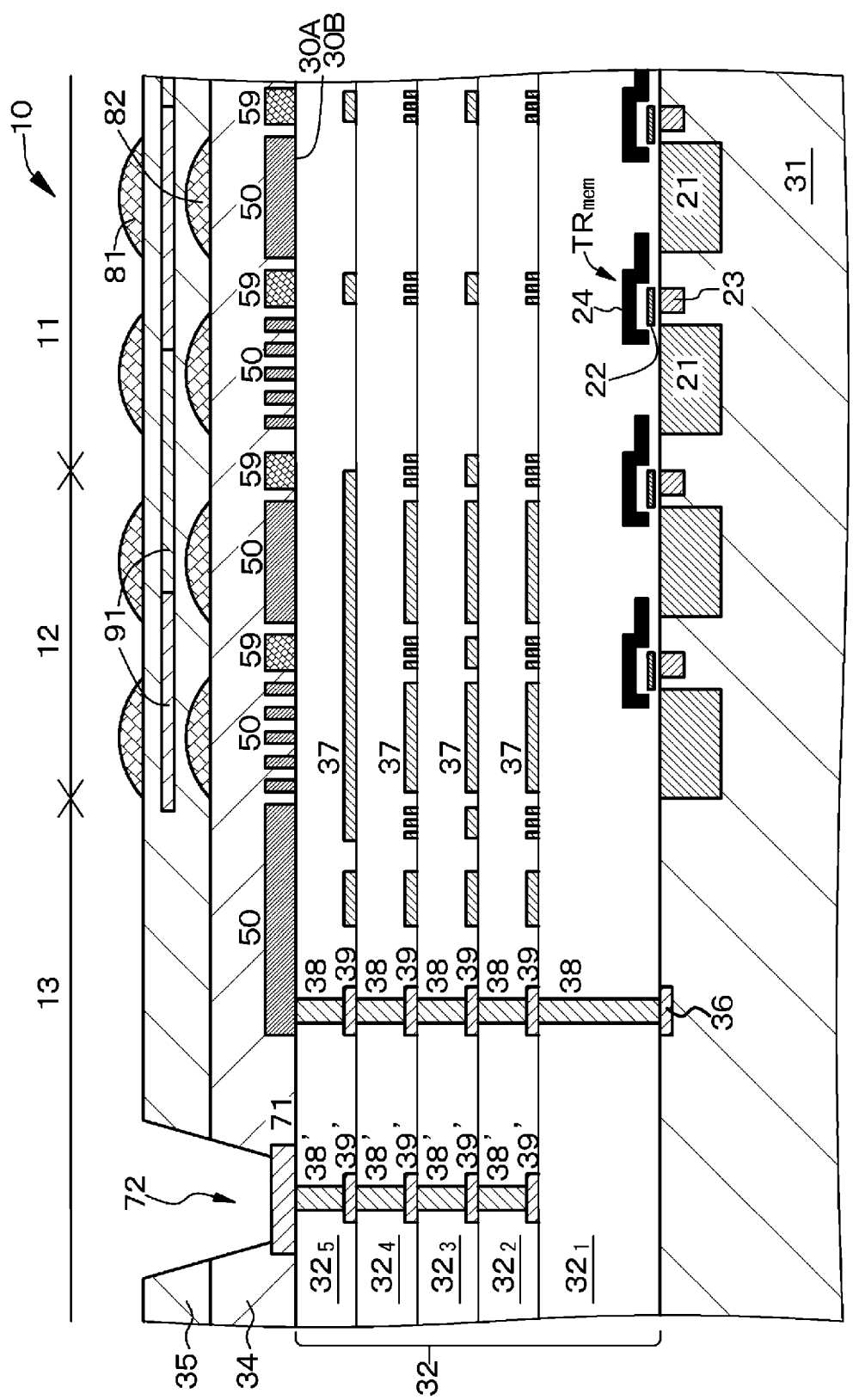
FIG. 8 is a schematic partial cross-sectional view of a solid-state imaging apparatus according to Embodiment 8.

Embodiment 8 relates to a solid-state imaging apparatus according to the second embodiment of the present disclosure. As illustrated in the schematic partial cross-sectional view of FIG. 8, a solid-state imaging apparatus according to Embodiment 8 includes the photoelectric conversion device group formed in the semiconductor substrate 31 and including the photoelectric conversion devices (imaging devices) 21 arrayed in two-dimensional matrix in the valid pixel region 11, and the wire grid polarizers 50 formed above the semiconductor substrate 31 at the positions corresponding to the photoelectric conversion devices 21 on the light incidence side of the photo-electric conversion devices 21. Further, the pad portion 71 is arranged in the peripheral region 13 located on the outside of the valid pixel region 11.

The wire grid polarizers 50 and 50' and the pad portion 71 are formed in the same layer, and the wire grid polarizers 50 and 50' and the pad portion 71 are electrically connected to each other.

In other words, when the surface on which the wire grid polarizers 50 and 50' are formed is referred to as the first surface 30A, and when the surface on which the pad portion 71 is formed is referred to as the second surface 30B, the first surface 30A and the second surface 30B are located within the same plane.

The first surface 30A and the second surface 30B in the solid-state imaging apparatus according to Embodiment 8 correspond to the top surface of the fifth interlayer-insulating layer $32_5$ in the solid-state imaging apparatus according to Embodiment 1. The pad portion 71 and the wire grid polarizers 50 and 50' are formed on the top surface of the fifth interlayer-insulating layer $32_5$ (first surface 30A and second surface 30B). The base insulating layer 33 also corresponds to the fifth interlayer-insulating layer $32_5$. The fifth interlayer-insulating layer $32_5$ and the wire grid polarizers 50 and 50' are covered with the first planarizing film 34.

As in the solid-state imaging apparatus according to Embodiment 1, the sub-on-chip microlenses (OPA) 82 are arranged on the first planarizing film 34 in the region located above the photoelectric conversion devices 21 and 21'. The first planarizing film 34 and the sub-on-chip microlenses (OPA) 82 are covered with the second planarizing film. The wavelength selecting sections (specifically, well-known color filter layers) 91 are formed on the second planarizing film in the region located above the photoelectric conversion devices 21 and 21'. The second planarizing film and the wavelength selecting sections 91 are covered with the third planarizing film. The main on-chip microlenses 81 are arranged on the third planarizing film in the region located above the photoelectric conversion devices 21 and 21'.

Also in the solid-state imaging apparatus according to Embodiment 8, as in the solid-state imaging apparatus according to Embodiment 2, the light blocking portions may be formed above the regions between ones of the photoelectric conversion devices 21 and 21' and other ones of the photoelectric conversion devices 21 and 21' in the photoelectric conversion device group. The light blocking portions are formed of the frame portions 59 that connect ones of the wire grid polarizers 50 and 50' and other ones of the wire grid polarizers 50 and 50' to each other, the frame portions 59 not allowing light to be transmitted therethrough. The frame portions 59 are arranged in a manner of forming a kind of casing trims that surround the wire grid polarizers 50 and 50' arranged correspondingly to the photoelectric conversion devices 21 and 21'. Further, the optical black (OPB) region 12 is arranged between the valid pixel region 11 and the peripheral region 13. The wire grid polarizers 50 and 50' are formed in both the valid pixel region 11 and the optical black region 12.

Figure 9:
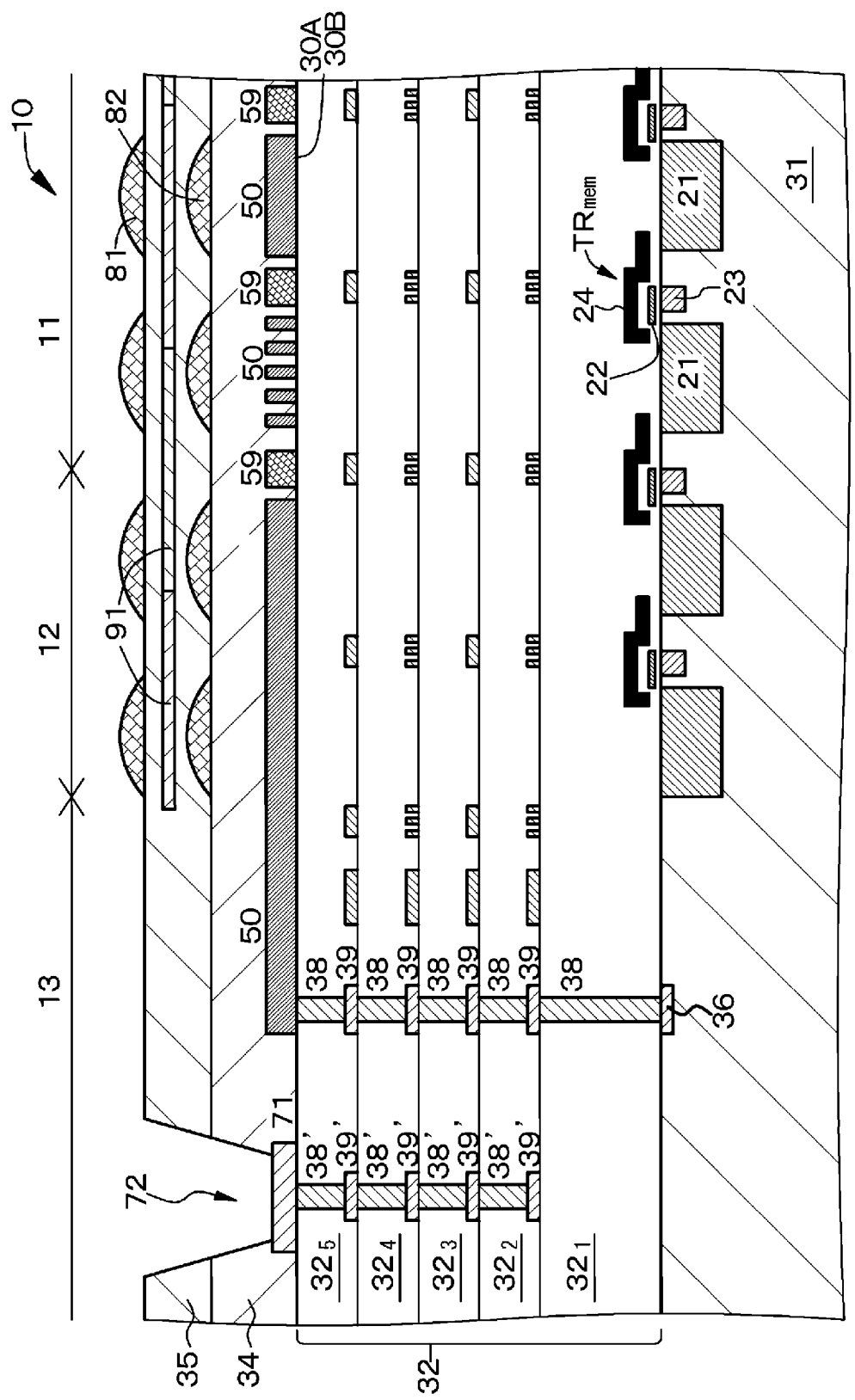
FIG. 9 is a schematic partial cross-sectional view of a modification of the solid-state imaging apparatus according to Embodiment 8.

When necessary, as illustrated in FIG. 9, with the optical black (OPB) region 12 being arranged between the valid pixel region 11 and the peripheral region 13, and with the wire grid polarizers 50 and 50' being formed in both the valid pixel region 11 and the optical black (OPB) region 12, the optical black (OPB) region 12 may be shielded from light by the wire grid polarizer 50' (light-transmission blocking parts of the wire grid polarizer 50). The light-transmission blocking parts of the wire grid polarizers 50' may be formed, for example, of the second laminated body.

Except these features, the configuration and the structure of the solid-state imaging apparatus according to Embodiment 8 may be the same as the configuration and the structure of the solid-state imaging apparatuses according to Embodiment 1 to Embodiment 7, and hence are not described in detail.

In the solid-state imaging apparatus according to Embodiment 8, the thickness of the part located above the photoelectric conversion devices can be further reduced than in the solid-state imaging apparatus described in Embodiment 1. As a result, height reduction can be achieved, and hence the entry of polarized light into adjacent ones of the photoelectric conversion devices (polarization crosstalk) can be further reduced.

With regard to the description of preferred Embodiments of the present disclosure, the present disclosure is not limited to these Embodiments. The photoelectric conversion devices (imaging devices), the structures and the configurations of the solid-state imaging apparatuses, and the manufacturing methods therefor, which are described in Embodiments, and the materials used therein are merely examples, and hence may be changed as appropriate. The solid-state imaging apparatuses according to Embodiments may be combined with each other as appropriate.

The combinations of the photoelectric conversion devices, the wavelength selecting sections, and the wire grid polarizers, which are described above in Embodiments, may be changed as appropriate. Further, there may be employed near-infrared photoelectric conversion devices (or infrared photoelectric conversion devices).

Figure 19A:
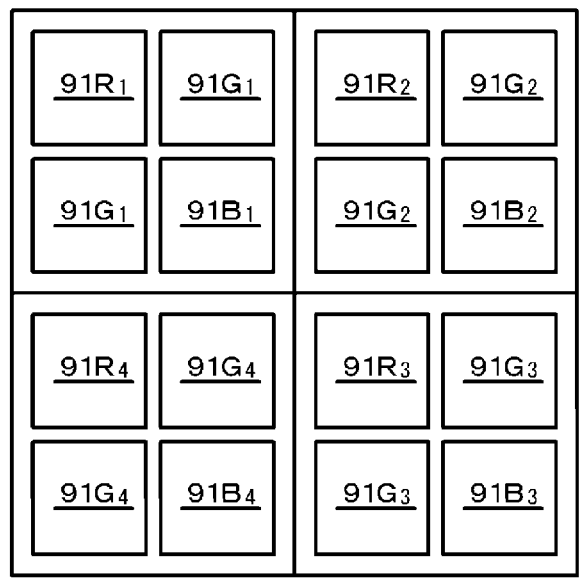
FIG. 19A is a schematic partial plan view of a first modification of the wavelength selecting sections (color filter layers) in the solid-state imaging apparatus according to Embodiment 1.
Figure 19B:
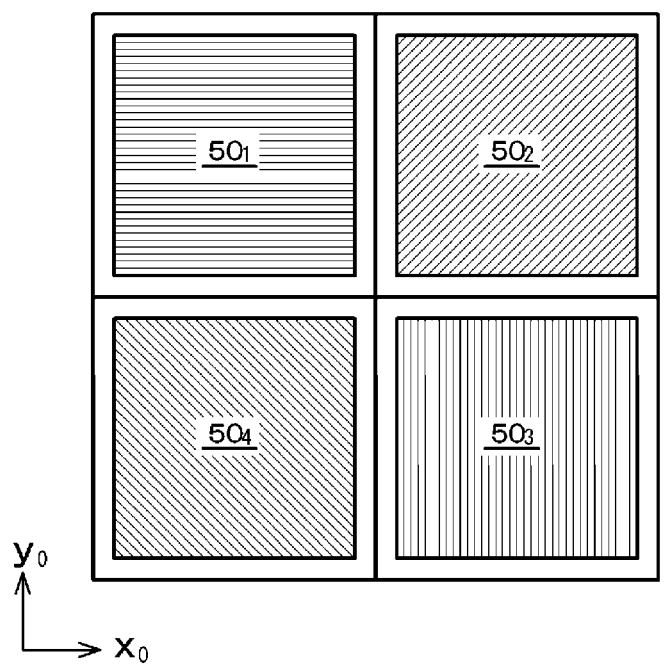
FIG. 19B is a schematic partial plan view of a first modification of the wire grid polarizers in the solid-state imaging apparatus according to Embodiment 1.
Figure 20:
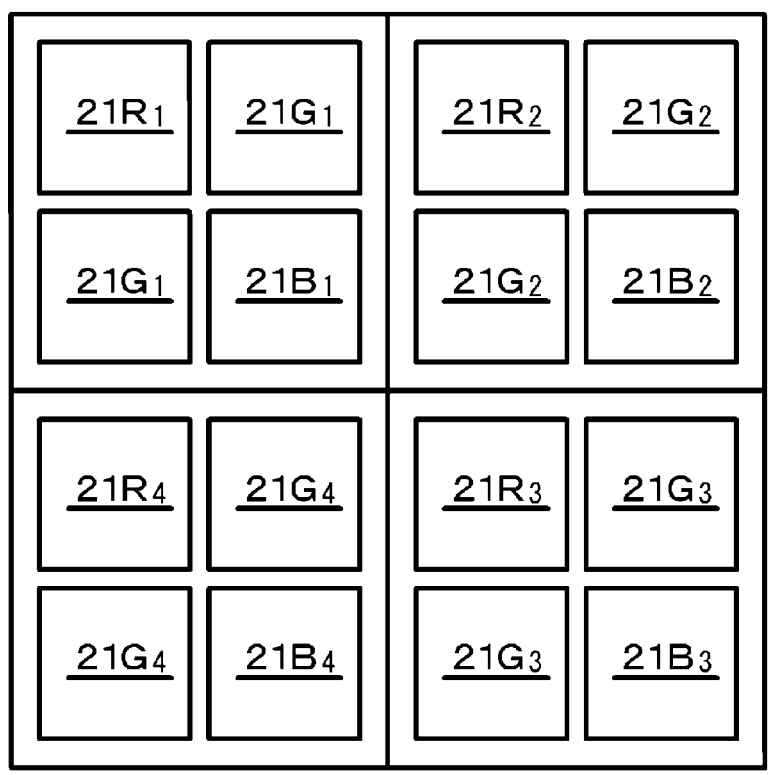
FIG. 20 is a schematic partial plan view of a first modification of the photoelectric conversion devices in the solid-state imaging apparatus according to Embodiment 1.

FIG. 19A is a schematic partial plan view of a first modification of the wavelength selecting sections (color filter layers) in the solid-state imaging apparatus according to Embodiment 1, and FIG. 19B is a schematic partial plan view of a first modification of the wire grid polarizers in the solid-state imaging apparatus according to Embodiment 1. FIG. 20 is a schematic partial plan view of a first modification of the photoelectric conversion devices in the solid-state imaging apparatus according to Embodiment 1. As illustrated in these figures, there are four photoelectric conversion device units. The first photoelectric-conversion-device unit includes the red-light photoelectric conversion device $21R_1$ configured to absorb the red light, the green-light photoelectric conversion devices $21G_1$ and $21G_1$ configured to absorb the green light, the blue-light photoelectric conversion device $21B_1$ configured to absorb the blue light, and the wavelength selecting sections (color filter layers) 91 ($91R_1$, $91G_1$, $91G_1$, and $91B_1$) for these photoelectric conversion devices. The second photoelectric-conversion-device unit includes the red-light photoelectric conversion device $21R_2$ configured to absorb the red light, the green-light photoelectric conversion devices $21G_2$ and $21G_2$ configured to absorb the green light, the blue-light photoelectric conversion device $21B_2$ configured to absorb the blue light, and the wavelength selecting sections (color filter layers) 91 ($91R_2$, $91G_2$, $91G_2$, and $91B_2$) for these photoelectric conversion devices. The third photoelectric-conversion-device unit includes the red-light photoelectric conversion device $21R_3$ configured to absorb the red light, the green-light photoelectric conversion devices $21G_3$ and $21G_3$ configured to absorb the green light, the blue-light photoelectric conversion device $21B_3$ configured to absorb the blue light, and the wavelength selecting sections (color filter layers) 91

($91R_3$, $91G_3$, $91G_3$, and $91B_3$) for these photoelectric conversion devices. The fourth photoelectric-conversion-device unit includes the red-light photoelectric conversion device $21R_4$ configured to absorb the red light, the green-light photoelectric conversion devices $21G_4$ and $21G_4$ configured to absorb the green light, the blue-light photoelectric conversion device $21B_4$ configured to absorb the blue light, and the wavelength selecting sections (color filter layers) 91 ($91R_4$, $91G_4$, $91G_4$, and $91B_4$) for these photoelectric conversion devices. Further, wire grid polarizers 50 ($50_1$, $50_2$, $50_3$, and $50_4$) are arranged respectively for the photoelectric conversion device units. The wire grid polarizer $50_1$ has the polarization orientation at the angle of a, in which light is transmitted. The wire grid polarizer $50_2$ has the polarization orientation at the angle of ($\alpha$+45), in which light is transmitted. The wire grid polarizer $50_3$ has the polarization orientation at the angle of ($\alpha$+90), in which light is transmitted. The wire grid polarizer $50_4$ has the polarization orientation at the angle of ($\alpha$+135), in which light is transmitted.

Figure 21A:
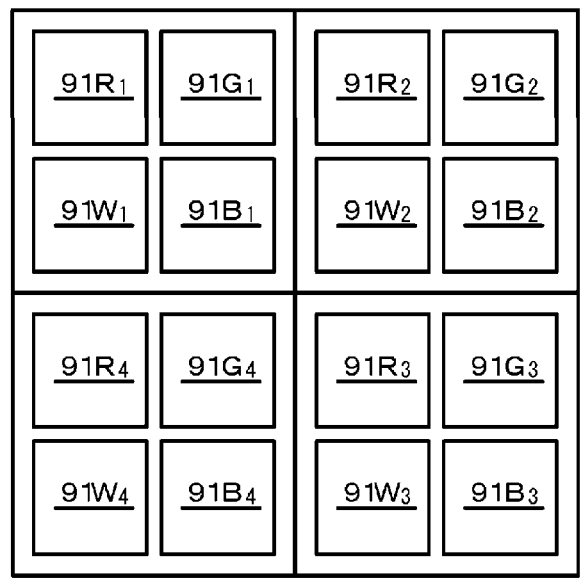
FIG. 21A is a schematic partial plan view of a second modification of the wavelength selecting sections (color filter layers) in the solid-state imaging apparatus according to Embodiment 1.
Figure 21B:
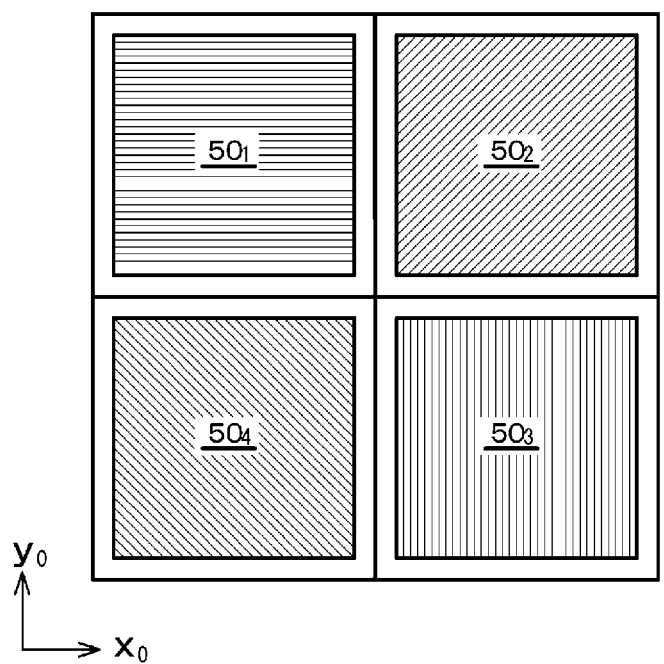
FIG. 21B is a schematic partial plan view of a second modification of the wire grid polarizers in the solid-state imaging apparatus according to Embodiment 1.
Figure 22A:
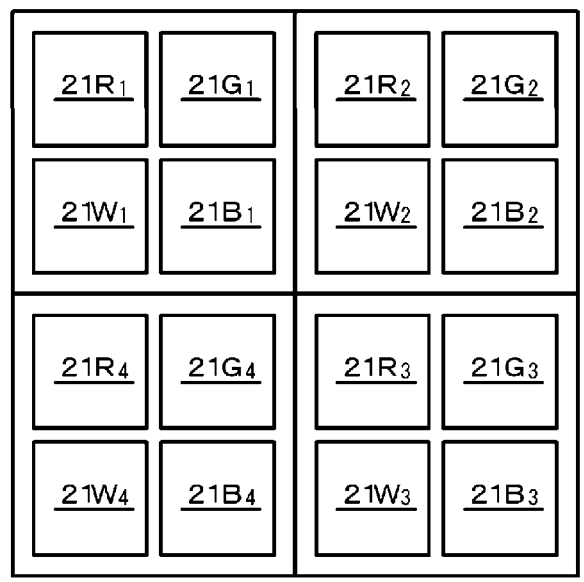
FIG. 22A is a schematic partial plan view of a second modification of the photoelectric conversion devices in the solid-state imaging apparatus according to Embodiment 1.

FIG. 21A is a schematic partial plan view of a second modification of the wavelength selecting sections (color filter layers) in the solid-state imaging apparatus according to Embodiment 1, and FIG. 21B is a schematic partial plan view of a second modification of the wire grid polarizers in the solid-state imaging apparatus according to Embodiment 1. FIG. 22A is a schematic partial plan view of a second modification of the photoelectric conversion devices in the solid-state imaging apparatus according to Embodiment 1. As illustrated in these figures, there are four photoelectric conversion device units. The first photoelectric-conversion-device unit includes the red-light photoelectric conversion device $21R_1$ configured to absorb the red light, the green-light photoelectric conversion device $21G_1$ configured to absorb the green light, the blue-light photoelectric conversion device $21B_1$ configured to absorb the blue light, a white-light photoelectric conversion device $21W_1$ configured to absorb white light, and the wavelength selecting sections (color filter layers) 91 ($91R_1$, $91G_1$, and $91B_1$) and a transparent resin layer $91W_1$ for these photoelectric conversion devices. The second photoelectric-conversion-device unit includes the red-light photoelectric conversion device $21R_2$ configured to absorb the red light, the green-light photoelectric conversion device $21G_2$ configured to absorb the green light, the blue-light photoelectric conversion device $21B_2$ configured to absorb the blue light, a white-light photoelectric conversion device $21W_2$ configured to absorb the white light, and the wavelength selecting sections (color filter layers) 91 ($91R_2$, $91G_2$, and $91B_2$) and a transparent resin layer $91W_2$ for these photoelectric conversion devices. The third photoelectric-conversion-device unit includes the red-light photoelectric conversion device $21R_3$ configured to absorb the red light, the green-light photoelectric conversion device $21G_3$ configured to absorb the green light, the blue-light photoelectric conversion device $21B_3$ configured to absorb the blue light, a white-light photoelectric conversion device $21W_3$ configured to absorb the white light, and the wavelength selecting sections (color filter layers) 91 ($91R_3$, $91G_3$, and $91B_3$) and a transparent resin layer $91W_3$ for these photoelectric conversion devices. The fourth photoelectric-conversion-device unit includes the red-light photoelectric conversion device $21R_4$ configured to absorb the red light, the green-light photoelectric conversion device $21G_4$ configured to absorb the green light, the blue-light photoelectric conversion device $21B_4$ configured to absorb the blue light, a white-light photoelectric conversion device $21W_4$ configured to absorb the white light, and the wavelength selecting sections (color filter layers) 91 ($91R_4$, $91G_4$, and $91B_4$) and a transparent resin layer $91W_4$ for these photoelectric conversion devices. Note that, the white light to which the photoelectric conversion devices are sensitive refers to light having a wavelength of, for example, from 425 nm to 750 nm. Further, the wire grid polarizers 50 ($50_1$, $50_2$, $50_3$, and $50_4$) are arranged respectively for the photoelectric conversion device units. The wire grid polarizer $50_1$ has the polarization orientation at the angle of a, in which light is transmitted. The wire grid polarizer $50_2$ has the polarization orientation at the angle of ($\alpha$+45), in which light is transmitted. The wire grid polarizer $50_3$ has the polarization orientation at the angle of ($\alpha$+90), in which light is transmitted. The wire grid polarizer $50_4$ has the polarization orientation at the angle of ($\alpha$+135), in which light is transmitted. Alternatively, as illustrated in the schematic partial plan view of FIG. 22B, wire grid polarizers $50W_1$, $50W_2$, $50W_3$, and $50W_4$ may be arranged only above the white-light photoelectric conversion devices 21W ($21W_1$, $21W_2$, $21W_3$, and $^{21}W_4$).

Figure 23A:
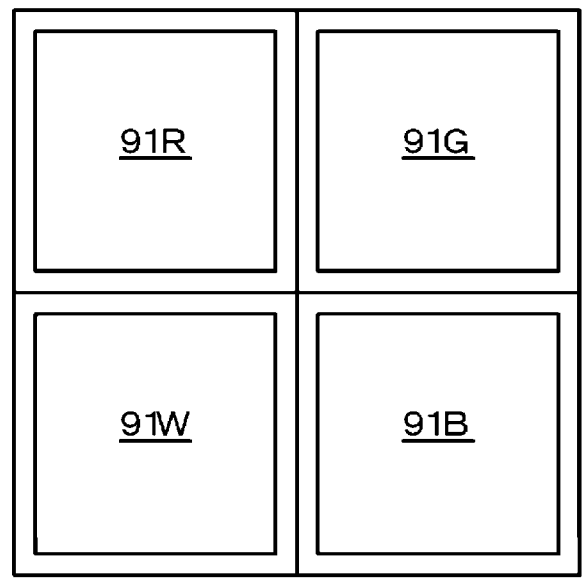
FIG. 23A is a schematic partial plan view of a third modification of the wavelength selecting sections (color filter layers) in the solid-state imaging apparatus according to Embodiment 1.
Figure 23B:
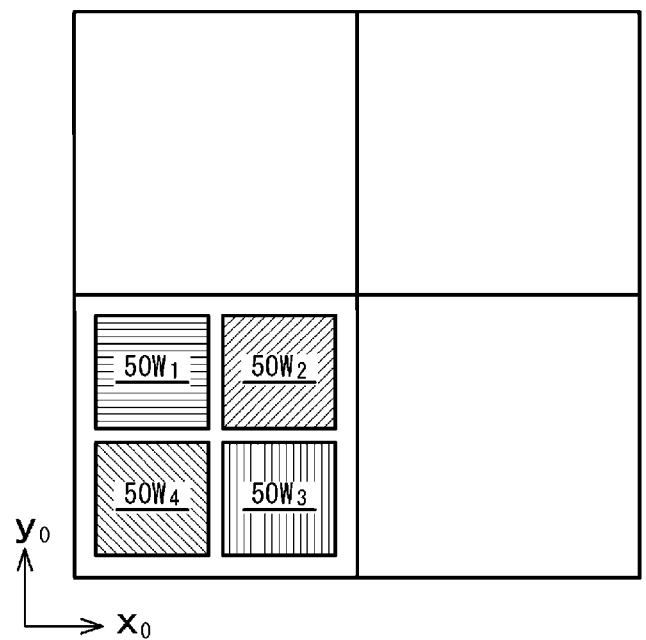
FIG. 23B is a schematic partial plan view of a third modification of the wire grid polarizers in the solid-state imaging apparatus according to Embodiment 1.
Figure 24A:
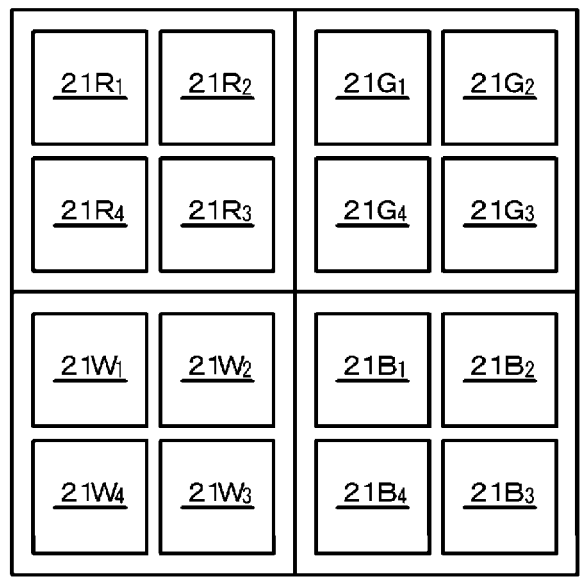
FIG. 24A is a schematic partial plan view of a third modification of the photoelectric conversion devices in the solid-state imaging apparatus according to Embodiment 1.

FIG. 23A is a schematic partial plan view of a third modification of the wavelength selecting sections (color filter layers) in the solid-state imaging apparatus according to Embodiment 1, and FIG. 23B is a schematic partial plan view of a third modification of the wire grid polarizers in the solid-state imaging apparatus according to Embodiment 1. FIG. 24A is a schematic partial plan view of a third modification of the photoelectric conversion devices in the solid-state imaging apparatus according to Embodiment 1. As illustrated in these figures, there are four photoelectric conversion device units. The first photoelectric-conversion-device unit includes the four red-light photoelectric conversion devices 21R ($21R_1$, $21R_2$, $21R_3$, and $21R_4$). The second photoelectric-conversion-device unit includes the four green-light photoelectric conversion devices 21G ($21G_1$, $21G_2$, $21G_3$, and $21G_4$). The third photoelectric-conversion-device unit includes the four blue-light photoelectric conversion devices 21B ($21B_1$, $21B_2$, $21B_3$, and $21B_4$). The fourth photoelectric-conversion-device unit includes the white-light photoelectric conversion devices 21W ($21W_1$, $21W_2$, $21W_3$, and $21W_4$). Further, the wavelength selecting sections (color filter layers) 91 (91R, 91G, and 91B) and the transparent resin layers 91W are arranged respectively for the red-light photoelectric conversion devices 21R, the green-light photoelectric conversion devices 21G, the blue-light photoelectric conversion devices 21B, and the white-light photoelectric conversion devices 21W. Still further, the four wire grid polarizers $50W_1$, $50W_2$, $50W_3$, and $50W_4$ are arranged respectively for the white-light photoelectric conversion devices 21W ($21W_1$, $21W_2$, $21W_3$, and $21W_4$). The wire grid polarizer $50W_1$ has the polarization orientation at the angle of a, in which light is transmitted. The wire grid polarizer $50W_2$ has the polarization orientation at the angle of ($\alpha$+45), in which light is transmitted. The wire grid polarizer $50W_3$ has the polarization orientation at the angle of ($\alpha$+90), in which light is transmitted. The wire grid polarizer $50W_4$ has the polarization orientation at the angle of ($\alpha$+135), in which light is transmitted.

Figure 24B:
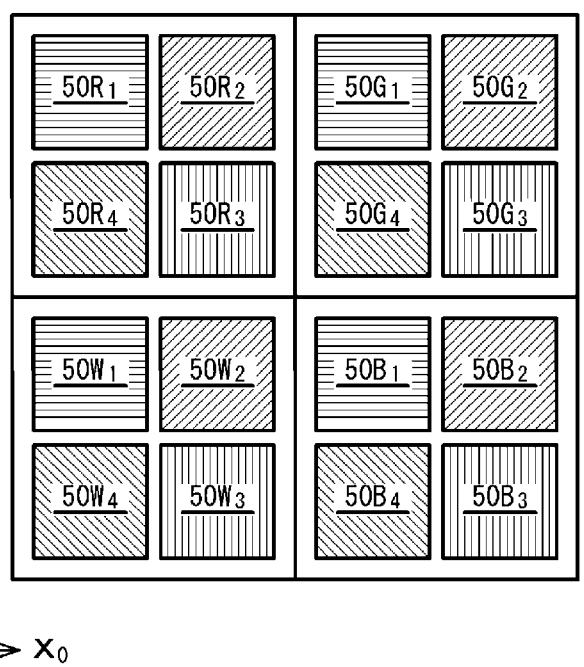
FIG. 24B is a schematic partial plan view of a modification of the third modification of the wire grid polarizers in the solid-state imaging apparatus according to Embodiment 1.

Note that, as illustrated in the schematic partial plan view of FIG. 24B, in a modification of the third modification of the wire grid polarizers, the four wire grid polarizers 50 ($50R_1$, $50R_2$, $50R_3$, and $50R_4$/$50G_1$, $50G_2$, $50G_3$, and $50G_4$/$50B_1$, $50B_2$, $50B_3$, and $50B_4$/$50W_1$, $50W_2$, $50W_3$, and $50W_4$) may be arranged for each of the photoelectric conversion device units (each pixel).

Figure 25A:
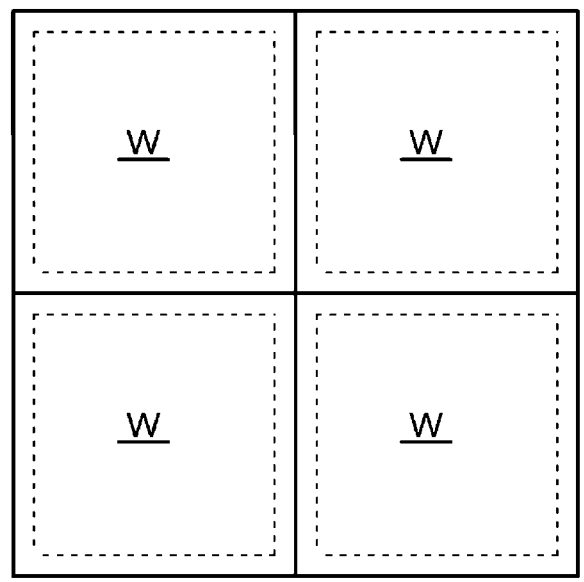
FIG. 25A is a schematic partial plan view of a fourth modification of the wavelength selecting sections (color filter layers) in the solid-state imaging apparatus according to Embodiment 1.
Figure 25B:
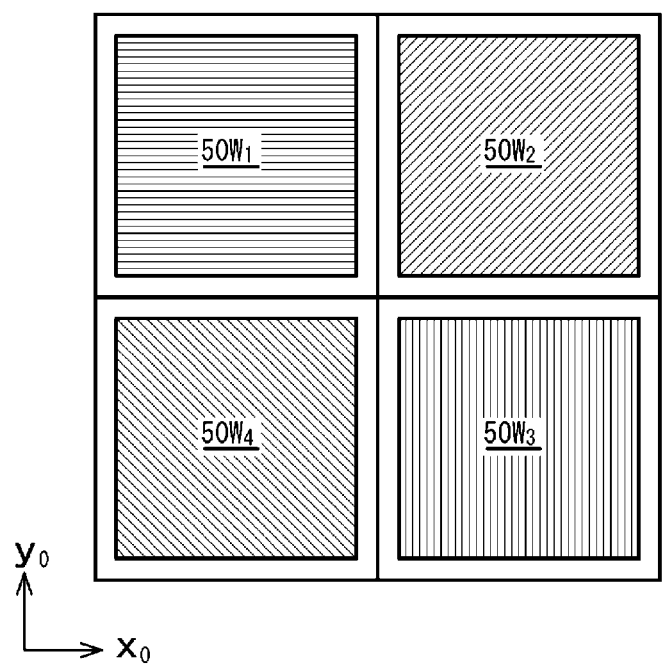
FIG. 25B is a schematic partial plan view of a fourth modification of the wire grid polarizers in the solid-state imaging apparatus according to Embodiment 1.
Figure 26:
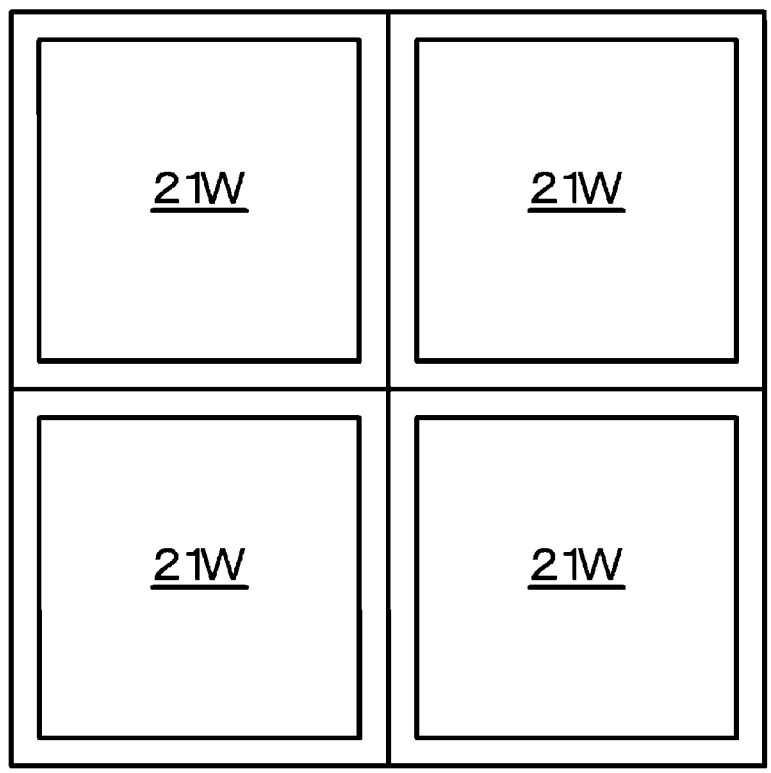
FIG. 26 is a schematic partial plan view of a fourth modification of the photoelectric conversion devices in the solid-state imaging apparatus according to Embodiment 1.

FIG. 25A is a schematic partial plan view of a fourth modification of the wavelength selecting sections (color filter layers) in the solid-state imaging apparatus according to Embodiment 1, and FIG. 25B is a schematic partial plan view of a fourth modification of the wire grid polarizers in the solid-state imaging apparatus according to Embodiment 1. FIG. 26 is a schematic partial plan view of a fourth modification of the photoelectric conversion devices in the solid-state imaging apparatus according to Embodiment 1. As illustrated in these figures, depending on specifications required of the solid-state imaging apparatus, the photoelectric conversion devices of the solid-state imaging apparatus may include only the white-light photoelectric conversion devices 21W.

Figure 27:
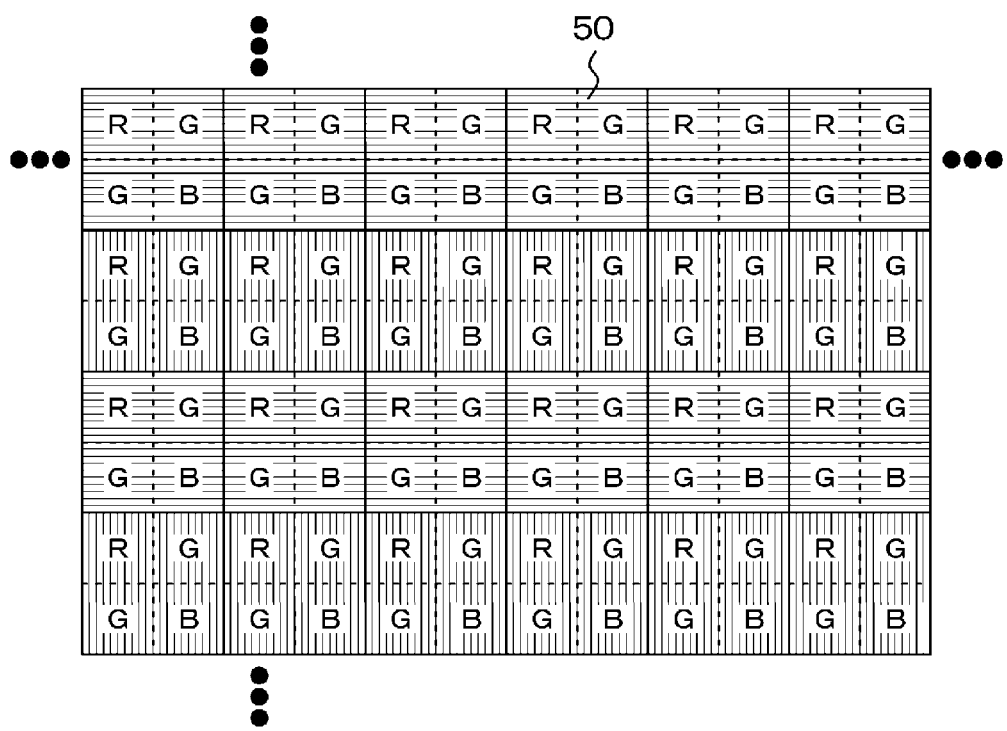
FIG. 27 is a plan layout view of a modification of photoelectric conversion devices in a Bayer array.
Figure 28:
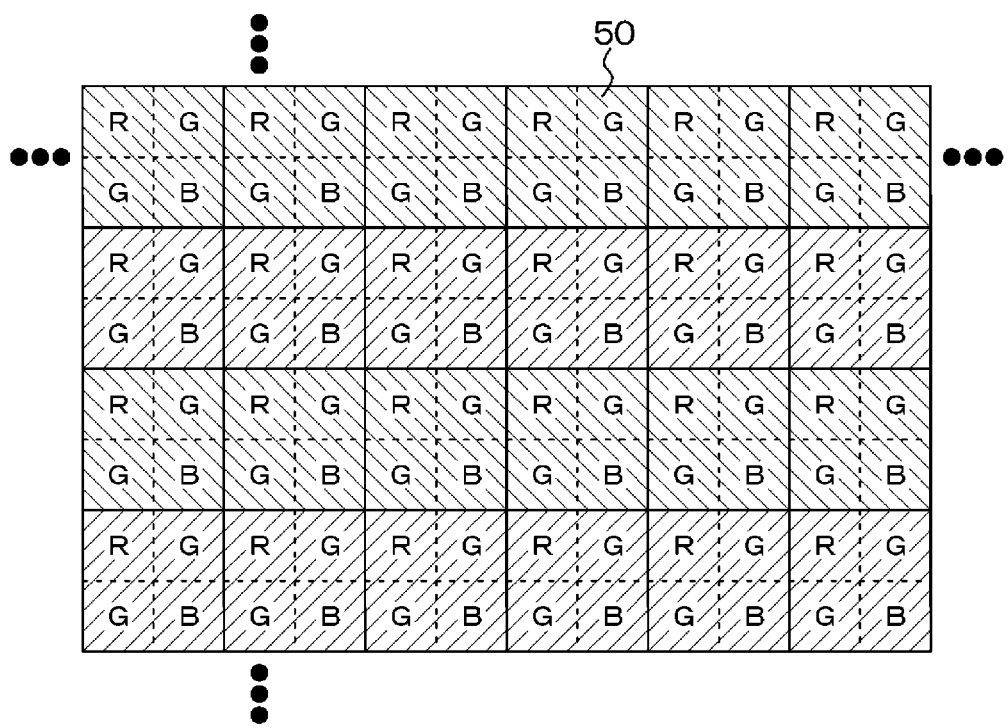
FIG. 28 is a plan layout view of another modification of the photoelectric conversion devices in the Bayer array.

As illustrated in FIG. 27, for example, a plurality of photoelectric conversion devices that are arrayed in a direction of forming an angle of 0 degrees with respect to the first angle, and a plurality of photoelectric conversion devices that are arrayed in a direction of forming an angle of 90 degrees with respect to the first direction may be used in combination with each other. Alternatively, as illustrated in FIG. 28, for example, a plurality of photoelectric conversion devices that are arrayed in a direction of forming an angle of 45 degrees with respect to the first angle, and a plurality of photoelectric conversion devices that are arrayed in a direction of forming an angle of 135 degrees with respect to the first direction may be used in combination with each other. Note that, as illustrated in the plan layout views of FIG. 27 to FIG. 39 for the photoelectric conversion device units, R's represent the red-light photoelectric conversion devices each including a red color filter, G's represent the green-light photoelectric conversion devices each including a green color filter, B's represent the blue-light photoelectric conversion devices each including a blue color filter, and W's represent the white-light photoelectric conversion devices without the color filters.

Figure 22B:
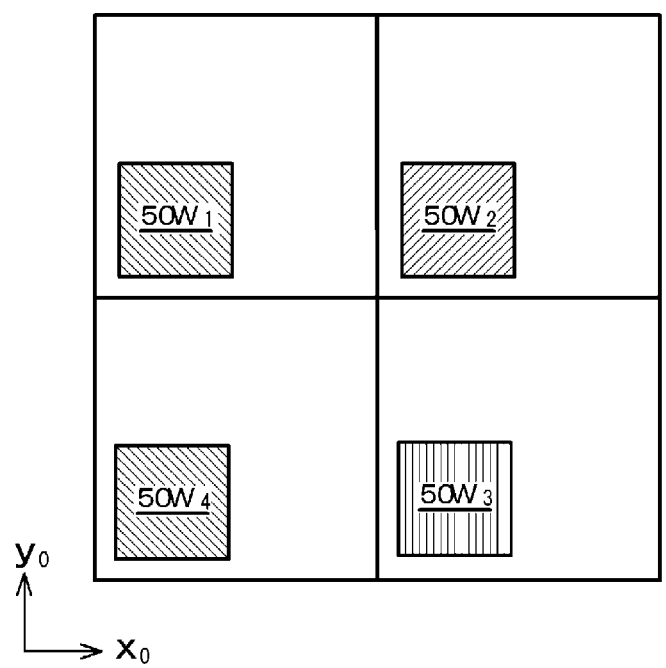
FIG. 22B is a schematic partial plan view of a modification of a second modification of the wire grid polarizers in the solid-state imaging apparatus according to Embodiment 1.
Figure 29:
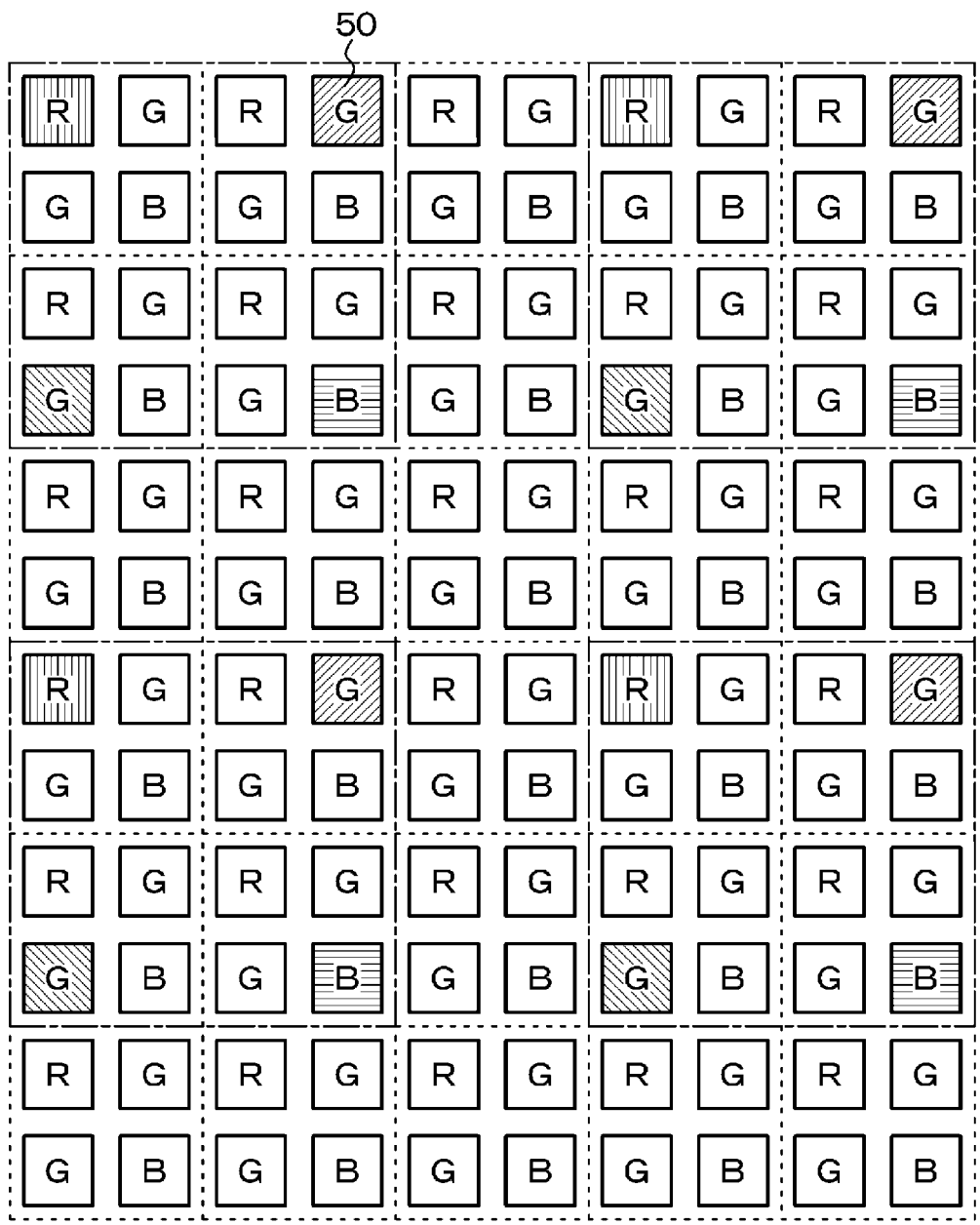
FIG. 29 is a plan layout view of still another modification of the photoelectric conversion devices in the Bayer array.

As in the example illustrated in FIG. 22B, the white-light photoelectric conversion devices W each provided with the wire grid polarizer 50 may be arranged at intervals of one photoelectric conversion device in both the $x_0$ direction and the $y_0$ direction. Alternatively, the white-light photoelectric conversion devices W may be arranged at intervals of two photoelectric conversion devices, or at intervals of three photoelectric conversion devices. Still alternatively, the photoelectric conversion devices each provided with the wire grid polarizer 50 and 50' may be arranged in a staggered pattern. The plan layout view of FIG. 29 illustrates a modification of the example illustrated in FIG. 22B.

Figure 30:
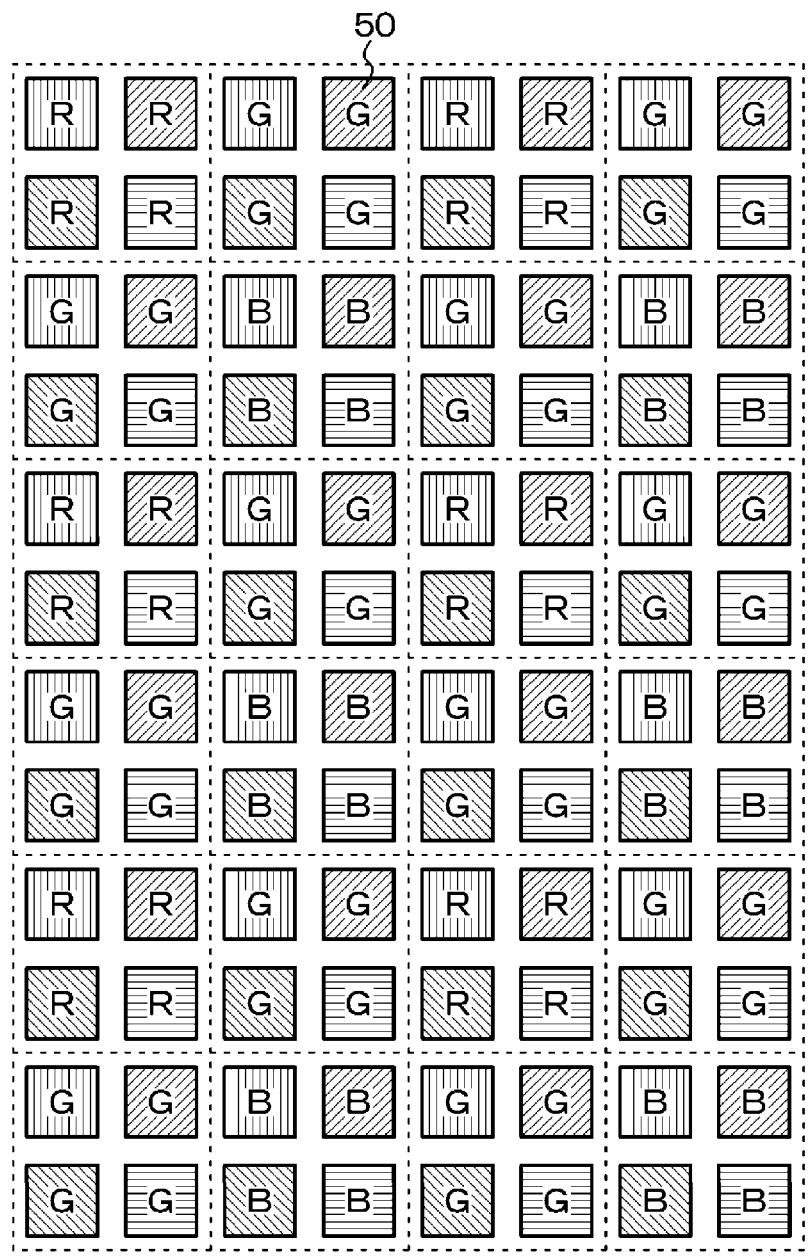
FIG. 30 is a plan layout view of yet another modification of the photoelectric conversion devices in the Bayer array.
Figure 31:
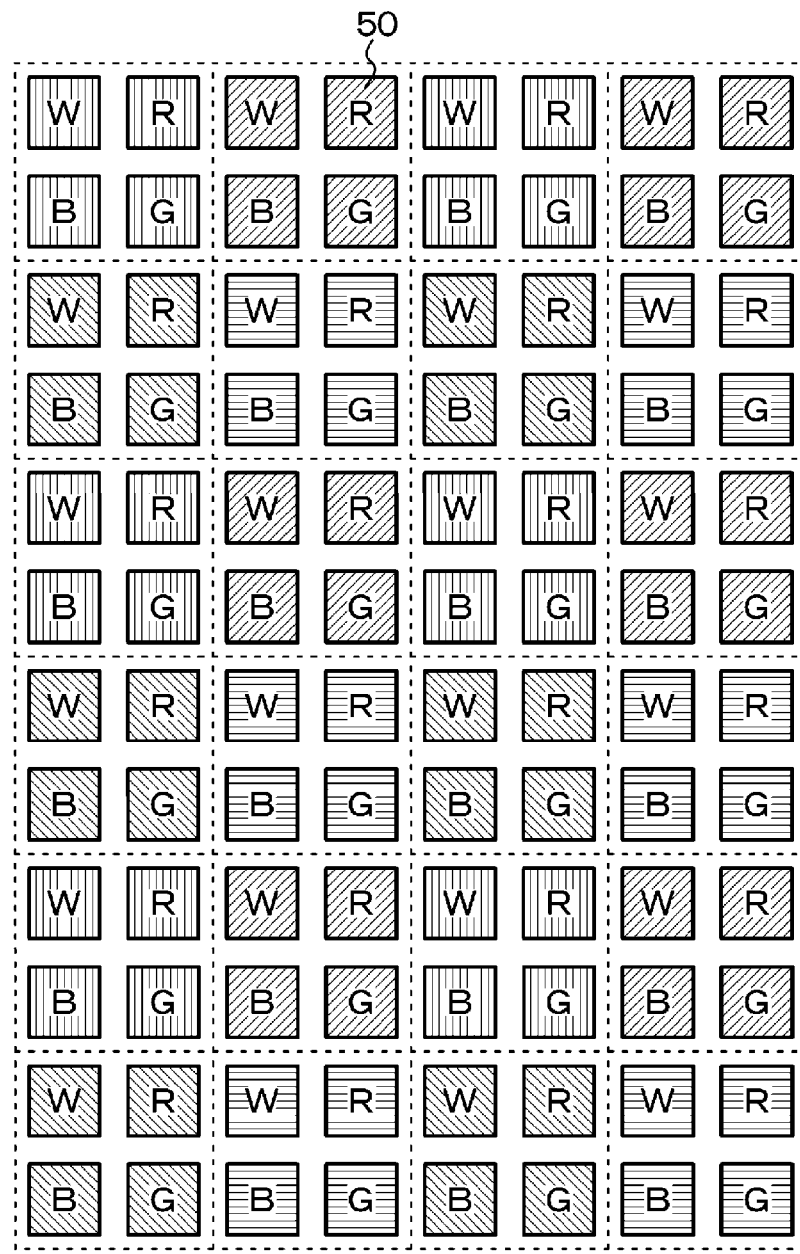
FIG. 31 is a plan layout view of yet another modification of the photoelectric conversion devices in the Bayer array.
Figure 33:
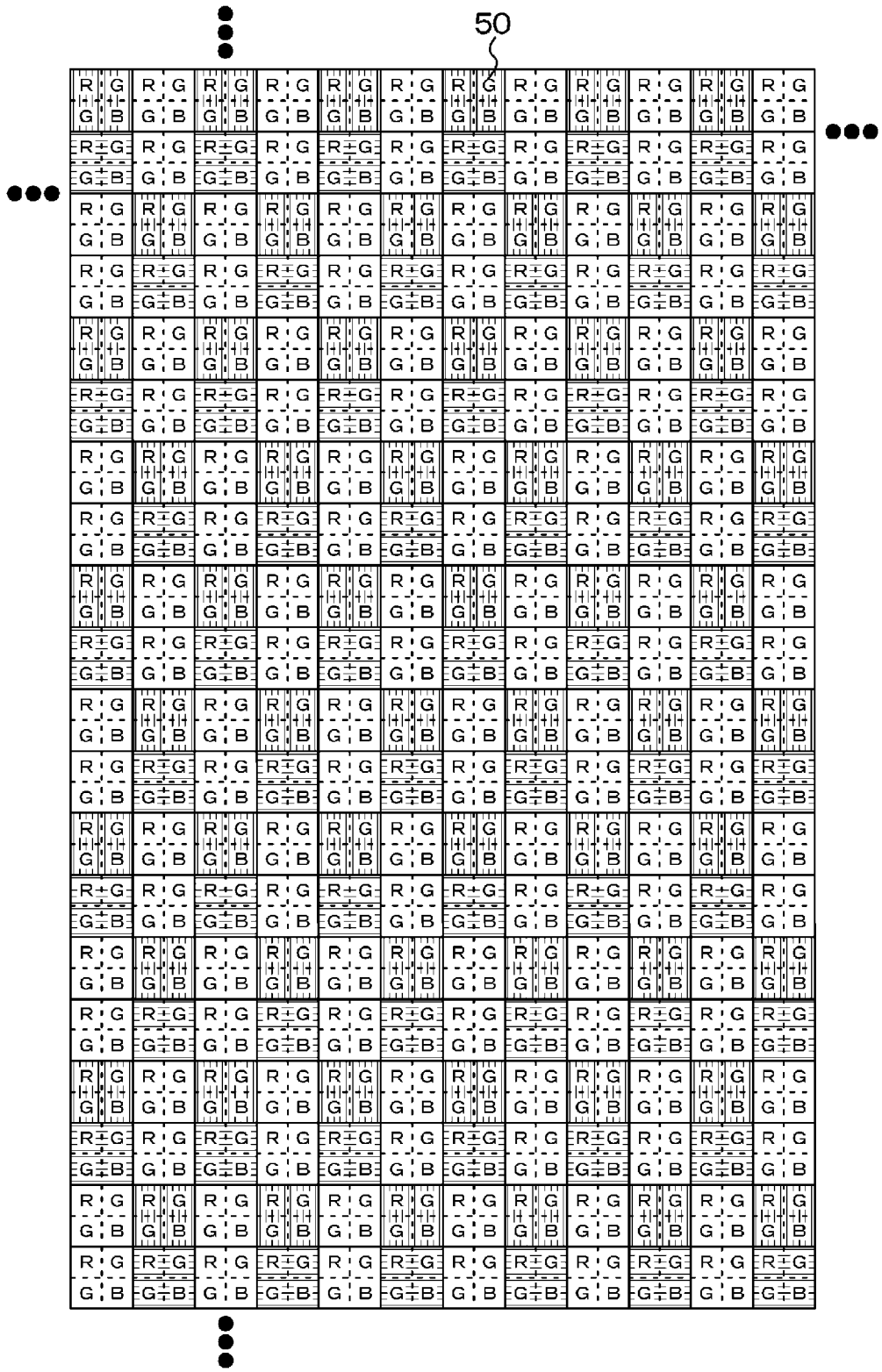
FIG. 33 is a plan layout view of yet another modification of the photoelectric conversion devices in the Bayer array.
Figure 34:
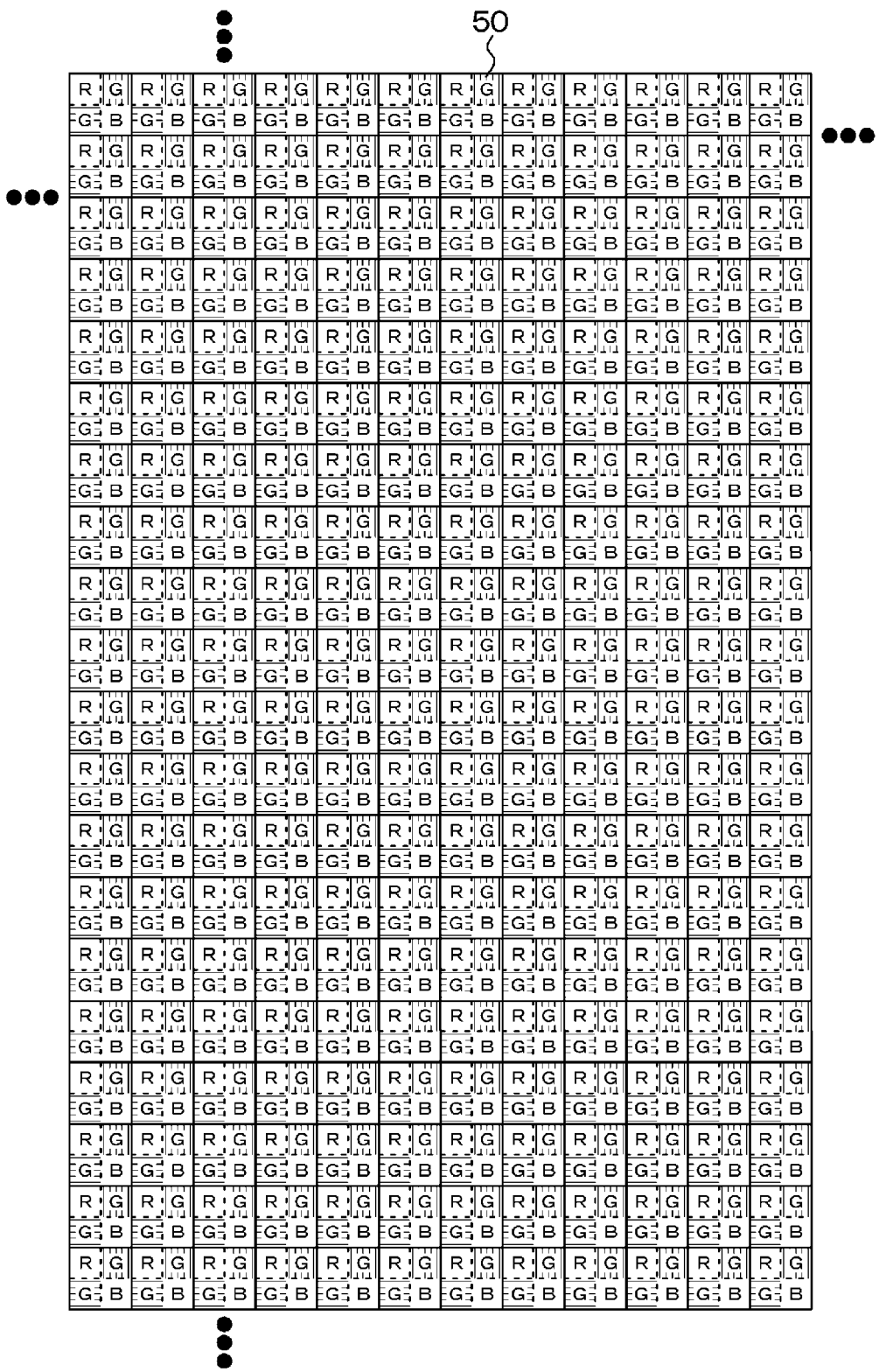
FIG. 34 is a plan layout view of yet another modification of the photoelectric conversion devices in the Bayer array.
Figure 36:
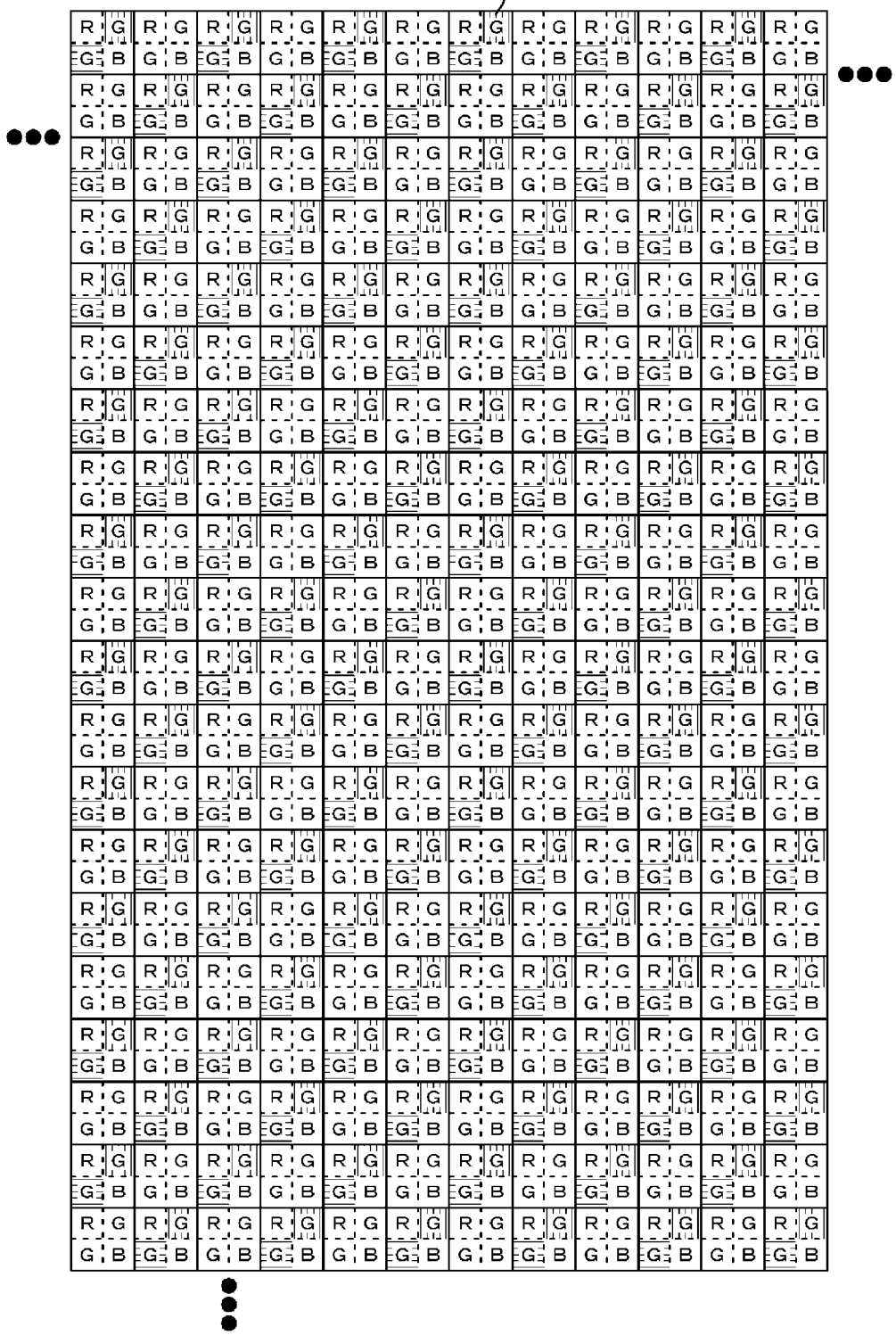
FIG. 36 is a plan layout view of yet another modification of the photoelectric conversion devices in the Bayer array.
Figure 37:
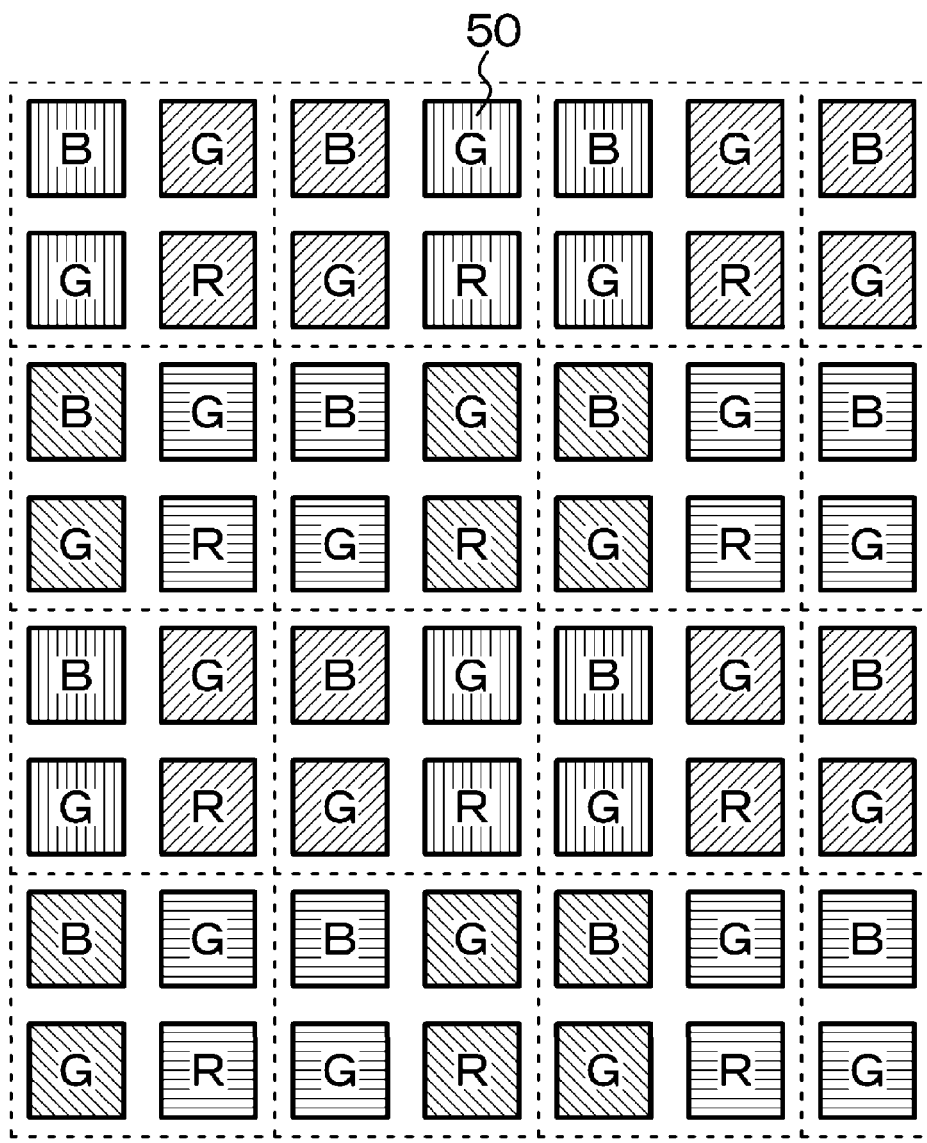
FIG. 37 is a plan layout view of yet another modification of the photoelectric conversion devices in the Bayer array.
Figure 38:
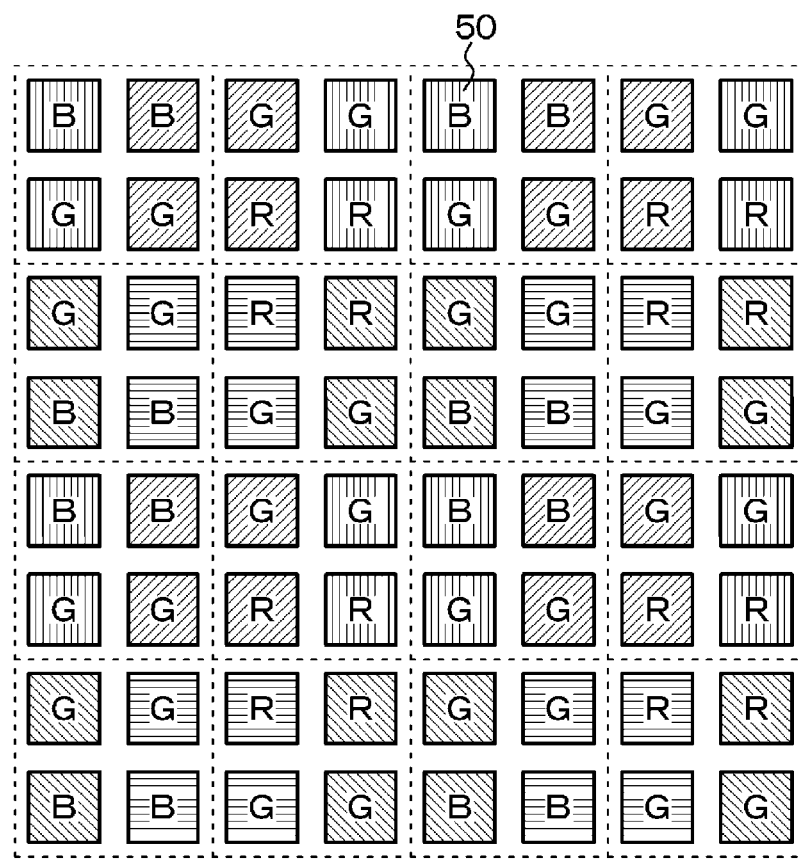
FIG. 38 is a plan layout view of yet another modification of the photoelectric conversion devices in the Bayer array.
Figure 39:
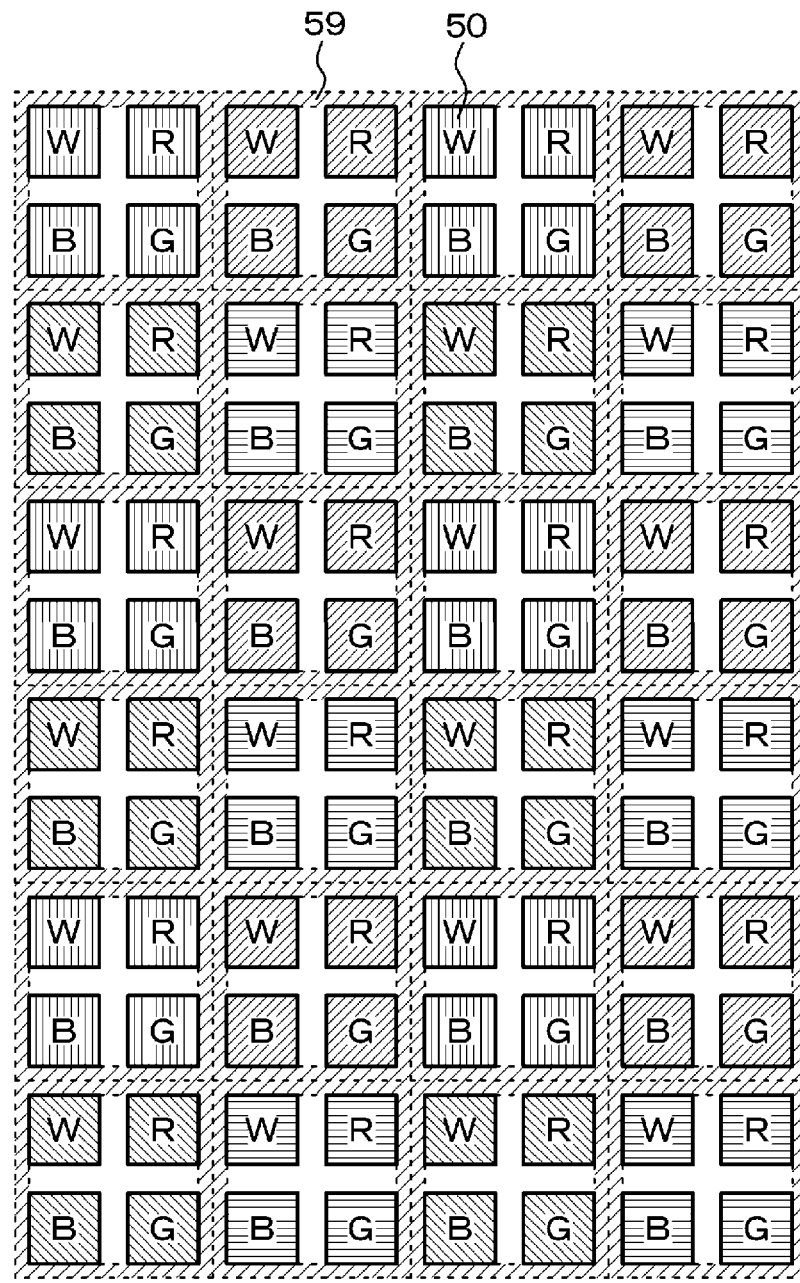
FIG. 39 is a plan layout view of yet another modification of the photoelectric conversion devices in the Bayer array.

Configurations illustrated in the plan layout views of FIG. 30 and FIG. 31 also may be employed. When a CMOS sensor has the plan layout illustrated in FIG. 30, there may be employed a two-by-two pixel sharing configuration in which the selection transistor, the reset transistor, and the amplification transistor are shared with two-by-two photoelectric conversion devices. With this, images containing polarization information items are captured in an imaging mode in which pixel addition is not performed, and normal images can be captured by integration of all of the polarized components in a mode of performing FD addition with respect to charges accumulated in two-by-two sub-pixel regions. Further, in the plan layout illustrated in FIG. 31, wire grid polarizers in the same direction are arranged in each two-by-two photoelectric conversion device unit. Thus, the laminated bodies are not liable to be discontinuous in each of the photoelectric conversion device units. As a result, high-quality polarization imaging can be performed.

Alternatively, configurations illustrated in the plan layout views of FIG. 32, FIG. 33, FIG. 34, FIG. 35, FIG. 36, FIG. 37, FIG. 38, and FIG. 39 also may be employed.

Further, in Embodiments, the wire grid polarizers are used exclusively for acquiring the polarization information items from the photoelectric conversion devices having a high sensitivity to the visible-light wavelength band. In a case where the photoelectric conversion devices have sensitivities to infrared light or ultraviolet light, when the formation pitch $P_0$ between one of the line portions and another one of the line portions is increased or reduced in accordance therewith, the wire grid polarizers may be capable of functioning in an arbitrary wavelength band.

Figure 40:
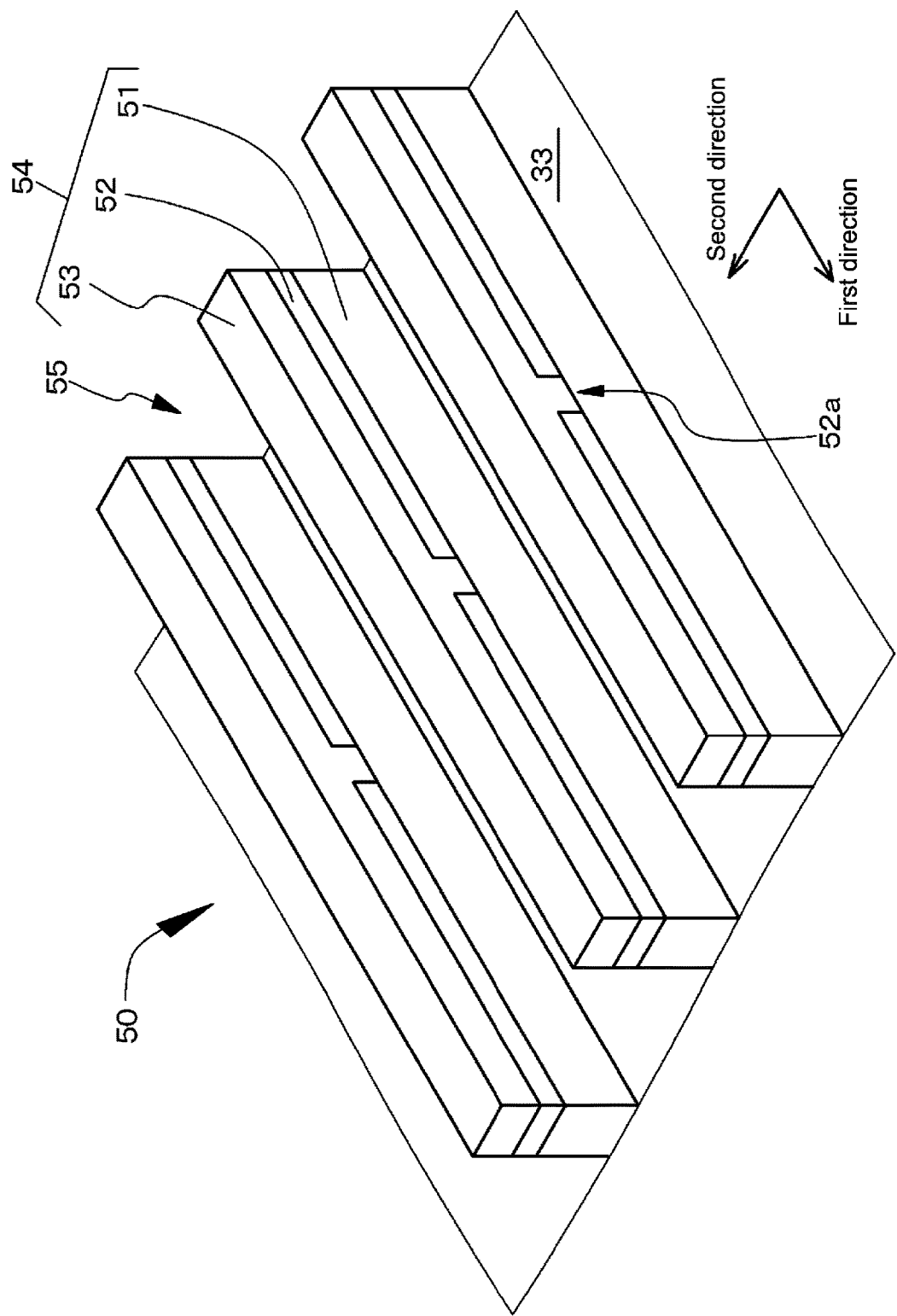
FIG. 40 is a schematic perspective view of another modification of the wire grid polarizer for the photoelectric conversion device in the solid-state imaging apparatus according to Embodiment 1.

Further, as illustrated in the schematic perspective view of FIG. 40, in another modification of the wire grid polarizer for the photoelectric conversion device in the solid-state imaging apparatus according to Embodiment 1, the insulating film 52 may be partially cut out, and the light reflecting layer 51 and the light absorbing layer 53 may be in contact with each other through intermediation of this cutout portion 52a of the insulating film 52.

When necessary, a groove portion filled with an insulating material or a light blocking material (kind of device separation region) and extended from the substrate to a bottom of the wire grid polarizer may be formed at an edge portion of the photoelectric conversion device. As examples of the insulating material, the materials for the insulating films (insulating-film forming layers) and the interlayer-insulating layers may be mentioned. As examples of the light blocking material, the materials for the above-described light blocking film 24 may be mentioned. When such a groove portion is formed, degradation in sensitivity, polarization crosstalk, and decrease in extinction ratio can be prevented (or alternatively, reduced).

Figure 41:
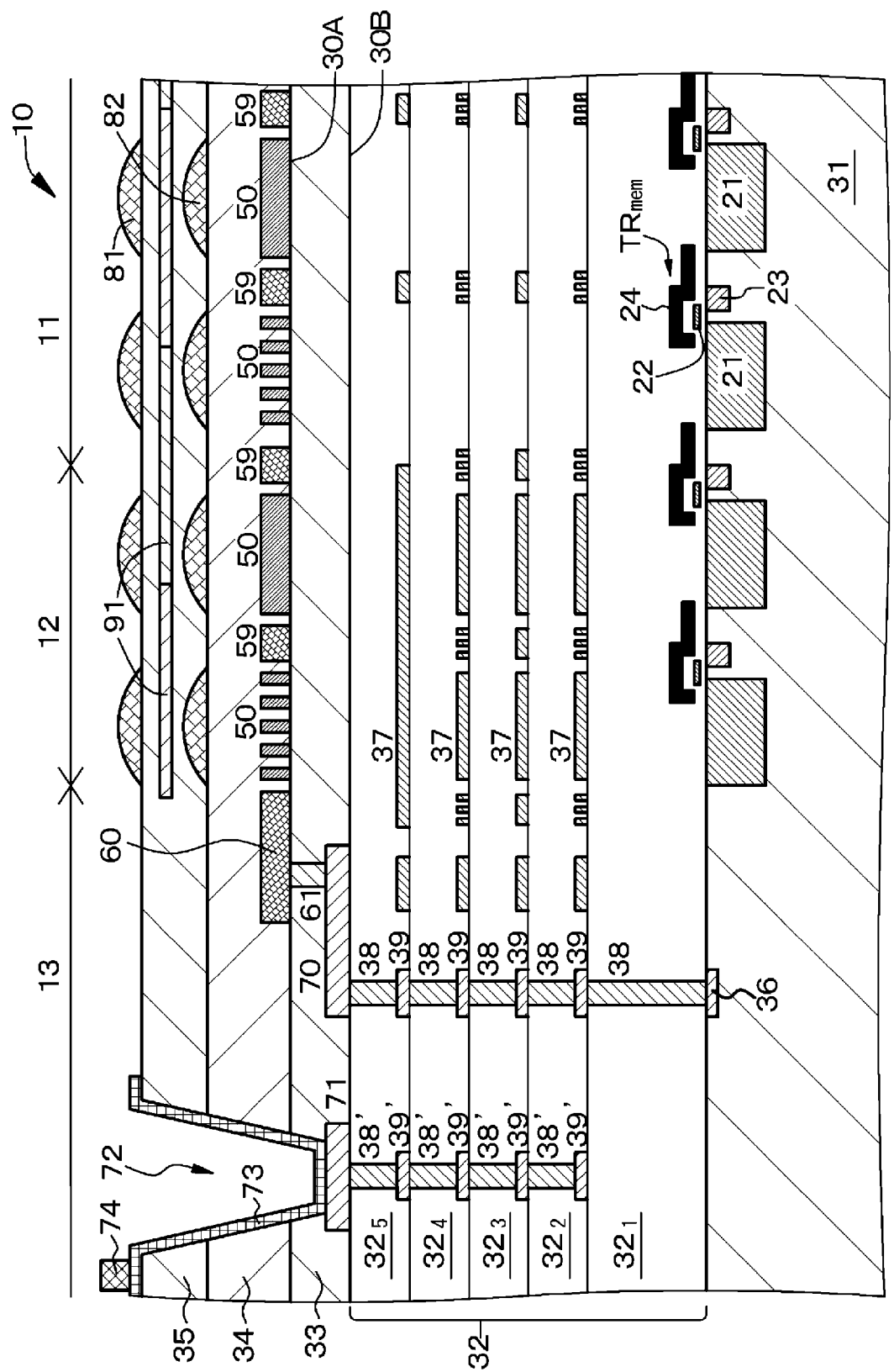
FIG. 41 is schematic partial cross-sectional view of a modification of the solid-state imaging apparatus according to Embodiment 1.
Figure 42:
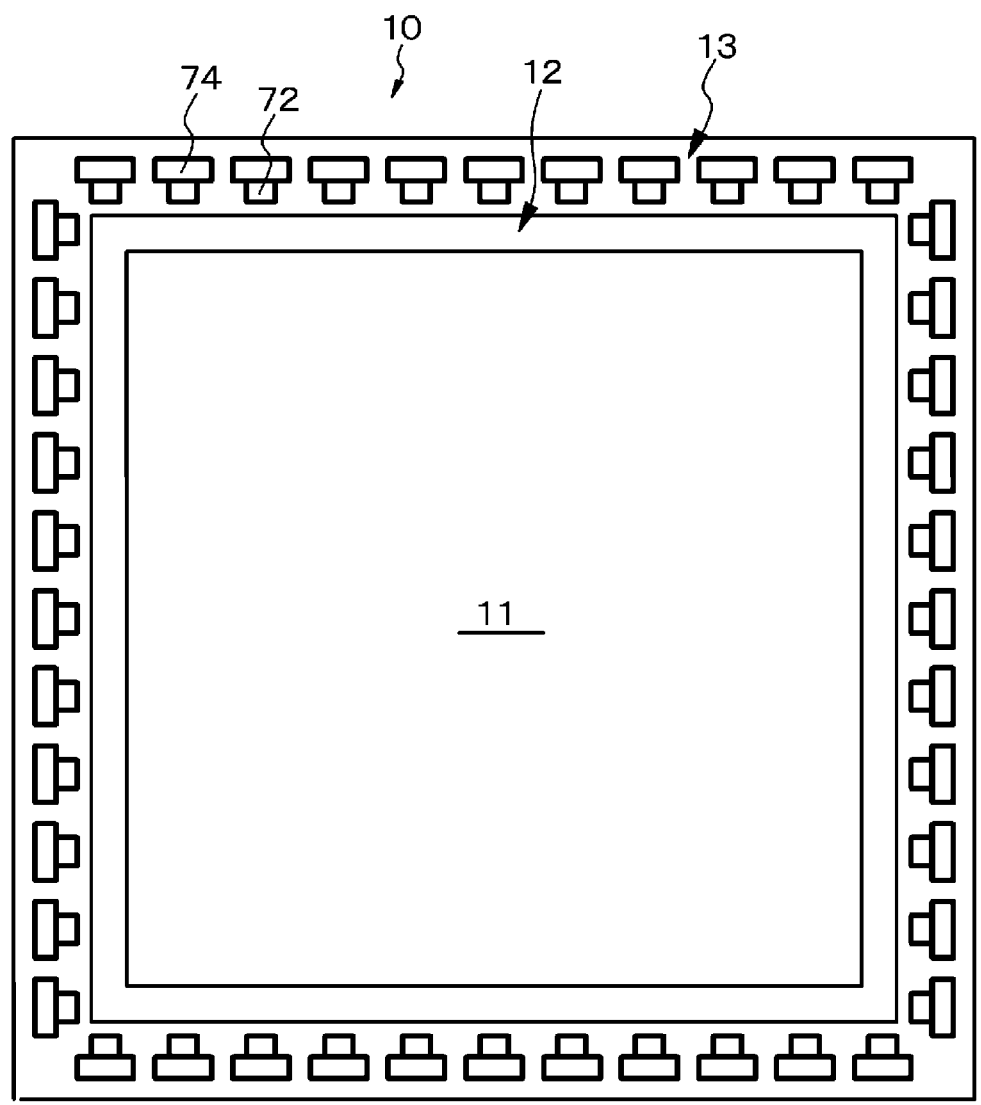
FIG. 42 is a schematic view of another arrangement of the valid pixel region, the optical black region, and the peripheral region in the modification of the solid-state imaging apparatus according to Embodiment 1, the modification being illustrated in FIG. 41.
Figure 43:
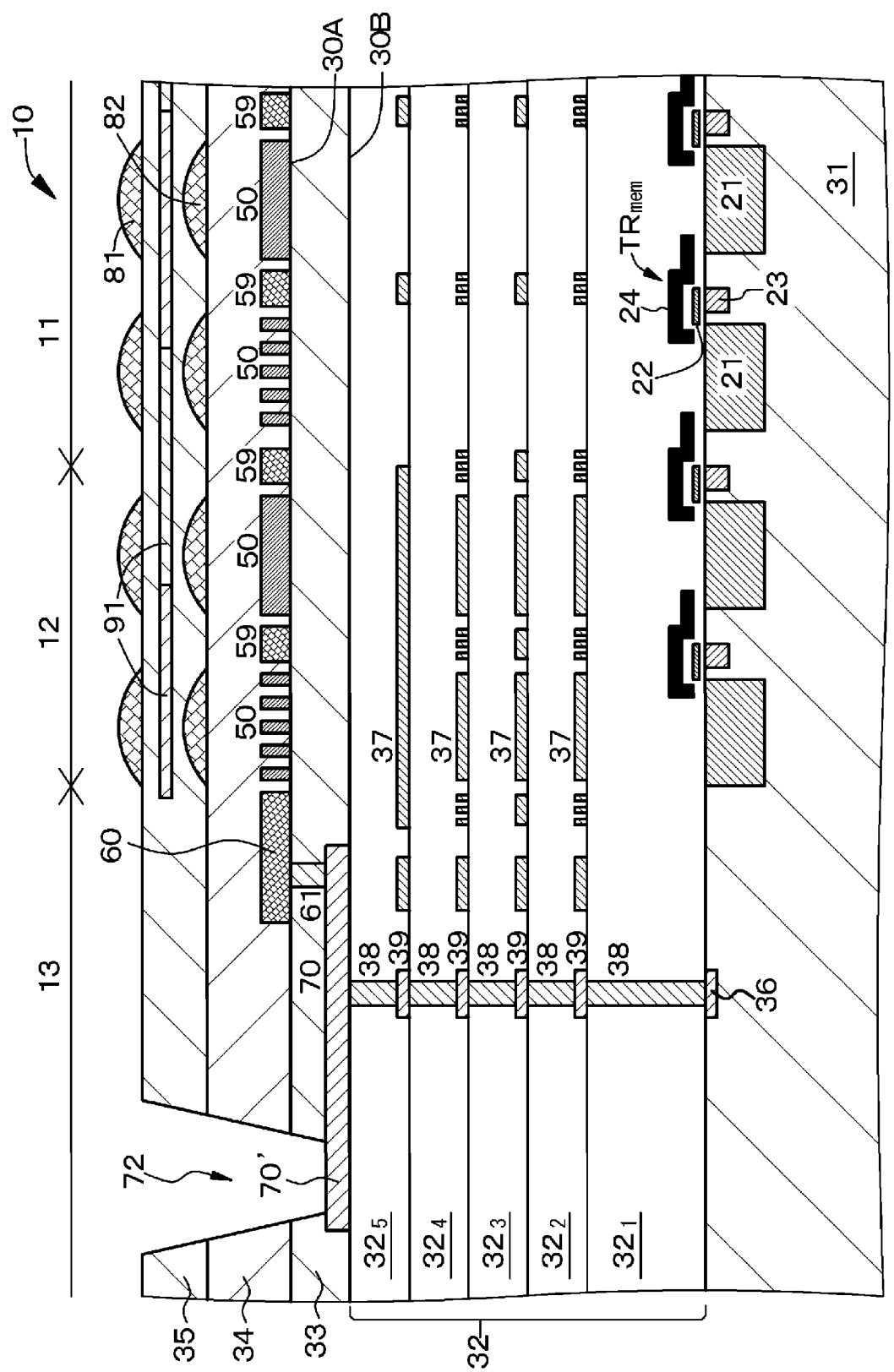
FIG. 43 is a schematic partial cross-sectional view of another modification of the solid-state imaging apparatus according to Embodiment 1.
Figure 44:
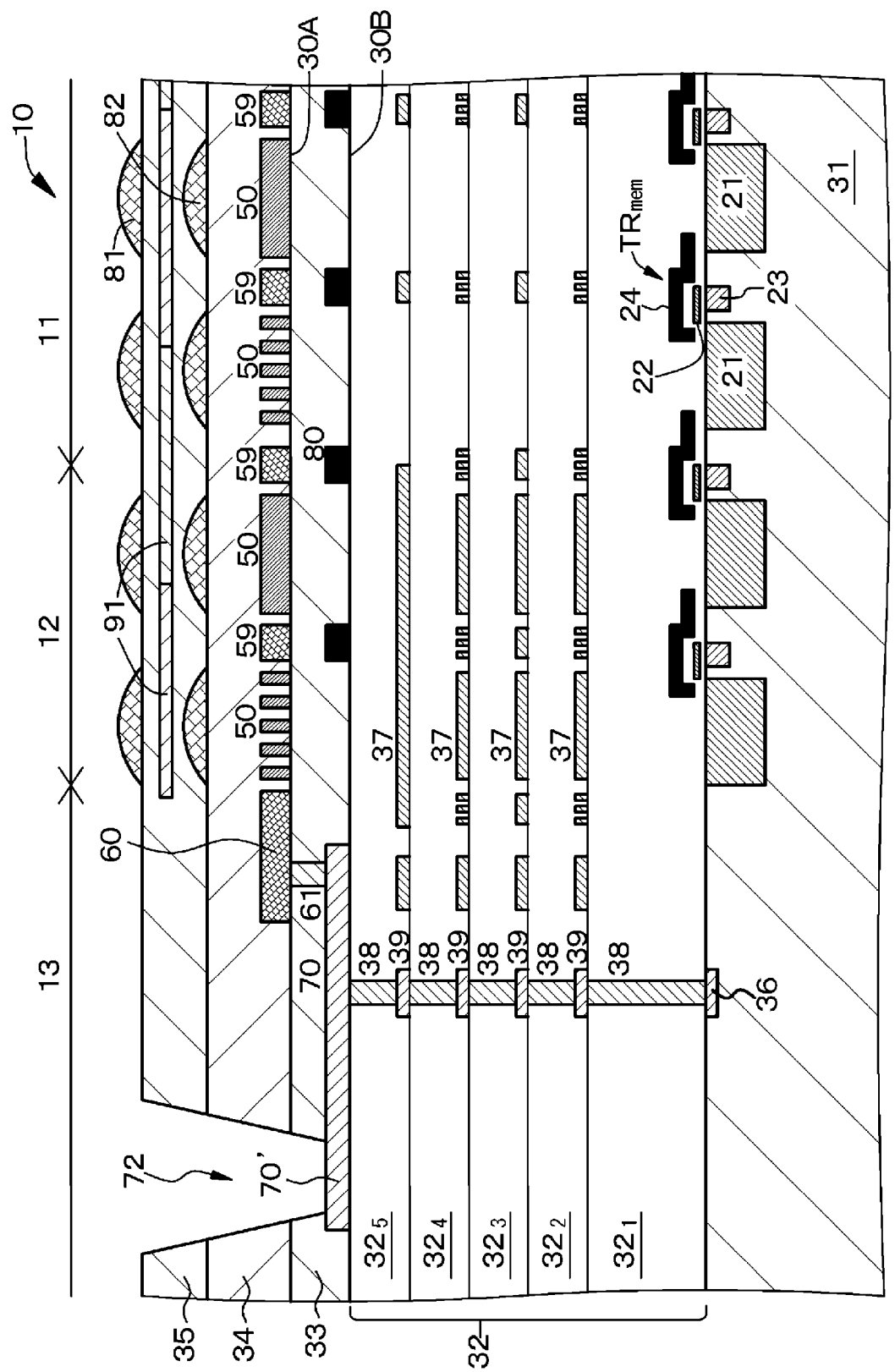
FIG. 44 is a schematic partial cross-sectional view of a modification of the solid-state imaging apparatus according to Embodiment 2.
Figure 45:
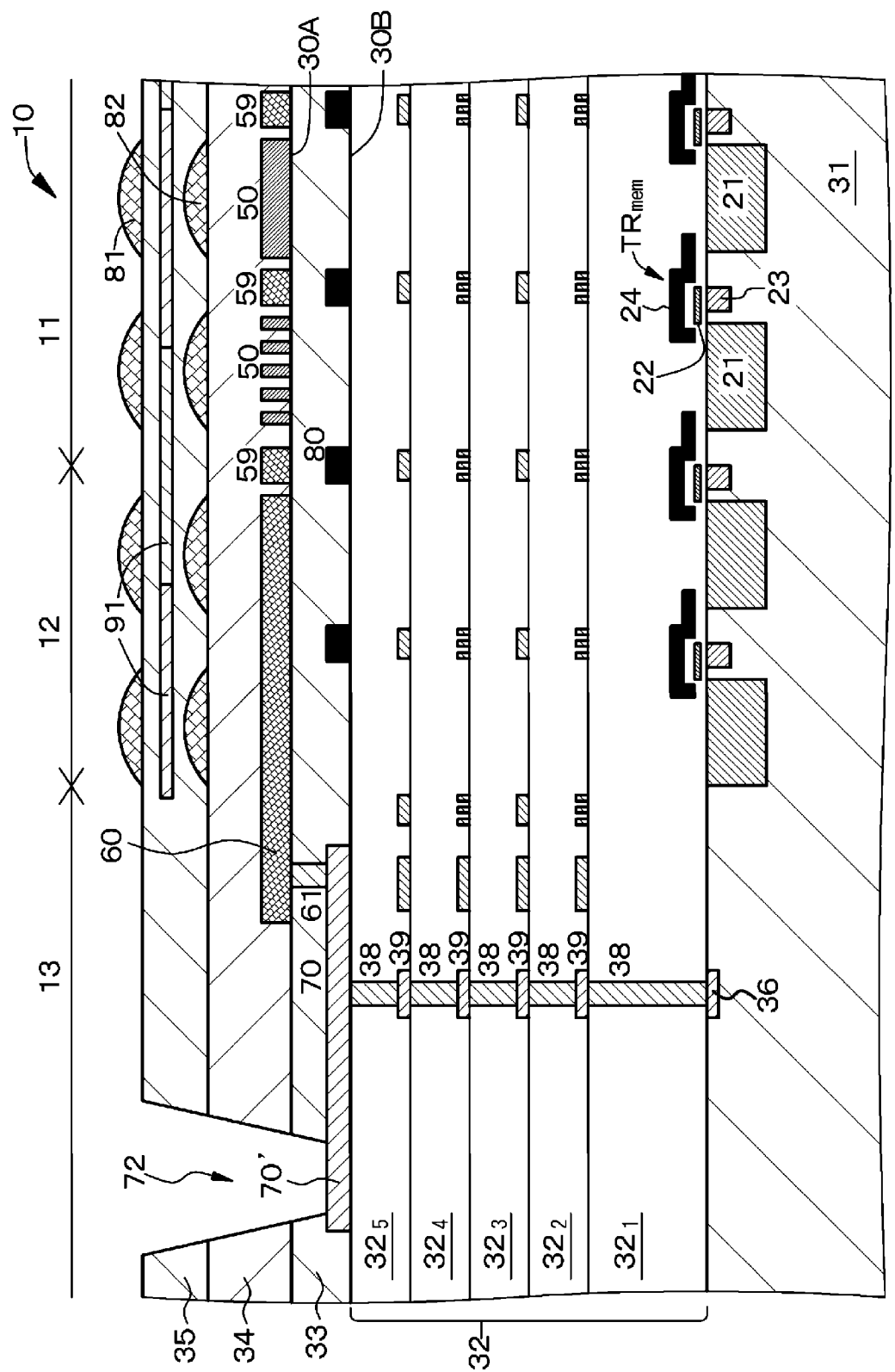
FIG. 45 is a schematic partial cross-sectional view of a modification of the solid-state imaging apparatus according to Embodiment 3.
Figure 46:
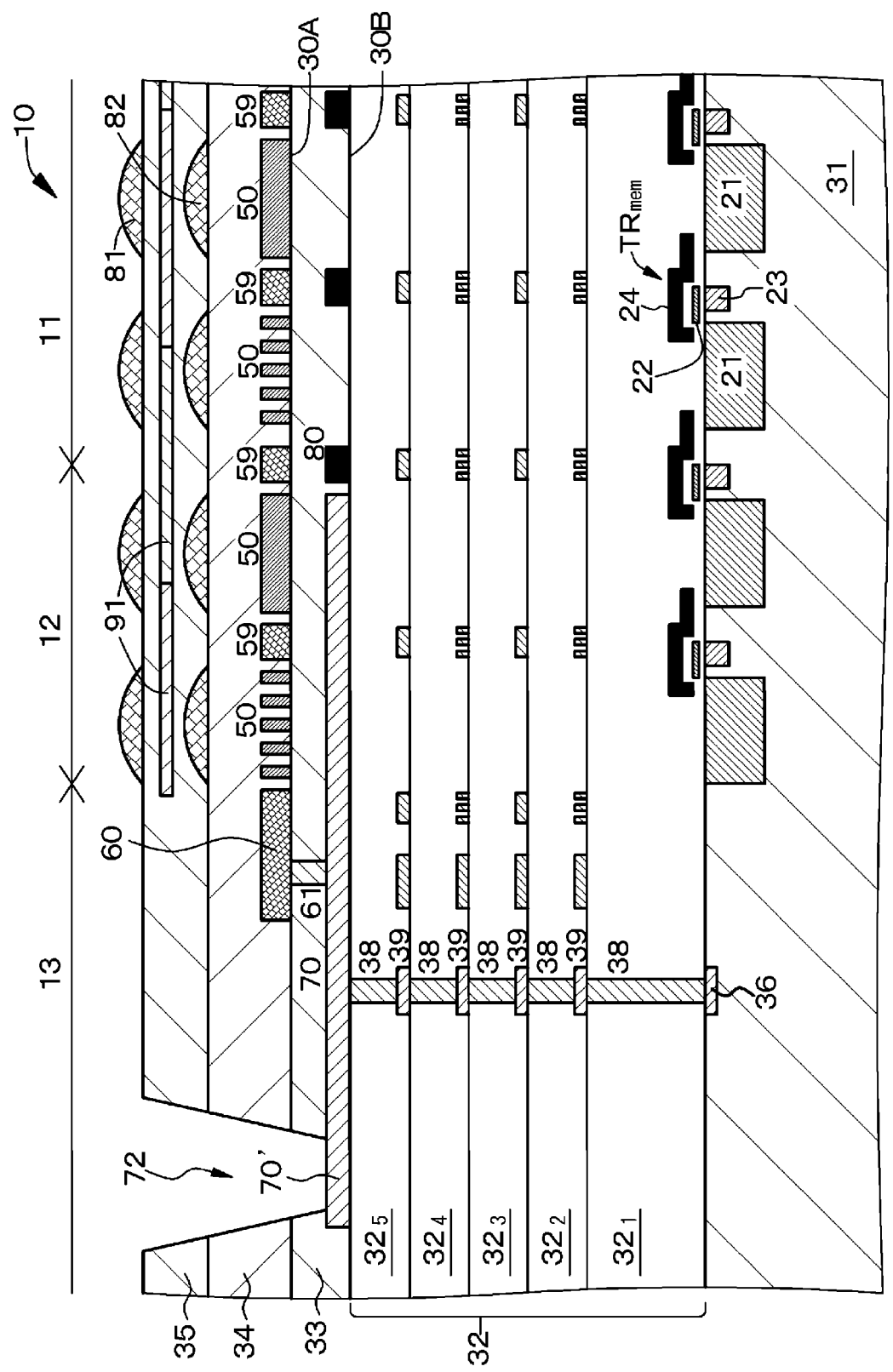
FIG. 46 is a schematic partial cross-sectional view of a modification of the solid-state imaging apparatus according to Embodiment 4.
Figure 47:
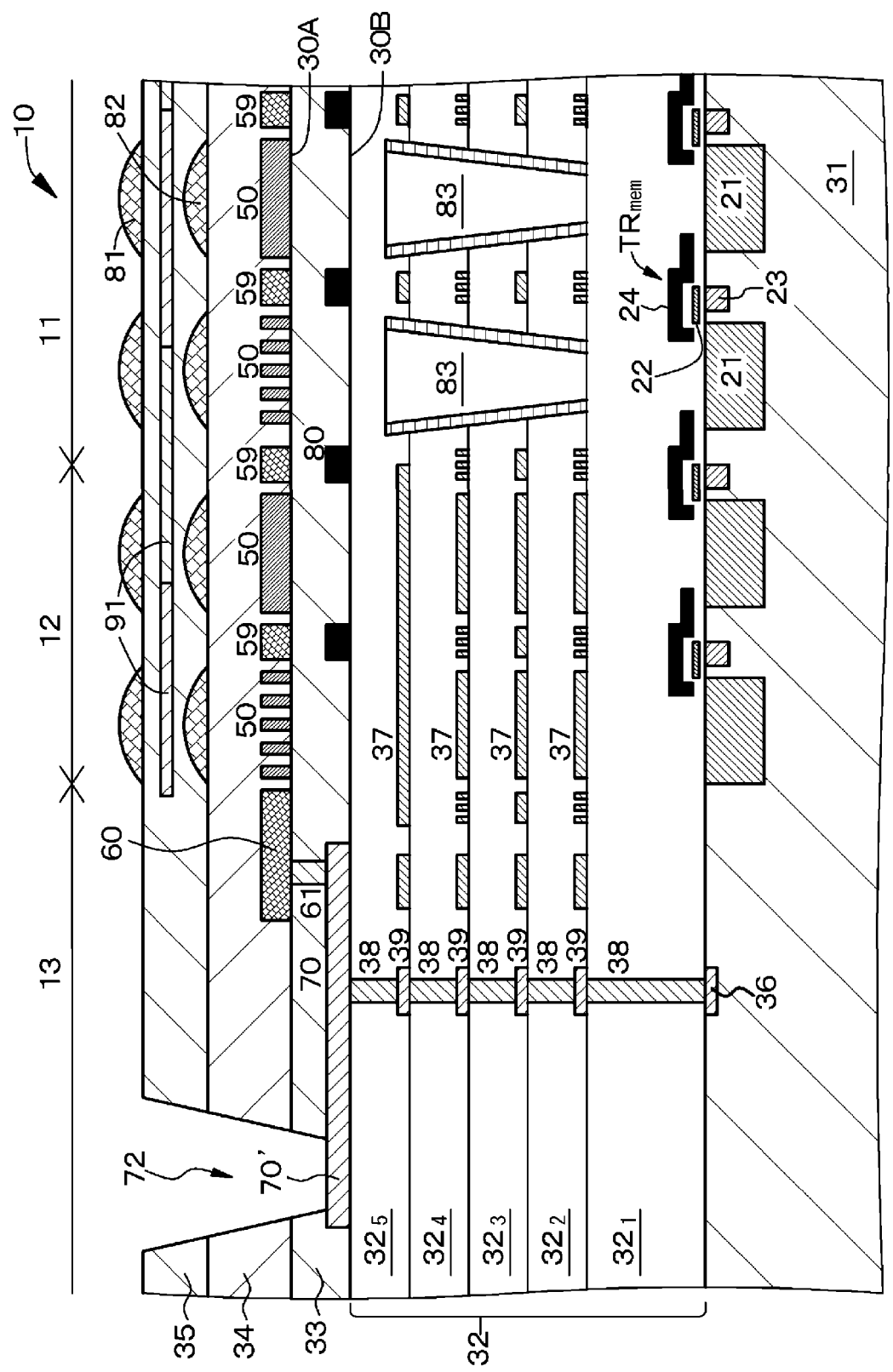
FIG. 47 is a schematic partial cross-sectional view of a modification of the solid-state imaging apparatus according to Embodiment 5.
Figure 48:
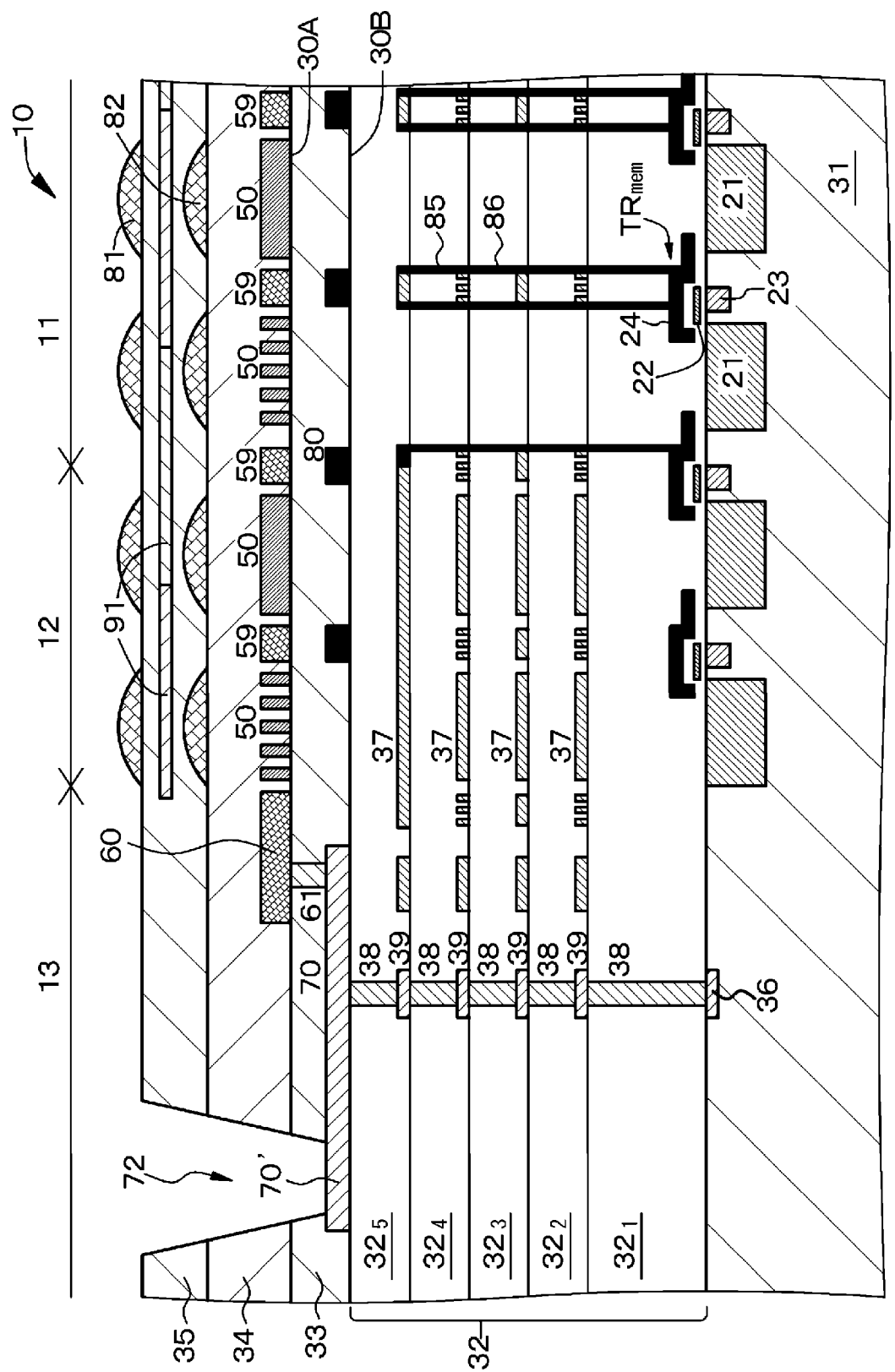
FIG. 48 is a schematic partial cross-sectional view of a modification of the solid-state imaging apparatus according to Embodiment 6.
Figure 49:
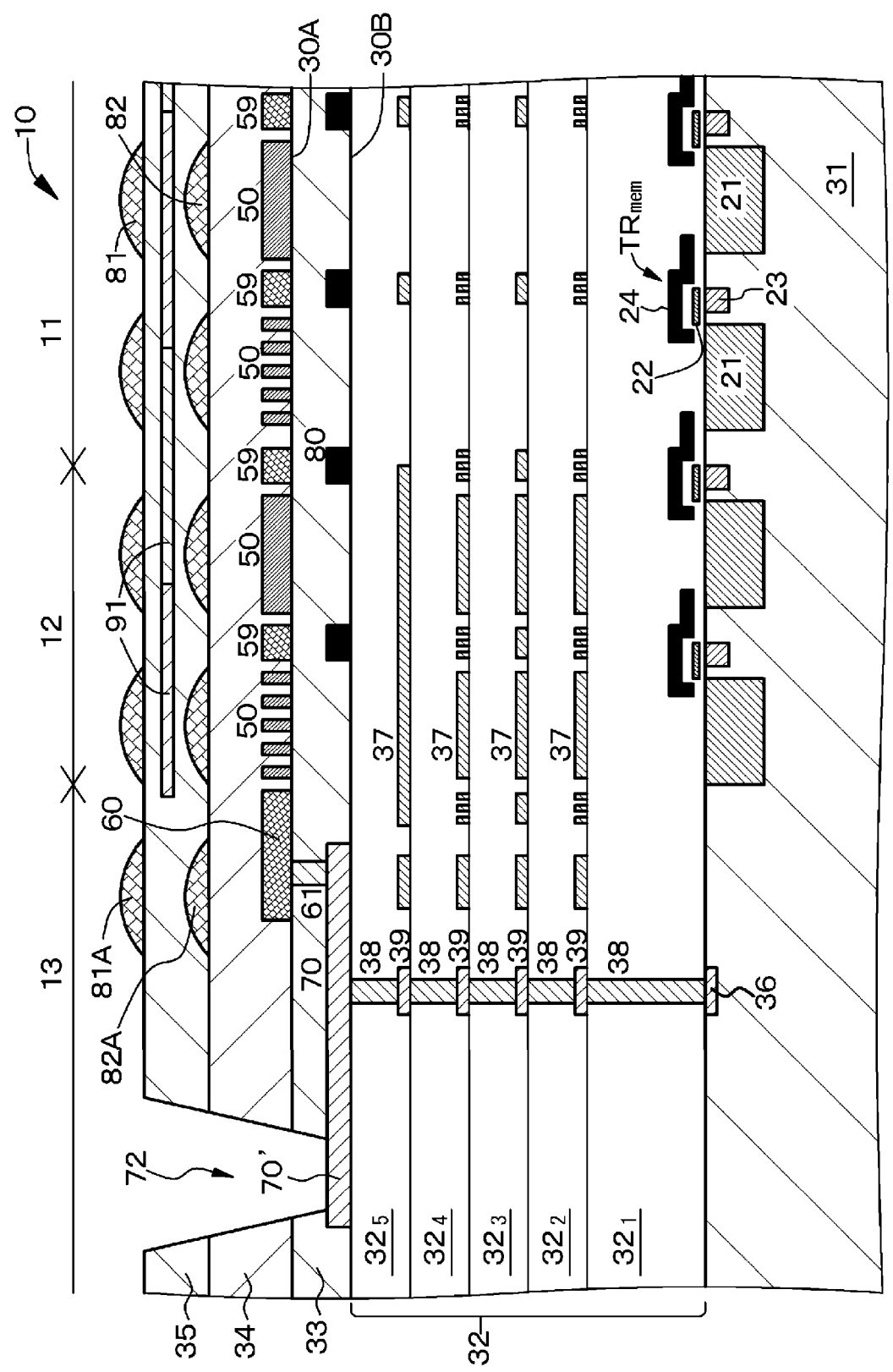
FIG. 49 is a schematic partial cross-sectional view of a modification of the solid-state imaging apparatus according to Embodiment 7.
Figure 50:
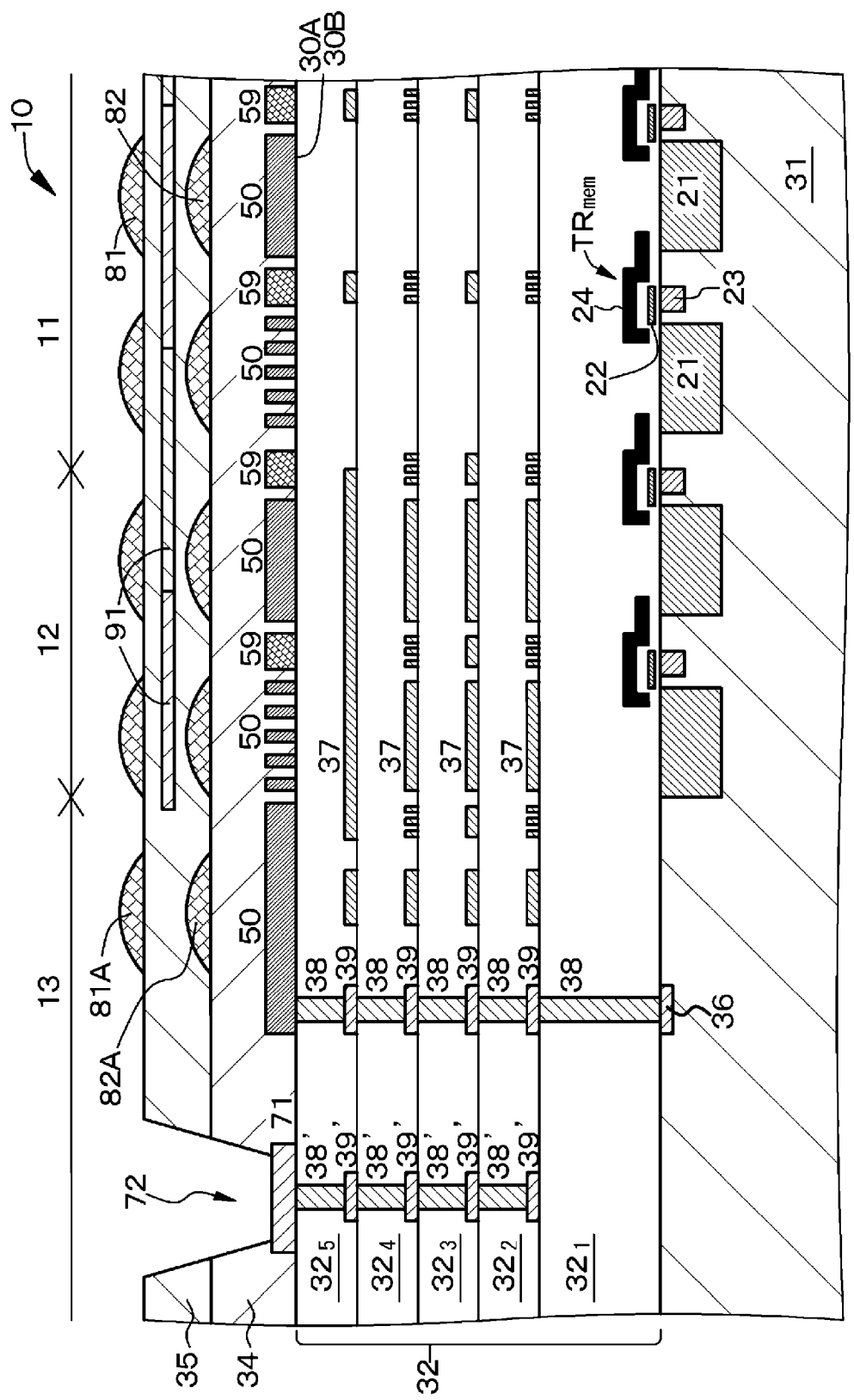
FIG. 50 is a schematic partial cross-sectional view of another modification of the solid-state imaging apparatus according to Embodiment 8.

As illustrated in the schematic partial cross-sectional view of FIG. 41, in a modification of the solid-state imaging apparatus according to Embodiment 1 (first modification of Embodiment 1), a conductive layer 73 may be formed over the pad portion 71 exposed at the bottom surface of the opening portion 72 and the third planarizing film 35, and another pad portion 74 may be arranged on a part of the conductive layer 73 on the third planarizing film 35. FIG. 42 schematically illustrates an arrangement of the valid pixel region, the optical black region, and the peripheral region in the solid-state imaging apparatus according to the first modification of Embodiment 1. In this case, the opening portions 72 may be filled, for example, with a resin. Further, the conductive layer 73 may be made, for example, of copper (Cu), aluminum (Al), tungsten (W), or chromium (Cr). The first modification of Embodiment 1 is applicable to the solid-state imaging apparatuses described in Embodiment 2 to Embodiment 7. Alternatively, as illustrated in the schematic partial cross-sectional view of FIG. 43, in another modification of the solid-state imaging apparatus according to Embodiment 1 (second modification of Embodiment 1), the pad portion may be formed of an extended portion 70' of the conductor topmost layer 70. FIG. 44, FIG. 45, FIG. 46, FIG. 47, FIG. 48, and FIG. 49 illustrate examples in which the second modification of Embodiment 1 is applied to the solid-state imaging apparatuses described in Embodiment 2 to Embodiment 7. Further, FIG. 50 is a schematic partial cross-sectional view of a solid-state imaging apparatus according to Embodiment 8, to which Embodiment 7 is applied.

Figure 53:
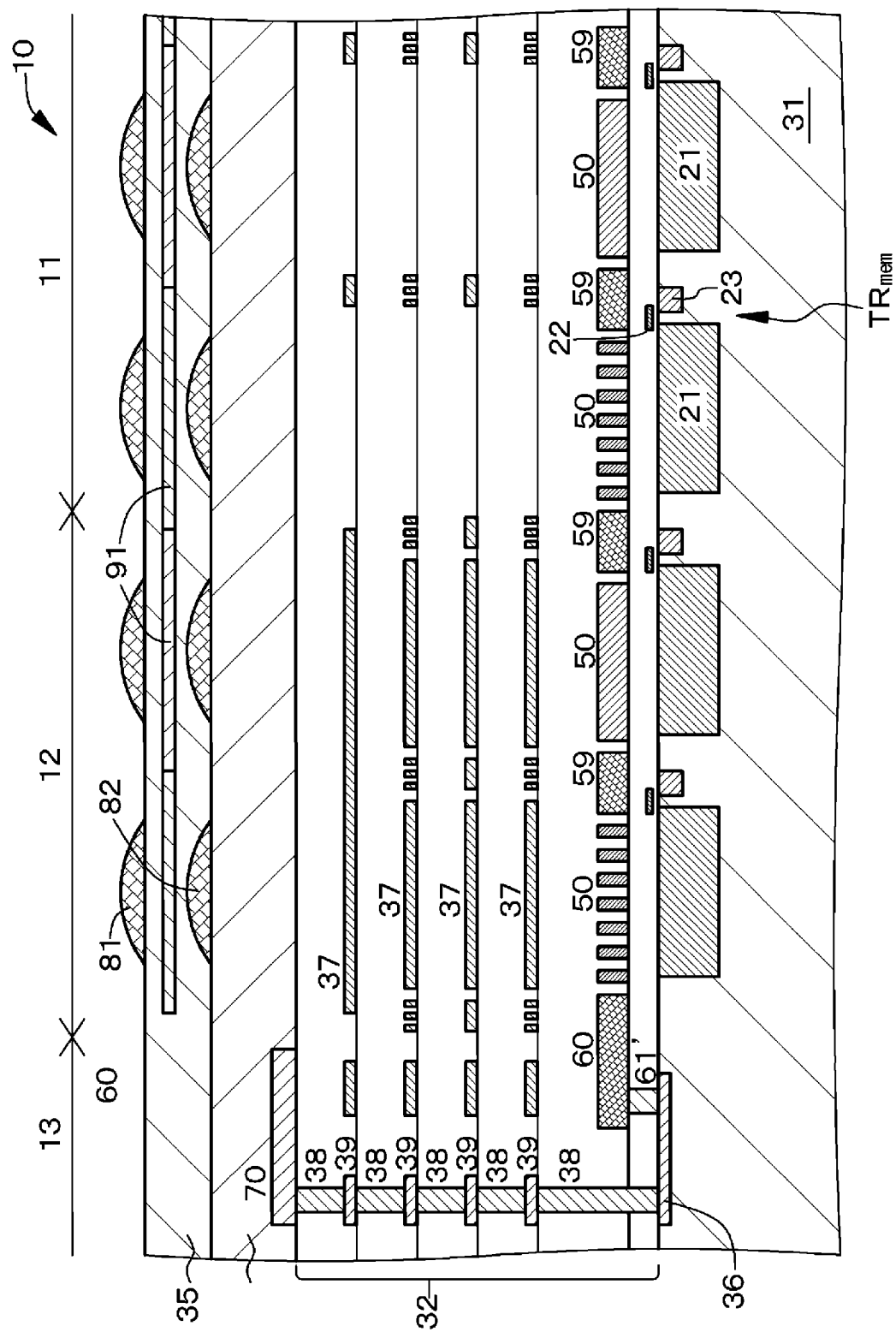
FIG. 53 is a schematic partial cross-sectional view of a solid-state imaging apparatus according to a third embodiment of the present disclosure.
Figure 54:
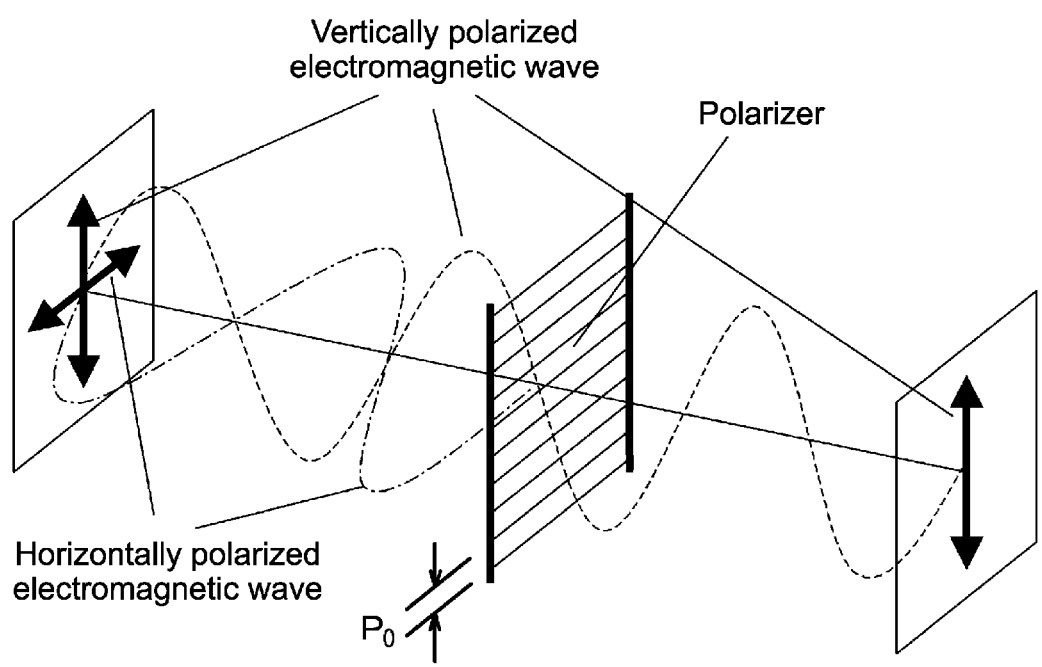
FIG. 54 is a conceptual view for illustrating, for example, light that is transmitted through a wire grid polarizer.

Alternatively, when necessary, as illustrated in the schematic partial cross-sectional view of FIG. 53, in a solid-state imaging apparatus according to a third embodiment, the wire grid polarizers 50 and 50' may be arranged at the same level as that of the light blocking films 24, and the light blocking films 24 may be replaced with the frame portions 59. In other words, this solid-state imaging apparatus includes the photoelectric conversion device group formed in the semiconductor substrate 31 and including the photoelectric conversion devices 21 and 21' arrayed in two-dimensional matrix in the valid pixel region 11, and the wire grid polarizers 50 formed on the semiconductor substrate 31 at positions corresponding to the photoelectric conversion devices 21 and 21' on the light incidence side of the photoelectric conversion devices and 50'.

The memory units $TR_{mem}$ connected to the photoelectric conversion devices 21 and 21' and configured to temporarily store the charges that are generated in the photoelectric conversion devices 21 and 21' are formed on the semiconductor substrate 31.

The light blocking portions are arranged on the memory units $TR_{mem}$.

The light blocking portions are formed of the frame portions 59 that connect ones of the wire grid polarizers 50 and 50' and other ones of the wire grid polarizers 50 and 50' to each other and do not allow light to be transmitted therethrough.

A predetermined potential is applied to the wire grid polarizers 50 and 50'. Alternatively, the predetermined potential may be applied to the wire grid polarizers 50 and 50' through intermediation of the wire-grid-polarizer extended portion 60 extended from the wire grid polarizers 50 and 50'. Specifically, the wire grid polarizers 50 and 50' are connected through a contact hole portion 61' (or through intermediation of the wire-grid-polarizer extended portion 60 and through the contact hole portion 61') to the wiring portion 36 formed in the semiconductor substrate 31, and, for example, grounded. The wiring layers 37 and other components are formed in a region located above the wire grid polarizers 50 and 50' and the wire-grid-polarizer extended portion 60. When the wire grid polarizers 50 and 50' are arranged near (directly on) the photoelectric conversion devices 21 and 21' in this way, the wire grid polarizers 50 and 50' can be arranged near convergence points. Further, increase in load on wiring of the peripheral circuit in the peripheral region 13 can be suppressed, and the number of steps can be reduced.

In addition, in the cases described as examples in Embodiments, the photoelectric conversion devices (imaging devices) of Embodiments of the present disclosure are applied to a CMOS solid-state imaging apparatus in which unit pixels configured to detect signal charges corresponding to intensities of incident light beams as physical quantities are arranged in rows and columns. However, the photoelectric conversion devices are applicable not only to the CMOS solid-state imaging apparatus, but also to a CCD solid-state imaging apparatus. In the latter case, the signal charges are transferred in a vertical direction by CCD-type vertical transfer registers, transferred in a horizontal direction by CCD-type horizontal transfer registers, amplified into pixel signals (image signals), and then output. Further, the photoelectric conversion devices (imaging devices) of Embodiments of the present disclosure are not limited to general solid-state imaging apparatuses of a column type in which the pixels are formed in two-dimensional matrix and the column-signal processing circuits are arranged respectively for pixel columns. Still further, when unnecessary, the selection transistors may be omitted.

In addition, the photoelectric conversion devices (imaging devices) of Embodiments of the present disclosure are applicable not only to solid-state imaging apparatuses configured to generate an image of a detected distribution of intensities of visible incident light beams, but also to solid-state imaging apparatuses configured to generate an image of a distribution of intensities of incident infrared rays, X-rays, or particles. More broadly, the photoelectric conversion devices (imaging devices) of Embodiments of the present disclosure are applicable to general solid-state imaging apparatuses (physical-quantity-distribution detection apparatuses) such as a fingerprint detection sensor, which are configured to generate an image of a detected distribution of other physical quantities such as pressure and capacitance.

In addition, the photoelectric conversion devices (imaging devices) of Embodiments of the present disclosure are applicable only to solid-state imaging apparatuses configured to sequentially scan unit pixels in an imaging region on a row-by-row basis and read out pixel signals from the unit pixels, but also to X-Y address type solid-state imaging apparatuses configured to select arbitrary pixels on a pixel-by-pixel basis and read out pixel signals on the pixel-by-pixel basis from the selected pixels. The solid-state imaging apparatus may be formed of a single chip, or may be provided as a module having an imaging function, which includes a package of the imaging region and one of the drive circuit and an optical system.

In addition, the photoelectric conversion devices (imaging devices) of Embodiments of the present disclosure are applicable not only to the solid-state imaging apparatuses, but also to other imaging apparatuses. The other imaging apparatuses refer to camera systems such as a digital still camera and a camcorder, and electronic apparatuses having the imaging function, such as a mobile phone. As other examples of the other imaging apparatuses, there may be mentioned a camera module that is mounted to these electronic apparatuses.

Figure 51:
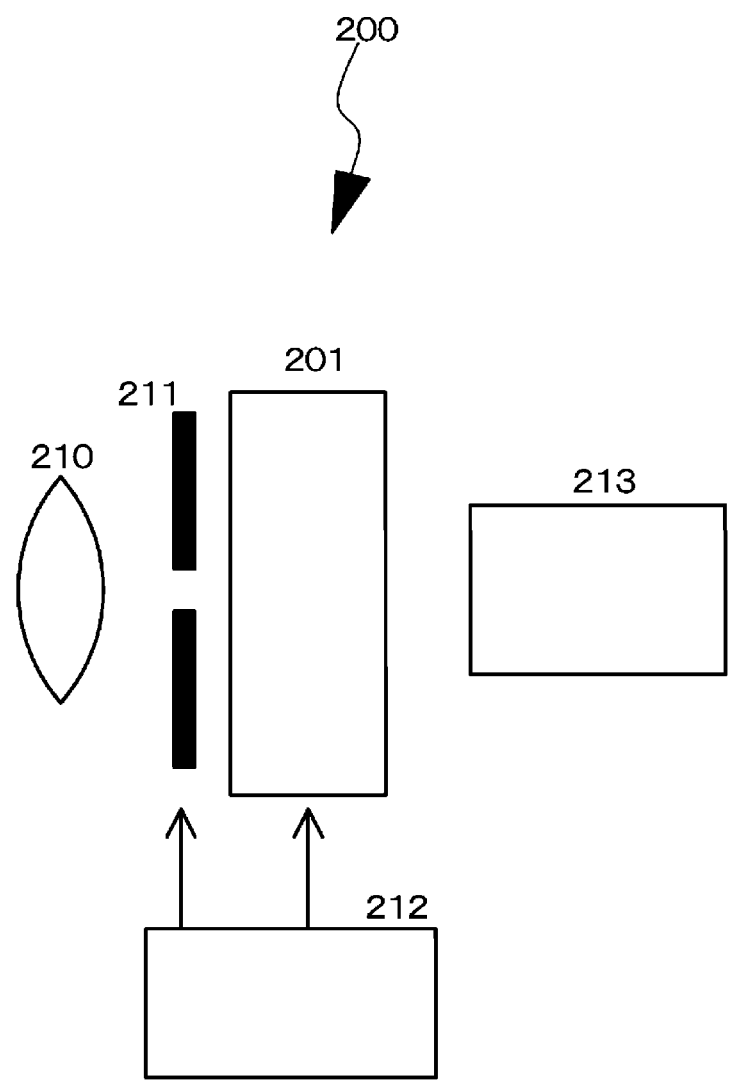
FIG. 51 is a conceptual diagram of an example in which a solid-state imaging apparatus according to an embodiment of the present disclosure is used in an electronic apparatus (camera).

FIG. 51 is a conceptual diagram of an example in which a solid-state imaging apparatus 201 according to an embodiment of the present disclosure is used in an electronic apparatus (camera) 200. The electronic apparatus 200 includes the solid-state imaging apparatus 201, an optical lens 210, a shutter apparatus 211, a drive circuit 212, and a signal processing circuit 213. The optical lens 210 is configured to form an image of image light (incident light) from a subject on an imaging surface of the solid-state imaging apparatus 201. With this, in the solid-state imaging apparatus 201, signal charges are accumulated for a predetermined period. The shutter apparatus 211 is configured to control a light irradiation period and a light blocking period with respect to the solid-state imaging apparatus 201. The drive circuit 212 is configured to supply drive signals that control operations of transfer from the solid-state imaging apparatus and a shutter operation by the shutter apparatus 211. In response to the drive signals (timing signals) that are supplied from the drive circuit 212, signals are transferred from the solid-state imaging apparatus 201. The signal processing circuit 213 is configured to execute various signal processes. Video signals that have been subjected to the signal processes are stored in a storage medium such as a memory, or output to a monitor. In this way, in the solid-state imaging apparatus 201 of the electronic apparatus 200, a pixel size can be reduced, and transfer efficiency can be increased. As a result, pixel characteristics of the electronic apparatus 200 are enhanced. The electronic apparatus 200 to which the solid-state imaging apparatus 201 is applicable is not limited to the camera. The solid-state imaging apparatus 201 is applicable also to imaging apparatuses such as the digital still camera and a camera module for mobile apparatuses such as the mobile phone.

Note that, the present disclosure may also provide the following configurations.

[A01] <<Solid-State Imaging Apparatus: First Embodiment>>

A solid-state imaging apparatus, including:
a photoelectric conversion device group that is formed in a semiconductor substrate and includes photoelectric conversion devices arrayed in two-dimensional matrix in a valid pixel region; and
wire grid polarizers formed above the semiconductor substrate at positions corresponding to the photoelectric conversion devices on a light incidence side of the photoelectric conversion devices,
a conductor topmost layer being arranged in a peripheral region located on an outer side of the valid pixel region,
the wire grid polarizers being formed on a first surface,
the conductor topmost layer being formed on a second surface,
the first surface being located above the second surface,
the wire grid polarizers being connected to the conductor topmost layer through intermediation of a wire-grid-polarizer extended portion.

[A02] The solid-state imaging apparatus according to Item [A01], in which a predetermined potential is applied to the conductor topmost layer.

[A03] The solid-state imaging apparatus according to Item [A01] or [A02], in which the wire-grid-polarizer extended portion has a structure that blocks light transmission therethrough.

[A04] The solid-state imaging apparatus according to any one of Items [A01] to [A03], further including
light blocking portions formed above regions among the photoelectric conversion devices in the photoelectric conversion device group, in which
the light blocking portions are located on the second surface (in a second plane).

[A05] The solid-state imaging apparatus according to Item [A04], in which
the light blocking portions each have the same configuration as a configuration of the conductor topmost layer.

[A06] The solid-state imaging apparatus according to any one of Items [A01] to [A05], further including
an optical black region arranged between the valid pixel region and the peripheral region, in which
the wire-grid-polarizer extended portion is formed across from the optical black region and the peripheral region, and
the optical black region is shielded from light by the wire-grid-polarizer extended portion.

[A07] The solid-state imaging apparatus according to any one of Items [A01] to [A05], further including
an optical black region arranged between the valid pixel region and the peripheral region, in which
the wire grid polarizers are formed in both the valid pixel region and the optical black region.

[A08] The solid-state imaging apparatus according to Item [A07], in which the optical black region is shielded from light by the conductor topmost layer.

[A09] The solid-state imaging apparatus according to any one of Items [A01] to [A08], further including
on-chip microlenses that are formed on both a top side of the valid pixel region and a top side of the peripheral region.

[A10] The solid-state imaging apparatus according to any one of Items [A01] to [A09], further including
memory units that are formed on the semiconductor substrate, connected to the photoelectric conversion devices, and temporarily store charges that are generated in the
photoelectric conversion devices.

[A11] The solid-state imaging apparatus according to any one of Items [A01] to [A10], in which
the wire grid polarizers are prevented (or alternatively, reduced) from being formed in the peripheral region.

[A12] The solid-state imaging apparatus according to any one of Items [A01] to [A11], further including
a protective film formed over each of the wire grid polarizers, in which
the wire grid polarizers each have a line-and-space structure, and
space portions of each of the wire grid polarizers are empty.

[A13] The solid-state imaging apparatus according to Item [A12], further including
a second protective film formed between each of the wire grid polarizers and the
protective film, in which a relationship
$n_1 > n_2$
is satisfied, where $n_1$ is a refractive index of a material of the protective film, and $n_2$ is
a refractive index of a material of the second protective film.

[A14] The solid-state imaging apparatus according to Item [A13], in which
the protective film is made of SiN, and
the second protective film is made of $SiO_2$ or SiON.

[A15] The solid-state imaging apparatus according to any one of Items [A12] to [A14], further including
a third protective film formed at least over side surfaces of line portions of each of the wire grid polarizers, the side surfaces facing the space portions of each of the wire grid polarizers.

[A16] The solid-state imaging apparatus according to any one of Items [A12] to [A15], further including
frame portions configured to surround the wire grid polarizers, in which
the frame portions and the line portions of each of the wire grid polarizers are coupled to each other, and
the frame portions each have the same structure as a structure of the line portions of each of the wire grid polarizers.

[A17] The solid-state imaging apparatus according to any one of Items [A12] to [A16], in which
the line portions of each of the wire grid polarizers are each formed of a laminated body including, from a side on which the photoelectric conversion devices are arrayed,
a light reflecting layer made of a first conductive material,
an insulating film, and
a light absorbing layer made of a second conductive material.

[A18] The solid-state imaging apparatus according to Item [A17], in which
the light reflecting layer includes light reflecting layers that are common to each other for all of the photoelectric conversion devices, and
the light absorbing layer includes light absorbing layers that are common to each other for all of the photoelectric conversion devices.

[A19] The solid-state imaging apparatus according to Item [A17] or [A18], in which the insulating film is formed all over a top surface of the light reflecting layer, and
the light absorbing layer is formed all over a top surface of the insulating film.
[A20] The solid-state imaging apparatus according to any one of Items [A17] to [A19], further including
a base insulating layer that is formed under the light reflecting layer.
[A21] The solid-state imaging apparatus according to any one of Items [A17] to [A20], in which
the insulating film is partially cut out, and
the light reflecting layer and the light absorbing layer are in contact with each other through intermediation of a cutout portion of the insulating film.
[B01]<<Solid-State Imaging Apparatus: Second Embodiment>>
A solid-state imaging apparatus, including:
a photoelectric conversion device group that is formed in a semiconductor substrate and includes photoelectric conversion devices arrayed in two-dimensional matrix in a valid pixel region; and
wire grid polarizers formed above the semiconductor substrate at positions corresponding to the photoelectric conversion devices on a light incidence side of the photoelectric conversion devices,
a pad portion being arranged in a peripheral region located on an outer side of the valid pixel region,
the wire grid polarizers and the pad portion being formed in the same layer,
the wire grid polarizers and the pad portion being electrically connected to each other.
[B02] The solid-state imaging apparatus according to Item [B01], further including light blocking portions formed above regions among the photoelectric conversion devices in the photoelectric conversion device group, in which
the light blocking portions are formed of frame portions that connect the wire grid polarizers to one another, the frame portions blocking light transmission therethrough.
[B03] The solid-state imaging apparatus according to Item [B01] or [B02], further including
an optical black region arranged between the valid pixel region and the peripheral region, in which
the wire grid polarizers are formed in both the valid pixel region and the optical black region, and
the optical black region is shielded from light by the wire grid polarizers.
[B04] The solid-state imaging apparatus according to any one of Items [B01] to [B03], further including
on-chip microlenses that are formed on both a top side of the valid pixel region and a top side of the peripheral region.
[B05] The solid-state imaging apparatus according to any one of Items [B01] to [B04], further including
memory units that are formed on the semiconductor substrate, connected to the photoelectric conversion devices, and temporarily store charges that are generated in the photoelectric conversion devices.
[B06] The solid-state imaging apparatus according to any one of Items [B01] to [B05], in which
the wire grid polarizers are prevented (or alternatively, reduced) from being formed in the peripheral region.
[B07] The solid-state imaging apparatus according to any one of Items [B01] to [B06], further including
a protective film formed over each of the wire grid polarizers, in which
the wire grid polarizers each have a line-and-space structure, and
space portions of each of the wire grid polarizers are empty.
[B08] The solid-state imaging apparatus according to Item [B07], further including a second protective film formed between each of the wire grid polarizers and the protective film, in which a relationship
$n_1 > n_2$
is satisfied, where $n_1$ is a refractive index of a material of the protective film, and $n_2$ is a refractive index of a material of the second protective film.
[B09] The solid-state imaging apparatus according to Item [B08], in which
the protective film is made of SiN, and
the second protective film is made of $SiO_2$ or SiON.
[B10] The solid-state imaging apparatus according to any one of Items [B07] to [B09], further including
a third protective film formed at least over side surfaces of line portions of each of the wire grid polarizers, the side surfaces facing the space portions of each of the wire grid polarizers.
[B11] The solid-state imaging apparatus according to any one of Items [B07] to [B10], further including
frame portions configured to surround the wire grid polarizers, in which
the frame portions and the line portions of each of the wire grid polarizers are coupled to each other, and
the frame portions each have the same structure as a structure of the line portions of each of the wire grid polarizers.
[B12] The solid-state imaging apparatus according to any one of Items [B07] to [B11], in which
the line portions of each of the wire grid polarizers are each formed of a laminated body including, from a side on which the photoelectric conversion devices are arrayed,
a light reflecting layer made of a first conductive material,
an insulating film, and
a light absorbing layer made of a second conductive material.
[B13] The solid-state imaging apparatus according to Item [B12], in which
the light reflecting layer includes light reflecting layers that are common to each other for all of the photoelectric conversion devices, and
the light absorbing layer includes light absorbing layers that are common to each other for all of the photoelectric conversion devices.
[B14] The solid-state imaging apparatus according to Item [B12] or [B13], in which
the insulating film is formed all over a top surface of the light reflecting layer, and
the light absorbing layer is formed all over a top surface of the insulating film.
[B15] The solid-state imaging apparatus according to any one of Items [B12] to [B14], further including
a base insulating layer that is formed under the light reflecting layer.
[B16] The solid-state imaging apparatus according to any one of Items [B12] to [B13], in which
the insulating film is partially cut out, and
the light reflecting layer and the light absorbing layer are in contact with each other through intermediation of a cutout portion of the insulating film.

[C01]<<Solid-State Imaging Apparatus: Third Embodiment>>

A solid-state imaging apparatus, including:

a photoelectric conversion device group that is formed in a semiconductor substrate and includes photoelectric conversion devices arrayed in two-dimensional matrix in a valid pixel region; and wire grid polarizers formed on the semiconductor substrate at positions corresponding to the photoelectric conversion devices on a light incidence side of the photoelectric conversion devices, memory units being formed on the semiconductor substrate, the memory units being connected to the photoelectric conversion devices and configured to temporarily store charges that are generated in the photoelectric conversion devices, light blocking portions being arranged on the memory units, the light blocking portions being formed of frame portions that connect the wire grid polarizers to one another and block light transmission therethrough, a predetermined potential being applied to the wire grid polarizers through intermediation of a wire-grid-polarizer extended portion extended from the wire grid polarizers.

[C02] The solid-state imaging apparatus according to Item [C01], in which the wire grid polarizers are connected through intermediation of the wire-grid-polarizer extended portion to a wiring portion formed in the semiconductor substrate.

[D01]<<Imaging Device: First Embodiment>>

An imaging device, comprising:

one or more insulating layers on a substrate;

an effective region including:

a polarization layer in the one or more insulating layers and including one or more polarizers that polarize light; and at least one first photoelectric conversion region in the substrate and that converts incident light polarized by the one or more polarizers into electric charge; and a peripheral region outside the effective region and including:

one or more wiring layers that include a pad portion in a same layer of the one or more insulating layers as the polarization layer.

[D02] The imaging device of Item [D01], further comprising:

an optical black region between the effective region and the peripheral region and including at least one second photoelectric conversion region that converts incident light into electric charge, wherein the pad portion is electrically connected to the polarization layer.

[D03] The imaging device of Item [D02], wherein the polarization layer includes a light blocking portion in the optical black region, wherein the light blocking portion is in a path of light traveling toward the at least one second photoelectric conversion region.

[D04] The imaging device of Item [D01], further comprising:

one or more lens layers having lenses that correspond to the at least one first photoelectric conversion region wherein the one or more lens layers includes an opening in the peripheral region that exposes the pad portion.

[D05] The imaging device of Item [D04], wherein the pad portion is electrically connected to an external circuit via the opening.

[D06] The imaging device of Item [D05], wherein the peripheral region includes a wire bond in the opening that electrically connects the pad portion to the external circuit.

[D07] The imaging device of Item [D06], wherein the peripheral region includes a conductive layer at a bottom of the opening and on at least one sidewall of the one or more lens layers, wherein the conductive layer electrically connects the pad portion to the external circuit.

[D08] The imaging device of Item [D01], further comprising:

at least one waveguide in the one or more insulating layers to guide light toward the at least one first photoelectric conversion region.

[D09] The imaging device of Item [D01], wherein the polarization layer includes a light blocking portion in the peripheral region, wherein the light blocking portion is coupled to a wiring in the substrate that receives a ground voltage.

[D10] The imaging device of Item [D01], further comprising:

at least one memory transistor that includes the at least one first photoelectric conversion region as one of a source and a drain, a gate in the one or more insulating layers, and an impurity region in the substrate as the other one of the source and the drain; and a light blocking portion in the one or more insulating layers and that covers the gate and the impurity region.

[E01]<<Imaging Device: Second Embodiment>>

An imaging device, comprising:

one or more insulating layers on a substrate;

an effective region including:

a polarization layer on a first surface of the one or more insulating layers and including one or more polarizers that polarize light; and at least one first photoelectric conversion region in the substrate and that converts incident light polarized by the one or more polarizers into electric charge; and a peripheral region outside the effective region and including:

a wiring layer that includes a pad portion on a second surface of the one or more insulating layers, wherein the second surface is on a different plane than the first surface.

[E02] The imaging device of Item [E01], further comprising:

an optical black region between the effective region and the peripheral region and including at least one second photoelectric conversion region that converts incident light into electric charge, and wherein the pad portion is electrically connected to the polarization layer.

[E03] The imaging device of Item [E02], wherein the polarization layer includes a first light blocking portion in the optical black region, wherein the light blocking portion is in a path of light traveling toward the at least one second photoelectric conversion region.

[E04] The imaging device of Item [E03], wherein the polarization layer includes a second light blocking portion in the peripheral region, wherein the second light blocking portion is coupled to a wiring in the substrate that receives a ground voltage.

[E05] The imaging device of Item [E04], wherein the first light blocking portion and the second light blocking portion are a contiguous portion of the polarization layer.

[E06] The imaging device of Item [E04], further comprising:
a third light blocking portion in the one or more insulating layers and between the at least one first photoelectric conversion region and the at least one second photoelectric conversion region.

[E07] The imaging device of Item [E06], wherein, in a cross sectional view, the third light blocking portion is closer to the polarization layer than the at least one first photoelectric conversion region.

[E08] The imaging device of Item [E06], wherein, in a cross sectional view, the third light blocking portion is closer to the at least one photoelectric conversion region than the polarization layer.

[F01]<<Electronic Apparatus: First Embodiment>>
An electronic apparatus, comprising:
an imaging device including:
one or more insulating layers on a substrate;
an effective region including:
a polarization layer in the one or more insulating layers and including one or more polarizers that polarize light; and
at least one first photoelectric conversion region in the substrate and that converts incident light polarized by the one or more polarizers into electric charge; and
a peripheral region outside the effective region and including:
one or more wiring layers that include a pad portion in a same layer of the one or more insulating layers as the polarization layer.

[G01]<<Electronic Apparatus: Second Embodiment>>
An electronic apparatus, comprising:
an imaging device including:
one or more insulating layers on a substrate;
an effective region including:
a polarization layer on a first surface of the one or more insulating layers and including one or more polarizers that polarize light; and
at least one first photoelectric conversion region in the substrate and that converts incident light polarized by the one or more polarizers into electric charge; and
a peripheral region outside the effective region and including:
a wiring layer that includes a pad portion on a second surface of the one or more insulating layers, wherein the second surface is on a different plane than the first surface. It should be understood by those skilled in the art that various modifications, combinations, sub-combinations and alterations may occur depending on design requirements and other factors insofar as they are within the scope of the appended claims or the equivalents thereof.

REFERENCE SIGNS LIST 10 solid-state imaging apparatus
11 valid pixel region
12 optical black (OPB) region
13 peripheral region
21,21R,21G,21B,21W photoelectric conversion device (imaging device)
22 gate portion configuring a memory unit
23 high-concentration impurity region configuring a memory unit
24 light blocking film
30A first surface
30B second surface
31 semiconductor substrate
32 interlayer-insulating layer (first interlayer-insulating layer to fifth interlayer-in-sulating layer)
33 base insulating layer
34 first planarizing film
35 second planarizing film and third planarizing film
36 wiring portion
37 wiring layer
38 contact hole
39 contact pad portion
50,501,502,503,504,50R,50G,50B,50W1,50W2,50W3, 50W4 wire grid polarizer
51 light reflecting layer
51A light-reflecting-layer forming layer
52 insulating film
52A insulating-film forming layer
52a cutout portion of insulating film
53 light absorbing layer
53A light-absorbing-layer forming layer
54 line portion (laminated body)
55 space portion (clearance between one laminated body and another laminated body)
56 protective film
57 second protective film
58 third protective film
59 frame portion
60 wire-grid-polarizer extended portion
61, 61' contact hole portion
70 conductor topmost layer
70' extended portion of conductor topmost layer
71, 74 pad portion
72 opening portion
73 conductive layer
81, 81A main on-chip microlens
82, 82A sub-on-chip microlens (OPA)
83 waveguide structure
84 thin film of waveguide structure
85 light-collecting tube structure
86 thin film of light-collecting tube structure
91, 91R, 91G, 91B wavelength selecting section (color filter layer)
113 column-signal processing circuit
114 horizontal drive circuit
115 output circuit
116 drive control circuit
117 signal line (data output line)
118 horizontal signal line
200 electronic apparatus (camera)
201 solid-state imaging apparatus
210 optical lens
211 optical lens
212 drive circuit
213 signal processing circuit
FD floating diffusion layer
TRmem memory unit
TRtrs transfer transistor
TRrst reset transistor
TRamp amplification transistor
TRsel selection transistor
VDD power supply
MEM memory selection line
TG transfer gate line
RST reset line
SEL selection line

What is claimed is:
1. An imaging device, comprising:
one or more insulating layers on a substrate;

an effective region including:
- a polarization layer in the one or more insulating layers and including one or more polarizers that polarize light; and
- at least one first photoelectric conversion region in the substrate and that converts incident light polarized by the one or more polarizers into electric charge;

a peripheral region outside the effective region and including;
- one Or more wiring lavers that include a pad portion in a same layer of the one or more insulating layers as the polarization layer; and an optical black region between the effective region and the peripheral region and including at least one second photoelectric conversion region that converts incident light into electric charge, wherein the pad portion is electrically connected to the polarization layer.

2. The imaging device of claim 1, wherein the polarization layer includes a light blocking portion in the optical black region, wherein the light blocking portion is in a path of light traveling toward the at least one second photoelectric conversion region.

3. An imaging device, comprising:
one or more insulating layers on a substrate;
an effective region including;
- a polarization layer in the one or more insulating layers and including one or more polarizers that polarize light; and
- at least one first photoelectric conversion region in the substrate and that converts incident light polarized by the one or more polarizers into electric charge;

a peripheral region outside the effective region and including;
- one or more wiring lavers that include a pad portion in a same layer of the one or more insulating layers as the polarization layer; and
- one or more lens layers having lenses that correspond to the at least one first photoelectric conversion region wherein the one or more lens layers includes an opening in the peripheral region that exposes the pad portion.

4. The imaging device of claim 3, wherein the pad portion is electrically connected to an external circuit via the opening.

5. The imaging device of claim 4, wherein the peripheral region includes a wire bond in the opening that electrically connects the pad portion to the external circuit.

6. The imaging device of claim 5, wherein the peripheral region includes a conductive layer at a bottom of the opening and on at least one sidewall of the one or more lens layers, wherein the conductive layer electrically connects the pad portion to the external circuit.

7. An imaging device, comprising:
one or more insulating layers on a substrate;
an effective region including:
- a polarization layer in the one or more insulating lavers and including one or more polarizers that polarize light; and
- at least one first photoelectric conversion region in the substrate and that converts incident light polarized by the one or more polarizers into electric charge;

a peripheral region outside the effective region and including:
- one or more wiring layers that include a pad portion in a same layer of the one or more insulating lavers as the polarization layer; and
- at least one waveguide in the one or more insulating layers to guide light toward the at least one first photoelectric conversion region.

8. An imaging, device, comprising:
one or more insulating layers on a substrate;
an effective region including:
- a polarization layer in the one or more insulating layers and including one or more polarizers that polarize light; and
- at least one first photoelectric conversion region in the substrate and that converts incident light polarized by the one or more polarizers into electric charge; and a peripheral region outside the effective region and including;
- one or more wiring lavers that include a pad portion in a same layer of the one or more insulating lavers as the polarization layer;

wherein the polarization layer includes a light blocking portion in the peripheral region,
wherein the light blocking portion is coupled to a wiring in the substrate that receives a ground voltage.

9. An imaging device, comprising:
one or more insulating layers on a substrate;
an effective region including:
- a polarization layer in the one or more insulating layers and including one or more polarizers that polarize light; and
- at least one first photoelectric conversion region in the substrate and that converts incident light polarized by the one or more polarizers into electric charge;

a peripheral region outside the effective region and including:
- one or more wiring layers that include a pad portion in a same layer of the one or more insulating layers as the polarization layer;
- at least one memory transistor that includes the at least one first photoelectric conversion region as one of a source and a drain, a gate in the one or more insulating layers, and an impurity region in the substrate as the other one of the source and the drain; and
- a light blocking portion in the one or more insulating layers and that covers the gate and the impurity region.

10. An imaging device, comprising:
one or more insulating layers on a substrate;
an effective region including:
- a polarization layer on a first surface of the one or more insulating layers and including one or more polarizers that polarize light; and
- at least one first photoelectric conversion region in the substrate and that converts incident light polarized by the one or more polarizers into electric charge:

a peripheral region outside the effective region and including:
- a wiring layer that includes a pad portion on a second surface of the one or more insulating layers, wherein the second surface is on a different plane than the first surface; and an optical black region between the effective region and the peripheral region and including at least one second photoelectric conversion region that converts incident light into electric charge, wherein the pad portion is electrically connected to the polarization layer.

11. The imaging device of claim 10, wherein the polarization layer includes a first light blocking portion in the optical black region, wherein the light blocking portion is in a path of light traveling toward the at least one second photoelectric conversion region.

12. The imaging device of claim 11, wherein the polarization layer includes a second light blocking portion in the peripheral region, wherein the second light blocking portion is coupled to a wiring in the substrate that receives a ground voltage.

13. The imaging device of claim 12, wherein the first light blocking portion and the second light blocking portion are a contiguous portion of the polarization layer.

14. The imaging device of claim 12, further comprising:
a third light blocking portion in the one or more insulating layers and between the at least one first photoelectric conversion region and the at least one second photoelectric conversion region.

15. The imaging device of claim 14, wherein, in a cross sectional view, the third light blocking portion is closer to the polarization layer than the at least one first photoelectric conversion region.

16. The imaging device of claim 14, wherein, in a cross sectional view, the third light blocking portion is closer to the at least one photoelectric conversion region than the polarization layer.

* * * * *